(12) United States Patent
Seo et al.

(10) Patent No.: US 7,572,522 B2
(45) Date of Patent: *Aug. 11, 2009

(54) LUMINESCENT DEVICE

(75) Inventors: Satoshi Seo, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/026,064

(22) Filed: Dec. 21, 2001

(65) Prior Publication Data
US 2002/0086180 A1    Jul. 4, 2002

(30) Foreign Application Priority Data

| Dec. 28, 2000 | (JP) | ............................ 2000-400953 |
| Jan. 29, 2001 | (JP) | ............................ 2001-020817 |
| Feb. 8, 2001 | (JP) | ............................ 2001-032406 |

(51) Int. Cl.
*H01J 1/62* (2006.01)
*H01J 29/08* (2006.01)
*B32B 7/02* (2006.01)

(52) U.S. Cl. ................. 428/690; 428/212; 428/917; 313/504; 313/506; 257/40; 257/79; 257/80; 257/101; 257/102

(58) Field of Classification Search ............... 428/690, 428/917, 212; 313/503, 506, 504; 315/504; 252/301.16; 207/40; 257/107, 40, 79, 80, 257/101, 102, 103
See application file for complete search history.

(56) References Cited

U.S. PATENT DOCUMENTS

| 3,654,525 A | 4/1972 | Maricle et al. ............. 361/500 |
| 5,017,863 A | 5/1991 | Mellitz ..................... 324/751 |
| 5,039,657 A | 8/1991 | Goldman et al. ............ 505/330 |
| 5,170,990 A | 12/1992 | Kamiya et al. .............. 251/210 |
| 5,256,945 A | 10/1993 | Imai et al. .................. 428/690 |
| 5,271,089 A | 12/1993 | Ozawa ....................... 704/222 |
| 5,281,489 A | 1/1994 | Mori et al. ................. 428/690 |

(Continued)

FOREIGN PATENT DOCUMENTS

| CN | 366598 | 8/1999 |
| CN | 1277626 A | 12/2000 |
| EP | 0 643 118 | 3/1995 |
| EP | 0 853 113 | 7/1998 |
| EP | 0 949 696 A2 | 10/1999 |

(Continued)

OTHER PUBLICATIONS

Takeshi Nishi et al., "High Efficiency TFT-OLED Display with Iridium-Complex As Triplet Emissive Center", *Proceedings of the 10th International Workshop on Inorganic and Organic Electroluminescence*, pp. 353-356, Dec. 4-7, 2000.

(Continued)

*Primary Examiner*—D. Lawrence Tarazano
*Assistant Examiner*—Camie S Thompson
(74) *Attorney, Agent, or Firm*—Fish & Richardson P.C.

(57) ABSTRACT

Interfaces between layers in a light emitting element are eliminated by using a light emitting element with a mixed region including a hole transporting material and an electron transporting material The light emitting element may further comprise a region with a dopant. By using this light emitting element, an organic luminescent element of low power consumption and long life is achieved, and the light emitting element can be used to manufacture a luminescent device and an electric appliance.

38 Claims, 34 Drawing Sheets

U.S. PATENT DOCUMENTS

| | | | | |
|---|---|---|---|---|
| 5,294,810 | A | 3/1994 | Egusa et al. | 257/40 |
| 5,486,406 | A | 1/1996 | Shi | 428/209 |
| 5,513,499 | A | 5/1996 | DeRijkke | 62/55.5 |
| 5,540,999 | A | 7/1996 | Yamamoto et al. | 428/411.1 |
| 5,674,597 | A | 10/1997 | Fujii et al. | 428/212 |
| 5,719,467 | A | 2/1998 | Antoniadis et al. | |
| 5,725,664 | A | 3/1998 | Nanbu et al. | 118/52 |
| 5,817,431 | A | 10/1998 | Shi et al. | 428/690 |
| 5,849,403 | A | 12/1998 | Aoki et al. | 428/220 |
| 5,853,905 | A | 12/1998 | So et al. | 428/690 |
| 5,858,563 | A | 1/1999 | Sano et al. | 428/690 |
| 5,925,472 | A | 7/1999 | Hu et al. | 428/690 |
| 5,925,980 | A | 7/1999 | So et al. | 313/504 |
| 5,955,836 | A | 9/1999 | Boerner et al. | 313/506 |
| 5,989,737 | A | 11/1999 | Xie et al. | 428/690 |
| 6,030,715 | A | 2/2000 | Thompson et al. | 428/690 |
| 6,068,940 | A | 5/2000 | Tanaka | 428/690 |
| 6,097,147 | A * | 8/2000 | Baldo et al. | 313/506 |
| 6,121,727 | A | 9/2000 | Kanai et al. | 313/504 |
| 6,130,001 | A | 10/2000 | Shi et al. | 428/690 |
| 6,132,280 | A | 10/2000 | Tanaba et al. | 445/58 |
| 6,150,042 | A * | 11/2000 | Tamano et al. | 428/690 |
| 6,150,043 | A | 11/2000 | Thompson et al. | 428/690 |
| 6,215,462 | B1 | 4/2001 | Yamada et al. | 345/76 |
| 6,228,228 | B1 | 5/2001 | Singh et al. | 204/192.1 |
| 6,237,529 | B1 | 5/2001 | Spahn | 118/726 |
| 6,275,649 | B1 | 8/2001 | Nagashima et al. | 392/389 |
| 6,275,949 | B1 | 8/2001 | Watanabe | 713/324 |
| 6,284,050 | B1 | 9/2001 | Shi et al. | 118/715 |
| 6,285,039 | B1 | 9/2001 | Kobori et al. | 313/504 |
| 6,303,238 | B1 | 10/2001 | Thompson et al. | 428/690 |
| 6,310,360 | B1 * | 10/2001 | Forrest et al. | 257/40 |
| 6,326,091 | B1 | 12/2001 | Schoo et al. | 428/690 |
| 6,366,017 | B1 | 4/2002 | Antoniadis et al. | 313/506 |
| 6,368,730 | B1 | 4/2002 | Kishimoto et al. | 428/690 |
| 6,372,154 | B1 * | 4/2002 | Li | 252/301.16 |
| 6,392,250 | B1 * | 5/2002 | Aziz et al. | 257/40 |
| 6,392,339 | B1 * | 5/2002 | Aziz et al. | 313/504 |
| 6,396,209 | B1 | 5/2002 | Kido et al. | 313/504 |
| 6,413,656 | B1 * | 7/2002 | Thompson et al. | 428/690 |
| 6,432,255 | B1 | 8/2002 | Sun et al. | 118/723 E |
| 6,458,475 | B1 | 10/2002 | Adachi et al. | 428/690 |
| 6,468,676 | B1 | 10/2002 | Ueda et al. | 428/690 |
| 6,495,198 | B2 | 12/2002 | Peng | 427/66 |
| 6,509,109 | B1 | 1/2003 | Nakamura et al. | 428/690 |
| 6,517,996 | B1 | 2/2003 | Chao et al. | 430/221 |
| 6,524,728 | B1 * | 2/2003 | Kijima et al. | 428/690 |
| 6,528,824 | B2 | 3/2003 | Yamagata et al. | 257/87 |
| 6,534,202 | B2 * | 3/2003 | Sato et al. | 428/690 |
| 6,541,129 | B1 | 4/2003 | Kawamura et al. | 428/690 |
| 6,541,909 | B1 | 4/2003 | Motomatsu | 313/504 |
| 6,558,817 | B1 | 5/2003 | Ueda et al. | 428/690 |
| 6,566,807 | B1 | 5/2003 | Fujita et al. | 313/506 |
| 6,603,140 | B2 | 8/2003 | Kobori et al. | 257/40 |
| 6,614,175 | B2 | 9/2003 | Aziz et al. | 313/504 |
| 6,773,830 | B2 * | 8/2004 | Aziz et al. | 428/690 |
| 6,803,720 | B2 | 10/2004 | Kwong et al. | 313/504 |
| 6,831,406 | B1 | 12/2004 | Fukuyama et al. | 313/504 |
| 7,173,370 | B2 | 2/2007 | Seo et al. | 313/504 |
| 7,196,360 | B2 | 3/2007 | Seo et al. | 257/101 |
| 7,342,355 | B2 * | 3/2008 | Seo et al. | 313/504 |
| 7,432,116 | B2 | 10/2008 | Yamazaki et al. | 438/22 |
| 2001/0003601 | A1 | 6/2001 | Ueda et al. | 427/64 |
| 2001/0052751 | A1 | 12/2001 | Wakimoto et al. | 313/504 |
| 2002/0018912 | A1 | 2/2002 | Jung et al. | |
| 2002/0028329 | A1 | 3/2002 | Ise et al. | 428/336 |
| 2002/0038867 | A1 | 4/2002 | Kobori et al. | |
| 2002/0074935 | A1 | 6/2002 | Kwong et al. | |
| 2002/0081767 | A1 | 6/2002 | Kawashima | |
| 2002/0086180 | A1 | 7/2002 | Seo et al. | |
| 2002/0101154 | A1 * | 8/2002 | Seo et al. | 313/506 |
| 2002/0145380 | A1 | 10/2002 | Aziz et al. | 313/504 |
| 2003/0118950 | A1 | 6/2003 | Chao et al. | |
| 2003/0134145 | A1 | 7/2003 | Toguchi et al. | |
| 2003/0143430 | A1 | 7/2003 | Kawamura et al. | 428/690 |
| 2005/0266172 | A1 | 12/2005 | Kay et al. | 427/561 |

FOREIGN PATENT DOCUMENTS

| | | |
|---|---|---|
| EP | 1 011 155 A2 | 6/2000 |
| EP | 1 017 118 | 7/2000 |
| EP | 1 029 909 A1 | 8/2000 |
| EP | 1 065 737 A2 | 3/2001 |
| EP | 1 220 340 | 7/2002 |
| JP | 62-274063 | 11/1987 |
| JP | 02-261889 | 10/1990 |
| JP | 03-114197 | 5/1991 |
| JP | 03-274695 | 12/1991 |
| JP | 04-357694 | 12/1992 |
| JP | 07-126616 | 5/1995 |
| JP | 08-330073 | 12/1996 |
| JP | 09-232077 | 9/1997 |
| JP | 10-233288 | 9/1998 |
| JP | 10-289784 | 10/1998 |
| JP | 10-330743 | 12/1998 |
| JP | 11-307263 | 11/1999 |
| JP | 11-329734 | 11/1999 |
| JP | 2000-133453 | 5/2000 |
| JP | 2000-182774 | 6/2000 |
| JP | 2000-208262 | 7/2000 |
| JP | 2000-306678 | 11/2000 |
| JP | 2000-328229 | 11/2000 |
| JP | WO00-70655 | 11/2000 |
| JP | 2000-340361 | 12/2000 |
| JP | 2000-344691 | 12/2000 |
| JP | 2001-023776 | 1/2001 |
| JP | 2001-52870 | 2/2001 |
| JP | 2001-052870 | 2/2001 |
| JP | 2001-155862 | 6/2001 |
| JP | 2001-237079 | 8/2001 |
| KR | 1999-0082912 | 11/1999 |
| KR | 2000-0067671 | 11/2000 |
| TW | 243470 | 6/1994 |
| TW | 366598 | 8/1999 |
| TW | 451601 | 8/2001 |
| WO | WO 98/08360 | 2/1998 |
| WO | WO 02/47457 | 6/2002 |

OTHER PUBLICATIONS

Search Report (Singapore Application No. S.200200365-5), Nov. 11, 2003, 11 pages.
Office Action dated Mar. 22, 2004 for U.S. Appl. No. 10/623,609, filed Jul. 22, 2003.
Office Action dated Oct. 6, 2004 for U.S. Appl. No. 10/623,609, filed Jul. 22, 2003.
Australian Patent Office Search Report dated Aug. 31, 2004 for Application No. SG200107840-1, filed Dec. 19, 2002, 4 pages.
Australian Patent Office Written Opinion, Aug. 31, 2004 for Application No. SG200107840-1, filed Dec. 19, 2002, 6 pages.
Pending U.S. Appl. No. 10/043,786, filed Jan. 10, 2002, Seo et al.
Pending U.S. Appl. No. 10/081,971, filed Feb. 20, 2002, Yamazaki et al.
Pending U.S. Appl. No. 10/072,310, filed Feb. 5, 2002, Yamazaki et al.
Pending U.S. Appl. No. 10/060,427, filed Jan. 29, 2002, Kanagawa et al.
Pending U.S. Appl. No. 10/062,005, filed Jan. 31, 2002, Yamazaki et al.
Pending U.S. Appl. No. 10/043,812, Jan. 10, 2002, Kanagawa et al.
Pending U.S. Appl. No. 10/081,558, filed Feb. 20, 2002, Seo et al.
Pending U.S. Appl. No. 10/072,507, filed Feb. 5, 2002, Seo et al.
Pending U.S. Appl. No. 09/852,090, filed May 10, 2001, Yamagata et al.
Pending U.S. Appl. No. 10/024,699, filed Dec. 21, 2001, Seo et al.

C.W. Tang et al.: "Organic Electroluminescent Diodes": *Applied Physics Letters*, vol. 51, No. 12; pp. 913-915: Sep. 21, 1987.

Yasunori Kijima et al.; "A Blue Organic Light Emitting Diode"; *Japan Journal of Applied Physics*, vol. 38; pp. 5274-5277; Sep. 1999.

C.W. Tang et al.; "Electroluminescence of Doped Organic Thin Films"; *Journal of Applied Physics*, vol. 65, No. 9; pp. 3610-3616; May 1, 1989.

Chihaya Adachi et al.; "Electroluminescence in Organic Films with Three-Layer Structure"; *Japanese Journal of Applied Physics*, vol. 27, No. 2; pp. L269-L271; Feb. 1988.

Tetsuo Tsutsui et al.; "New Aspect of Research and Development of Organic EL"; *M&BE Seminar* (*M&BE*, vol. 11, No. 1); pp. 3-12 with translation; 2000.

Takeo Wakimoto et al.; "Organic EL Cells Using Alkaline Metal Compounds as Electron Injection Materials"; *IEEE Transactions on Electron Devices*, vol. 44, No. 8, pp. 1245-1248; Aug. 1998.

S.A. Van Slyke et al.; "Organic Electroluminescent Devices with Improved Stability"; *Applied Physics Letter*, vol. 69, No. 15; pp. 2160-2162; Oct. 7, 1996.

D.F. O'Brien et al.; "Improved Energy Transfer in Electrophosophorescent Devices"; *Applied Physics Letter*, vol. 74, No. 3 pp. 442-444; Jan. 18, 1999.

Tetsuo Tsutsui et al.; "High Quantum Efficiency in Organic Light-Emitting Devices with Iridium-Complex as a Triplet Emissive Center"; *Japan Journal of Applied Physics*, vol. 38, Part 2, No. 12B; pp. L1502-L1504; Dec. 15, 1999.

Tetsuo Tsutsui; "The Operation Mechanism and the Light Emission Efficiency of the Organic EL Element"; *Test of the Third Lecture Meeting: Bulletin of Organic Molecular/Bioelecronics Subcommittee. Society of Applied Physics*; pp. 31-37 w/translation; 1993.

Junji Kido et al.; "Multilayer White Light-Emitting Organic Electroluminescent Device"; *Science*, vol. 267; pp. 1332-1334; Mar. 3, 1995.

U.S. Patent Application Office Action (U.S. Appl. No. 10/623,609) dated Mar. 17, 2005.

Choong et al.; "Organic Light-Emitting Diodes With A Bipolar Transport Layer"; *Applied Physics Letters*, vol. 75, No. 2; pp. 172-174; Jul. 12, 1999.

Naka et al.; "Organic Electroluminescent Devices Using A Mixed Single Layer"; *Japanese Journal of Applied Physics*, vol. 33, Part 2, No. 12B; pp. L1772-L1774; Dec. 15, 1994.

Search Report (Application No. 01130872.3) dated Sep, 15, 2005.

Written Opinion (Singapore Application No. SG 200200365-5) dated May 19, 2004, 4 pages.

Office Action (Application No. 01130872.3), dated Aug. 22, 2007, 4 pages.

Translation of Chinese Office Action (Chinese Application No. 200610059597), 9 pages, mailed Jul. 11, 2008.

Re-Examination Report (Korean Patent Application No. 10-2006-0135418) dated Aug. 26, 2008 with English translation.

Office Action (Korean Patent Application No. 10-2008-0072674) dated Oct. 22, 2008 with English translation.

Japanese Office Action (Japanese Application No. 2002-042851), 5 pages, mailed Aug. 28, 2007 with English translation.

Korean Office Action (Korean Application No. 2002-0009200), 8 pages, mailed Dec. 17, 2007 with English translation.

Korean Office Action (Korean Application No. 2002-0009596), 14 pages, mailed Jan. 25, 2008 with English translation.

* cited by examiner

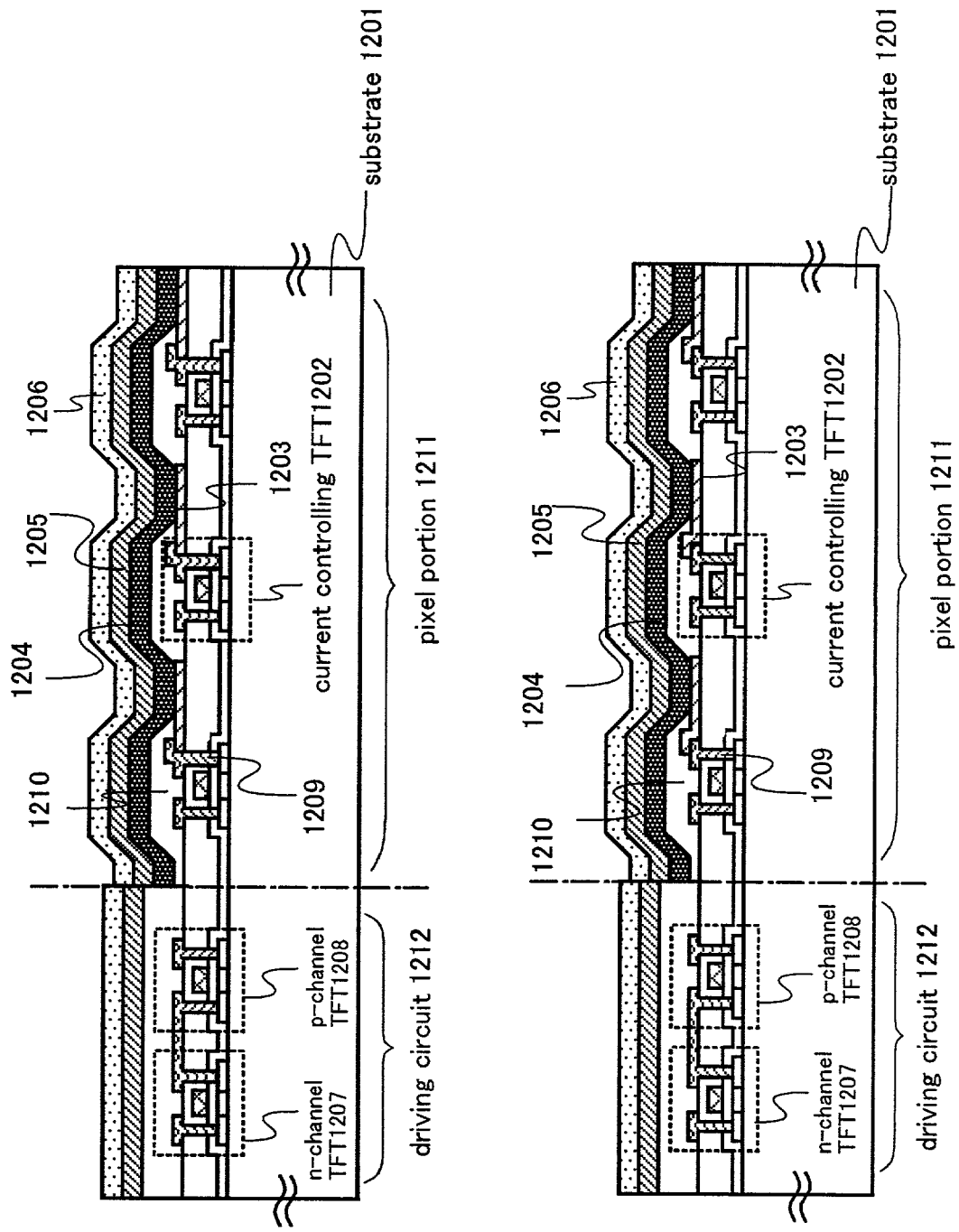

SF1-SF6: subframe, T_A: write in time

LUMINESCENT DEVICE

FIELD OF THE INVENTION

The invention relates to a luminescent device using an organic luminescent element having an anode, a cathode, and a film (referred below to as "organic compound layer"), which includes an organic compound adapted to effect luminescence upon application of an electric field. In particular, the invention relates to a luminescent device using an organic luminescent element, which is lower in drive voltage and longer in service life than a prior one. In addition, the luminescent device described in the specification of the present application indicates an image display device or a luminescent device, which use an organic luminescent element as luminescent element. Also, the luminescent device includes all of modules, in which a connector, for example, an anisotropic electroconductive film (FPC:Flexible printed circuit) or a TAB (Tape Automated Bonding) tape or a TCP (Tape Carrier Package) is mounted to an organic luminescent element, modules, in which a printed-circuit board is provided on a TAB tape or a tip end of a TCP, or modules, in which an IC (integrated circuit) is directly mounted on an organic luminescent element in the COG (Chip On Glass) system.

DESCRIPTION OF THE RELATED ART

An organic luminescent element is one adapted to effect luminescence upon application of an electric field. A mechanism for luminescence has been said to reside in that an organic compound layer is interposed between electrodes, upon application of voltage thereto electrons filled from a cathode and holes filled from an anode recombine together at a center of luminescence in the organic compound layer to form excited molecules (referred below to as "molecule exciton"), and the molecule excitons discharge energy to produce luminescence when returned to the base state.

In addition, kinds of molecule excitons formed by the organic compound can include a singlet excited state and a triplet excited state, while the specification of the present invention contains the case where either of the excited states contributes to luminescence.

In such organic luminescent element, an organic compound layer is normally formed in a thin film below 1 μm. Also, since the organic luminescent element is a self-luminescent type one, in which the organic compound layer itself emits light, a backlight used in a conventional liquid crystal display is not necessary. Accordingly, the organic luminescent element can be very advantageously formed to be thin and lightweight.

Also, with, for example, an organic compound layer of about 100 to 200 nm in thickness, a time period having elapsed from filling of a carrier to recombination thereof is in the order of several tens of nanosecond taking account of the extent of movement of the carrier in the organic compound layer, and luminescence is achieved in the order of less than one micro second even when the procedure from the recombination of the carrier to luminescence is included. Accordingly, one of the features is that the speed of response is very large.

Further, since the organic luminescent element is a carrier-filling type luminescent element, it can be driven by DC voltage, and is hard to generate noise. With respect to drive voltage, an adequate luminance of 100 cd/m$^2$ is achieved at 5.5 V by first making the thickness of an organic compound layer a uniform, super-thin film of around 100 nm, selecting an electrode material, which reduces a carrier filling barrier relative to the organic compound layer, and further introducing a single hetero structure (double structure) (Literature 1: C. W. Tang and S. A. VanSlyke, "Organic electroluminescent diodes", Applied Physics Letters, vol. 51, No. 12, 913-915 (1987)).

Owing to such performances as thin and lightweight, high-speed responsibility, DC low voltage drive, and the like, organic luminescent elements have been given attention as next-generation flat panel display elements. Also, since organic luminescent elements are of self-luminescent type and large in angle of visibility, they are comparatively favorable in visibility and believed to be effective as elements used for displays in portable equipments.

Hereupon, in the constitution of an organic luminescent element described in Literature 1, a carrier filling barrier is made small relative to an organic compound layer by using as a cathode a relatively stable Mg:Ag alloy of low work function to enhance an electron injecting quality. This makes it possible to fill a large amount of carrier into the organic compound layer.

Further, the recombination efficiency of the carrier is improved by leaps and bounds by application of a single hetero structure, in which a hole transporting layer composed of a diamine compound and an electron transporting luminescent layer composed of tris (8-quinolinolato) aluminium (abbreviation; Alq$_3$) are laminated as an organic compound layer, which is explained below.

In the case of, for example, an organic luminescent element having only a single Alq$_3$ layer, a major part of electrons filled from a cathode reaches an anode without recombining with holes, making the luminescent efficiency very low, since Alq$_3$ is of electron transporting quality. That is, in order to have the single-layered organic luminescent element efficiently emitting light (or driving at low voltage), it is necessary to use a material (referred below to as "bipolar material") capable of carrying both electrons and holes in well-balanced manner, and Alq$_3$ does not meet such requirement.

However, application of the single hetero structure described in Literature 1 causes electrons filled from a cathode to be blocked by an interface between the hole transporting layer and the electron transporting luminescent layer to be enclosed in the electron transporting luminescent layer. Accordingly, the carrier is efficiently recombined in the electron transporting luminescent layer to provide for efficient luminescence.

When the concept of such carrier blocking function is developed, it becomes possible to control a carrier recombining region. As an example, there is a report, according to which success is achieved in enclosing holes in a hole transporting layer and making the hole transporting layer luminescent by inserting a layer (hole blocking layer), which is capable of blocking holes, between the hole transporting layer and an electron transporting layer (Literature 2: Yasunori KIJIMA, Nobutoshi ASAI and Shin-ichiro TAMURA, "A Blue Organic Light Emitting Diode", Japanese Journal of Applied Physics, Vol. 38, 5274-5277 (1999)).

Also, it can be said that the organic luminescent element described in Literature 1 is based on, so to speak, that thought of functional separation, according to which carrying of holes is performed by the hole transporting layer and carrying and luminescence of electrons are performed by the electron transporting luminescent layer. Such concept of functional separation has further grown to a concept of double hetero-structure (three-layered structure), according to which a luminescent layer is inserted between the hole transporting layer and the electron transporting layer (Literature 3: Chihaya ADACHI, Shizuo TOKITO, Tetsuo TSUTSUI and Shogo SAITO, "Electroluminescence in Organic Films with Three-Layered Structure", Japanese Journal of Applied Physics, Vol. 27, No. 2, L269-L271 (1988)).

Such functional separation has an advantage in that the functional separation makes it unnecessary for a kind of organic material to have a variety of functions (luminescence, carrier carrying quality, filling quality of carrier from electrode, and so on) at a time, which provides a wide freedom in molecular design or the like (for example, it is unnecessary to unreasonably search for bipolar materials). That is, a high luminous efficiency can be easily attained by combining materials having a good luminous quality and a carrier carrying quality, respectively.

Owing to these advantages, the concept of the laminated structure (carrier blocking function or functional separation) itself described in Literature 1 has been widely utilized till now.

However, being a junction between substances of different kinds (in particular, a junction between insulating materials), the laminated structure described above will necessarily produce an energy barrier at an interface the substances. Since the presence of an energy barrier inhibits movements of a carrier at the interface, the two following problems are caused.

One of the problems is that it results in a barrier leading to further reduction of drive voltage. Actually, it has been reported with respect to existing organic luminescent elements that an element of a single-layered structure making use of a conjugate polymer is excellent in terms of drive voltage and holds top data (comparison in luminescence from the singlet excited state) in power efficiency (unit:"lm/W") (Literature 4: Tetsuo Tsutsui "bulletin of organic molecular/bioelectronics" subcommittee of Society of Applied Physics, Vol. 11, No. 1, P. 8 (2000)).

In addition, the conjugate polymer described in Literature 4 is a bipolar material, and can attain a level equivalent to that of the laminated structure with respect to the recombination efficiency of a carrier. Accordingly, it demonstrates that a single layer structure having less interfaces is actually low in drive voltage provided that a method making use of a bipolar material can make an equivalent recombination efficiency of a carrier without the use of any laminated structure.

This can be explained to be due to the fact that movements of a carrier are prevented at interfaces (for example, between a hole transporting layer and a luminescent layer, and referred below to as "organic interfaces") between respective layers in an organic compound layer, and so a higher drive voltage is necessitated.

For example, there is a method, in which a material for mitigating an energy barrier is inserted at an interface between an electrode and an organic compound layer to enhance a carrier filling quality to reduce drive voltage (Literature 5: Takeo Wakimoto, Yoshinori Fukuda, Kenichi Nagayama, Akira Yokoi, Hitoshi Nakada, and Masami Tsuchida, "Organic EL Cells Using Alkaline Metal Compounds as Electron Injection Materials", IEE TRANSACTIONS ON ELECTRON DEVICES, VOL. 44, NO. 8, 1245-1248 (1977)). In Literature 5, the use of $Li_2O$ as an electron injecting layer has been successful in reduction of drive voltage.

However, there is a field, in which the carrier moving quality of an organic interface has not been solved, and which presents an important point for coming level with a low drive voltage in the single layer structure making use of a bipolar material.

Further, the other problem caused by an energy barrier is believed to be an influence on the service life of organic luminescent elements. That is, movements of a carrier are impeded, and brilliance is lowered due to build-up of charges.

While any definite theory has not been established with respect to such mechanism of deterioration, there is a report that lowering of brilliance can be suppressed by inserting a hole injecting layer between an anode and a hole transporting layer and employing not DC driving but AC driving of rectangular wave (Literature 6: S. A. VanSlyke, C. H. Chen, and C. W. Tang, "Organic electroluminescent devices with improved stability", Applied Physics Letters, Vol. 69, No. 15, 2160-2162 (1996)). This can be said to present an experimental evidence that lowering of brilliance can be suppressed by eliminating accumulation of charges due to insertion of a hole injecting layer and AC driving.

It can be said from the above that on one hand the laminated structure has an advantage in enabling easily enhancing the recombination efficiency of a carrier and enlarging a range of material selection in terms of functional separation and on the other hand formation of many organic interfaces (in particular, formation of organic interfaces for blocking carriers for recombination of carriers) impedes movements of a carrier and has an influence on lowering of drive voltage and brilliance.

BRIEF SUMMARY OF THE INVENTION

Hereupon, the invention has its object to provide an organic luminescent element, which makes the best use of an advantage (functional separation) in a laminated structure used in the related art and enhances mobility of a carrier by mitigating an energy barrier present in an organic compound layer, and which is lower in drive voltage and longer in service life than those in the related art.

In particular, the invention has its object to remove organic interfaces present in an organic compound layer and enhance mobility of carriers by manufacturing an element of different concept from that of the conventionally used laminated structure, in which carriers in a luminescent layer are blocked for recombination, and at the same time to realize functions (referred below to as "functional realization") of a plurality of various materials in the same manner as in functional separation involved in the laminated structure. Thereby, the invention has its object to provide an organic luminescent element, which is lower in drive voltage and longer in service life than those in the related art.

Further, the invention has its object to provide a luminescent device, which makes use of such organic luminescent element to thereby be lower in drive voltage and longer in service life than in the related art. Further, the invention has its object to provide an electric appliance, which is manufactured by the use of such luminescent device to thereby be lower in power consumption and more durable than in the related art.

Mitigation of an energy barrier in a laminated structure is noticeably found in the technique of insertion of a carrier filling layer as described in Literature 5. A hole injecting layer is exemplarily illustrated with the use of an energy band diagram in FIG. 1B.

In FIG. 1A, an anode 101 and a hole injecting layer 102 are joined directly to each other, in which case an energy barrier 104 associated with the anode 101 and the hole injecting layer 102 is large. However, the energy barrier can be designed in a stepwise manner (FIG. 1B) by inserting as a hole injecting layer 103 a material having a level of highest occupied molecular orbit (referred below to as "HOMO") positioned intermediate between ionization potential (equivalent to work function in case of metal) of the anode and a HOMO level of the hole transporting layer.

Designing the stepwise energy barrier as shown in FIG. 1B makes it possible to enhance the filling quality of a carrier from an electrode, and to surely lower the drive voltage to some extent. However, there is caused a problem that an increase in the number of layers results in an increase in the number of organic interfaces. This is thought as indicated in Literature 4 to be responsible for the fact that the single-layered structure holds top data in drive voltage and power efficiency.

Conversely, by overcoming such problem, it is possible to come level with drive voltage and power efficiency in the single-layered structure while making the best use of an advantage (a variety of materials can be combined, and any complex molecular design is unnecessary) in a laminated structure.

The fundamental concept therefor may be to enable mitigating an energy barrier present in an organic compound layer without an increase in the number of organic interfaces and not to impede movements of a carrier. The inventors have devised an element structure capable of realizing the concept in the following manner.

First, a way to mitigate an energy barrier relative to holes may be to provide a layer (referred below to as "hole transporting mixed layer") obtained by mixing a hole injecting material of high HOMO level (small in ionization potential) and a hole transporting material of high hole mobility together. This way makes it possible for a single layer to realize functions of two layers including a conventional hole injecting layer and a conventional hole transporting layer, such that in the hole transporting mixed layer, the hole injecting material serves to receive holes from a side of an anode and the hole transporting material serves to carry holes.

Also, it is preferable to form concentration gradients in the hole transporting mixed layer described above. That is, as shown in FIG. 2, the rate of the hole injecting material increases toward an anode, and the rate of the hole transporting material increases as it goes away from the anode. Owing to formation of such concentration gradients, holes are smoothly received from the side of the anode and carried without generation of any large energy barrier, which contributes to lowering of drive voltage and prolonging of service life.

In addition, for the sake of convenience straight lines are used to show the concentration gradients in FIG. 2 but there is not necessarily the need of limiting to such straight lines, and it is sufficient that concentration gradients be formed to increase or decrease. In fact, it is thought that in many cases the concentration gradients are defined by curves at the time of control. The same is the case with other concentration gradients described in the specification of the present application.

Subsequently, a way to mitigate an energy barrier relative to electrons may be to provide a layer (referred below to as "electron transporting mixed layer") obtained by mixing an electron injecting material having a low level (large in electron affinity) of lowest unoccupied molecular orbit (referred below to as "LUMO") and an electron transporting material of high electron mobility together. This way makes it possible for a single layer to realize functions of two layers including a conventional electron injecting layer and a conventional electron transporting layer, such that in the electron transporting mixed layer, the electron injecting material serves to receive electrons from a side of a cathode and the electron transporting material serves to carry electrons.

Also, it is preferable to form concentration gradients in the electron transporting mixed layer described above. That is, as shown in FIG. 3, the rate of the electron injecting material increases toward a cathode, and the rate of the electron transporting material increases as it goes away from the cathode. Owing to formation of such concentration gradients, electrons are smoothly received from the side of the cathode and carried without generation of any large energy barrier, which contributes to lowering of drive voltage and prolonging of service life.

Further, there is a way to mitigate an energy barrier relative to a luminescent layer. That is, a luminescent layer may be provided by a bipolar layer (referred below to as "bipolar-natured mixed layer"), which is obtained by mixing a hole transporting material of high hole mobility and an electron transporting material of high electron mobility together. In this case, the luminescent layer decreases in carrier blocking function at interfaces on both ends thereof, but frequency of recombination of carrier is higher due to differences of mobility between an electron transporting layer and a bipolar-natured mixed layer, and between a hole transporting layer and a bipolar-natured mixed layer.

Also, it is preferable to form concentration gradients in the bipolar-natured mixed layer described above. That is, as shown in FIG. 4, the rate of the hole transporting material increases toward an anode, and the rate of the electron transporting material increases toward the cathode. Owing to formation of such concentration gradients, steps of from carrying to recombination of holes and electrons are smoothly performed without generation of any large energy barrier, which contributes to lowering of drive voltage and prolonging of service life.

In addition, it is thought that in bipolar-natured mixed layer, a material having a lower excitation energy emits light more. Excitation energy described in the specification of the present application indicates energy difference between HOMO and LUMO. HOMO can be measured by means of the photoelectron spectroscopy, and may be thought to be equivalent to ionization potential. Also, defining the excitation energy at ends of absorption spectrum for the sake of convenience, it is possible to calculate LUMO from the excitation energy and a value of HOMO level.

Further, there is a way to dope a luminescent material in the above bipolar-natured mixed layer for light emission. In this case, the luminescent material being a dopant must have a lower excitation energy than those of the hole transporting material and the electron transporting material contained in the bipolar-natured mixed layer. In particular, it is preferable to use a dopant (rubrene) of carrier trap type for further increase in the recombination efficiency of a carrier.

Also, the hole blocking layer described in Literature 2 is generally composed of a blocking material. The blocking material is generally one having a larger excitation energy than that of the luminescent material (that is, capable of preventing dispersion of molecular excitons), and the carrier is a material capable of blocking. In many cases, holes are blocked.

The inventors of the present application have devised a way to form a layer (referred below to as "blocking-natured mixed layer") obtained by mixing a blocking material and a material of the luminescent layer (or host materials of the luminescent layer). In this case, the blocking-natured mixed layer can also function as a luminescent layer, and so can be regarded as a luminescent layer capable of efficiently blocking a carrier and molecular excitons therein.

In particular, the blocking-natured mixed layer is preferably formed with concentration gradients. This is because a carrier (electrons in case of the hole blocking material) in one of the layers, which is not blocked can be smoothly moved by gradually increasing the concentration of the blocking material as it goes away from the luminescent layer.

Hereupon, in recent years, organic luminescent elements capable of converting energy (referred below to as "triplet excited energy"), which is discharged when returned to a base state from a triplet excited state, into luminance, have been successively presented, and notice has been taken of their luminous efficiency (Literature 7: D. F. O'Brien, M. A. Baldo, M. E. Thompson and S. R. Forrest, "Improved energy transfer in electrophosphorescent devices", Applied Physics Letters, Vol. 74, No. 3, 442-444 (1999)), (Literature 8: Tetsuo TSUTSUI, Moon-Jae YANG, Masayuki YAHIRO, Kenji NAKAMURA, Teruichi WATANABE, Taishi TSUJI, Yoshinori FUKUDA, Takeo WAKIMOTO and Satoshi MIYAGUCHI, "High Quantum Efficiency in Organic Luminescent devices with Iridium-Complex as a Triplet Emissive Center", Japanese Journal of Applied Physics, Vol. 38, L1502-L1504 (1999)).

A metal complex, of which central metal is platinum, is used in Literature 7, and a metal complex, of which central metal is iridium, is used in Literature 8. These organic luminescent elements capable of converting triplet excited energy into luminance (referred below to as "triplet luminescent diode") can attain higher intensity luminance and higher luminous efficiency than in the related art.

However, Literature 8 has presented an example, in which half-life of luminance is about 170 hours in the case where the initial luminance is set to 500 cd/m$^2$, thus causing a problem in service life of an element. Hereupon, application of the invention to triplet light emitting diodes can provide a highly functional luminescent element, which is long in service life in addition to high intensity luminance and high luminous efficiency based on luminance from a triplet excited state.

Accordingly, the invention covers application of its concept to a triplet light emitting diode, according to which concept a carrier carrying layer and a luminescent layer make a mixed layer to reduce the number of interfaces (or mitigate an energy barrier) to smoothen movements of a carrier.

Well, the inventors of the present application have thought of the two following mechanisms as a model, in which movements of a carrier are impeded by formation of organic interfaces.

First, one of the mechanisms is thought of, which is generated from morphology of organic interfaces. An organic compound layer in an organic luminescent element is normally composed of a film in an amorphous state, which molecules of an organic compound aggregate due to the intermolecular force mainly based on dipole-dipole interaction. However, when such aggregate of molecules is used to form a hetero structure (laminated structure), it is possible that interfaces (that is, organic interfaces) of the hetero structure are greatly affected by differences in molecular size and molecular configuration.

In particular, in the case where materials having greatly different molecular sizes are used to form the hetero structure, it is believed that junction at the organic interfaces is worsened in alignment. The concept is shown in FIG. 21. In FIG. 21, a first layer 2111 composed of small molecules 2101 and a second layer 2112 composed of large molecules 2102 are laminated together. In this case, regions 2114 of inferior alignment are produced on an organic interface 2113 formed.

Since it is possible that the regions 2114 of inferior alignment shown in FIG. 21 make a barrier (or an energy barrier) for impeding movements of a carrier, it is suggested that they make an obstacle toward further reduction of drive voltage.

Also, a carrier, which cannot go over the energy barrier, accumulates as a charge to possibly induce reduction, described above, in luminescence.

The other of the mechanisms is thought of, which is generated in the process of forming a laminated structure (that is, organic interfaces). From the view point of blocking of a carrier and functional separation, an organic luminescent element of laminated structure is usually manufactured with the use of a multi-chamber type (in-line type) deposition apparatus as shown in FIG. 22 in order to avoid contamination at the time of formation of respective layers.

FIG. 22 is a conceptional view showing an example of a deposition apparatus for forming a three-layered structure (double-hetero structure) composed of a hole transporting layer, luminescent layer, and an electron transporting layer. First, a substrate with an anode (an indium tin oxide (referred below to as "ITO") or the like) is carried into a carrying-in chamber, and subjected to irradiation of ultraviolet rays under a vacuum atmosphere in an ultraviolet-rays irradiation chamber to have anode surfaces cleaned. In particular, when the anode is made of an oxide such as ITO, it is subjected to oxidation in a pretreatment chamber. Further, in order to form respective layers of the laminated structure, the hole transporting layer is subjected to deposition in a deposition chamber 2201, the luminescent layer (three colors including red, green and blue ones in FIG. 22) in deposition chambers 2202 to 2204, the electron transporting layer in a deposition chamber 2205, and a cathode in a deposition chamber 2206. Finally, sealing is performed in a sealing chamber, and taken out of a carrying-out chamber, an organic luminescent element is obtained.

Such in-line type deposition apparatus has a feature in that deposition of the respective layers is performed in different deposition chambers 2201 to 2205, respectively. That is, the apparatus is constructed such that materials of the respective layers are scarcely mixed with one another.

Although an interior of the deposition apparatus is usually depressurized to around $10^{-4}$ to $10^{-5}$ Pa, a trace of gas components (oxygen, water and so on) is present. In the case of such degree of vacuum, it is said that even a trace of gas components will easily form an adsorption layer, amounting to about a single molecule layer, in several seconds.

Accordingly, in the case where the apparatus shown in FIG. 22 is used to manufacture an organic luminescent element in a laminated structure, it is problematic that large intervals are generated while the respective layers are formed. That is, there is a fear that an adsorption layer (referred below to as "impurity layer") caused by a trace of gas components would be formed during intervals in the course of formation of the respective layers, in particular, at the time of conveyance through the second carrying-out chamber.

FIG. 23 shows the concept described above. FIG. 23 shows a state, in which when a first layer 2311 composed of a first organic compound 2301 and a second layer 2312 composed of a second organic compound 2302 are laminated together, an impurity layer 2313 composed of a trace of impurity 2303 (water, oxygen or the like) is formed between the first and second layers.

Impurity layers formed between respective layers (organic interfaces) in this manner make impurity regions, which are liable to trap a carrier, after the completion of an organic luminescent element, to thereby impede movements of a carrier, thus resulting in raising the drive voltage. Further, when impurity regions, which are liable to trap a carrier, are present, charges are accumulated in the regions to possibly induce reduction in luminance as described above.

Taking account of such mechanisms, in order to overcome problems (worsening of morphology of organic interfaces and formation of impurity layers) caused at the above-mentioned organic interfaces, it is required that both the element structure and the manufacturing process be free from conventional elements of laminated structure. As an example of an organic luminescent element, from which organic interfaces are completely removed, an organic luminescent element, in which only a single layer composed of only a mixture of a hole transporting material and an electron transporting material (referred below to as "single mixed layer") is provided between both electrodes, has been reported (Literature 9: Shigeki NAKA, Kazuhisa SHINNO, Hiroyuki OKADA, Hiroshi ONNAGAWA and Kazuo MIYASHITA, "Organic Electroluminescent Devices Using a Mixed Single Layer", Japanese Journal of Applied Physics, Vol. 33, No. 12B, L1772-L1774 (1994)).

In Literature 9, a single-layered structure is formed by mixing 4, 4'-bis [N-(3-methylphenyl)—N-phenyl-amino]-biphenyl (referred below to as "TPD"), which is of hole transporting quality, and $Alq_3$, which is of electron transporting quality, at the ratio of 1:4. However, in comparing the single-layered structure with a laminated structure (that is, a hetero structure formed with organic interfaces composed of TPD and $Alq_3$), it is demonstrated that the former is inferior to the laminated structure in terms of luminous efficiency.

The reason for this is thought to be that with the single mixed layer, holes filled from an anode and electrons filled from a cathode are frequently passed to opposed electrodes without recombination. Since the laminated structure functions to block a carrier, such problem is not caused.

In other words, it can be said that this is attributed to the fact that the functional realization is not generated in the single mixed layer described in Literature 9. That is, unless there are provided in an organic compound layer, regions, which are capable of realizing respective functions, such as a region near an anode, which functions as hole transporting, a region near a cathode, which functions as electron transporting, and a luminescent region distant from both electrodes (that is, a region where a carrier recombines), an efficient light emission is not resulted even when organic interfaces are removed. Since the entire organic compound layer functions as a luminescent layer, it is possible that a light emits near an electrode. As a result, quench is caused in energy transfer to electrode.

In this manner, taking into consideration that the single mixed layer cannot exhibit its function fully, the inventors of the present application have devised a way to realize an organic luminescent element, in which any organic interfaces are removed when the bipolar-natured mixed layer shown in FIG. 4 is formed as a luminescent region, and the functional realization is possible unlike the disclosure of Literature 7. FIG. 24 shows the concept described above.

In FIG. 24, provided in an organic compound layer 2403 composed of two kinds of materials including a hole transporting material and an electron transporting material are a hole transporting region 2405 composed of a hole transporting material, an electron transporting region 2406 composed of an electron transporting material, and a mixed region 2407, in which a hole transporting material and an electron transporting material are mixed together. While an anode 2402 is provided on a substrate 2401, a reverse structure may be adopted, in which a cathode 2404 is provided on the substrate. In addition, with such element, a definite layer structure such as a hole transporting layer is not formed, and so the term "region" representing each function is used.

In the case where such element is formed, the hole transporting material can receive and carry holes on an anode side and the electron transporting material can receive and carry electrons on a cathode side. Further, since the mixed region 2407 is bipolar-natured, both holes and electrons can move in the mixed region 2407, and a carrier recombines in the mixed region 2407 for luminance. That is, unlike the single mixed layer disclosed in Literature 9, regions capable of exhibiting respective functions are present in the organic compound layer 2403.

Further, with the element shown in FIG. 24, the functional realization is possible but there is present no organic interface in a conventional laminated structure. Also, quenching can be prevented by separating the luminescent region from the both electrodes as far as possible. Accordingly, it is possible to solve the problems (worsening of morphology of organic interfaces and formation of impurity layers) caused at the above-mentioned organic interfaces.

First, an explanation will be given to solve the worsening of morphology of organic interfaces with reference to FIG. 25. FIG. 25 shows an organic luminescent element, which is typified in FIG. 24 and comprises a region 2511 composed of small molecules 2501, a region 2512 composed of large molecules 2502, and a mixed region 2513 containing both the small molecules 2501 and large molecules 2502. As apparent from FIG. 25, not only the organic interfaces 2113 shown in FIG. 21, but also the regions 2114 of inferior alignment are not present.

Also, a solution to formation of impurity layers is simple and clear. In manufacturing the organic luminescent element as shown in FIG. 24, a hole transporting material is deposited on an anode, an electron transporting material is additionally deposited halfway in the form of codeposition to form a mixed region, and after formation of the mixed region, deposition of the hole transporting material may be stopped to permit deposition of the electron transporting material. Accordingly, there are not present intervals, which are generated in using the deposition apparatus shown in FIG. 22 to manufacture an organic luminescent element. That is, there is no opportunity for formation of any impurity layers.

In this manner, the organic luminescent element according to the invention is free from formation of organic interfaces, so that movements of a carrier are smooth and have no adverse influence on drive voltage and service life of the element. Further, there is no problem in luminescent efficiency by virtue of involving the functional separation like the laminated structure.

Also, a conventional laminated structure is of simple hetero-junction between different substances, while the structure according to the invention is of so-called mixed-junction and can be said to be an organic luminescent element based on a new concept.

Accordingly, the invention provides a luminescent device comprising an organic luminescent element comprising an anode, a cathode, and an organic compound layer provided between the anode and the cathode, and wherein the organic compound layer comprises a hole transporting region composed of a hole transporting material which is higher in hole mobility than in electron mobility, an electron transporting region composed of an electron transporting material which is higher in electron mobility than in hole mobility, the hole transporting region being disposed nearer to the anode than the electron transporting region, and a mixed region provided between the hole transporting region and the electron transporting region and containing both the hole transporting material and the electron transporting material.

In addition, with the structure shown in FIG. 24, a hole injecting region composed of a material for enhancing a carrier filling quality of holes (referred below to as "hole injecting material") may be inserted between an anode and an organic compound layer. Also, an electron injecting region composed of a material for enhancing a filling quality of electrons (referred below to as "electron injecting material") may be inserted between a cathode and an organic compound layer. Further, both the hole injecting region and the electron injecting region may be inserted.

In this case, since the hole injecting material or electron injecting material is a material for reducing a carrier filling barrier from electrodes to organic compound layers, it smoothens movements of a carrier from electrodes to organic compound layers, and so is effective in eliminating accumulation of charges. However, for the purpose of avoiding the above-mentioned formation of any impurity layers, it is preferable to perform deposition without intervals between the respective filling materials and the organic compound layers.

Hereupon, it is preferable in terms of carrier balance control to form concentration gradients in a mixed region, which contains both the hole transporting material and the electron transporting material, such that the hole transporting material gradually decreases in concentration and the electron transporting material gradually increases toward a cathode from an anode. Also, it is desired in the invention that the mixed region have a thickness of 10 nm or more since it is also a carrier recombination region.

Also, the invention covers a structure, as shown in FIG. 26A, in which an organic compound layer 2603 provides therein a hole transporting region 2605 composed of a hole transporting material, an electron transporting region 2606 composed of an electron transporting material, and a mixed region 2607, in which the hole transporting material and the electron transporting material are mixed together, and a luminescent material 2608 for luminance is added as a dopant to the mixed region 2607. In addition, while an anode 2602 is provided on a substrate 2601, a reverse structure may be adopted, in which a cathode 2604 is provided on the substrate. Also, a hole injecting region and an electron injecting region may be provided between electrodes and organic compound layers.

When the luminescent material 2608 is added to the mixed region 2607, the luminescent material 2608 traps a carrier, so that the recombination efficiency is enhanced and a high luminescent efficiency can be expected. It can be said that one of the features is that the luminescent color can be controlled by the luminescent material 2608. In this case, however, it is preferable that the luminescent material 2608 be minimum in excitation energy among compounds contained in the mixed region 2607.

Also, quenching caused in energy transfer to electrode materials can be prevented by separating the luminescent regions from the both electrodes as far as possible. Accordingly, a region where the luminescent material is doped is not an entire region in the mixed region but may be a part (in particular, a central part) of the mixed region.

Further, the invention covers a structure, as shown in FIG. 26B, in which an organic compound layer 2603 provides therein a hole transporting region 2605 composed of a hole transporting material, an electron transporting region 2606 composed of an electron transporting material, and a mixed region 2607, in which the hole transporting material and the electron transporting material are mixed together, and a blocking material 2609 is added to the mixed region 2607. In addition, while an anode 2602 is provided on a substrate 2601, a reverse structure may be adopted, in which a cathode 2604 is provided on the substrate. Also, a hole injecting region and an electron injecting region may be provided between electrodes and organic compound layers.

When the blocking material 2609 is added to the mixed region 2607, the recombination efficiency of carrier in the mixed region 2607 is enhanced and dispersion of molecule excitons is prevented, so that a high luminescent efficiency can be expected. In this case, however, it is preferable that the blocking material be maximum in excitation energy level among materials contained in the mixed region 2607.

Also, since the blocking material in many cases functions to block one of holes and electrons, it sometimes destroys a carrier balance in the mixed region when doped over the entire mixed region. Accordingly, a region where the blocking material is doped is not an entire region in the mixed region but may be a part (in particular, end part) of the mixed region.

In addition, as a more preferable example in FIG. 26B, a luminescent material 2608 is added. That is, this configuration comprises a combination with that in FIG. 26A. In the case where the blocking material 2609 is of hole blocking quality, the luminescent material 2608 is made efficiently luminescent by adding a hole blocking material to a side nearer a cathode than a region where the luminescent material 2608 is added, as shown in FIG. 26B.

Also, application of the invention to triplet light emitting diodes can provide a highly functional luminescent element, which is long in service life as compared with that disclosed in Literature 8 in addition to high intensity luminance and high luminous efficiency based on luminance from a triplet excited state.

In addition, since triplet molecule excitons are large in diffusion length as compared with singlet molecule excitons, it is preferable that a blocking material be contained in the mixed region. That is, stated with reference to FIG. 26B, it is desired that a material capable of converting triplet excited energy into luminance (referred below to as "triplet luminescent material") be used as the luminescent material 2608 and the blocking material 2609 be added at the same time.

Subsequently, examples suitable for manufacture will be described in a structure involving the addition of the luminescent material as shown in FIGS. 26A and 26B. FIG. 27 shows such element structure.

With an element shown in FIG. 27, provided in an organic compound layer 2703 containing a hole transporting material and an electron transporting material are a hole transporting region 2705 composed of a hole transporting material, an electron transporting region 2706 composed of an electron transporting material, and a mixed region 2707, in which the hole transporting material and the electron transporting material are mixed together at a certain rate, and a luminescent material 2708 for luminance is added to the mixed region 2707 to form a luminescent region. While an anode 2702 is provided on a substrate 2701, a reverse structure may be adopted, in which a cathode 2704 is provided on the substrate.

In addition, FIG. 28 shows a concentration profile in the case where the ratio of concentration of a hole transporting material and an electron transporting material in the mixed region is x:y.

In the case where such element is formed, the hole transporting material can receive and carry holes on an anode side and the electron transporting material can receive and carry electrons on a cathode side. Further, since the mixed region 2707 is bipolar-natured, both holes and electrons can move in the mixed region 2707. Also, owing to the certain ratio x:y in the mixed region 2707, manufacture is easy.

Here, it is essential that the luminescent region containing the luminescent material is formed in the mixed region 2707. That is, addition of the luminescent material to the mixed region 2707 prevents a carrier from passing in the mixed region without recombination, and at the same time keeps the luminescent region away from the electrodes to prevent quenching caused by the electrodes.

Accordingly, the invention provides a luminescent device comprising an organic luminescent element comprising an anode, a cathode, and an organic compound layer provided between the anode and the cathode, and wherein the organic compound layer comprises a hole transporting region composed of a hole transporting material, an electron transporting region composed of an electron transporting material, a mixed region provided between the hole transporting region and the electron transporting region and containing the hole transporting material and the electron transporting material at a particular ratio, and a luminescent region, which is provided in the mixed region and to which a luminescent material adapted to present luminance is added.

In addition, it is preferable that the luminescent material is small in excitation energy as compared with the hole transporting material and the electron transporting material. This is for the purpose of preventing energy transfer in molecule excitons.

Also, with the structure shown in FIG. 27, a hole injecting region composed of a material for enhancing a filling quality of holes (referred below to as "hole injecting material") may be inserted between an anode and an organic compound layer. Also, an electron injecting region composed of a material for enhancing a filling quality of electrons (referred below to as "electron injecting material") may be inserted between a cathode and the organic compound layer. Further, both the hole injecting region and the electron injecting region may be inserted.

In this case, since the hole injecting material or electron injecting material is a material for reducing a barrier of carrier filling from electrodes to organic compound layers, it smoothens movements of a carrier from electrodes to organic compound layers, and so is effective in eliminating accumulation of charges. However, for the purpose of avoiding the above-mentioned formation of any impurity layers, it is preferable to perform deposition without intervals between the respective filling materials and the organic compound layers.

Also, a part (substantially centrally positioned as it becomes of bipolar-natured) for recombination of a carrier is substantially determined in a mixed region depending upon its mixing ratio. Accordingly, a luminescent material may be added over the entire mixed region (FIG. 29A), but may be added to a part of the mixed region (FIG. 29B). In addition, the reference numerals in FIG. 27 are referred to in FIGS. 29A and 29B.

Further, the invention covers a structure, as shown in FIG. 30A, in which an organic compound layer 2703 provides therein a hole transporting region 2705 composed of a hole transporting material, an electron transporting region 2706 composed of an electron transporting material, and a mixed region 2707, in which the hole transporting material and the electron transporting material are mixed together, and to which a luminescent material is added, and a blocking material 2709 is added to the mixed region 2707. In addition, while an anode 2702 is provided on a substrate 2701, a reverse structure may be adopted, in which a cathode 2704 is provided on the substrate. Also, a hole injecting region and an electron injecting region may be provided between the electrode and the organic compound layer.

In this case, it is preferable that the blocking material be maximum in excitation energy level among materials contained in the mixed region 2707 and be one having the function of blocking a carrier or preventing dispersion of molecule excitons. When the blocking material 2709 is added to the mixed region 2707, the recombination efficiency of carrier in the mixed region 2707 is enhanced and dispersion of molecule excitons can be prevented, so that a high luminescent efficiency can be expected. However, since the blocking material in many cases functions to block one of holes and electrons, it sometimes destroys a carrier balance in the mixed region when added to the entire mixed region. Accordingly, a region, to which the blocking material is added, is not an entire region in the mixed region but is a part of the mixed region.

Also, usually effective for the blocking material is a material, which is low in HOMO level, that is, is capable of blocking holes. Accordingly, a way to add a blocking material to a cathode side rather than a region, to which a luminescent material 2708 is added, is useful as shown in FIG. 30B.

Further, application of a triplet light emitting material as a luminescent material added to such element structure can provide a highly functional luminescent element, which is long in service life in addition to high intensity luminance and high luminous efficiency based on luminance from a triplet excited state. In addition, since triplet molecule excitons are large in diffusion length as compared with singlet molecule excitons, it is preferable that a blocking material be contained in the mixed region.

Hereupon, since the above-mentioned mixed region composed of the hole transporting material and the electron transporting material is required to be of bipolar-natured, it is preferable that the ratio of mass of the hole transporting material to total mass of the hole transporting material and the electron transporting material in the mixed region be 10% or more and 90% or less. However, the ratio is believed to vary widely depending upon a combination of materials.

Also, since the mixed region composed of the hole transporting material and the electron transporting material contains a luminescent region, that is, a carrier recombination region, it is required to have a some thickness so as not to permit a carrier to pass by. Accordingly, it is desired that the mixed region have a thickness of 10 nm or more. Also, taking into consideration that a region, which becomes bipolar-natured, is high in resistance, it is desired that the above thickness be 100 nm or less.

A luminescent device, which is lower in drive voltage and longer in service life than a prior one, can be provided by practicing the invention described above. Further, an electric appliance, which is lower in power consumption and more durable than in the prior art, can be provided when manufactured by the use of such luminescent device.

BRIEF DESCRIPTION OF THE SEVERAL VIEWS OF THE DRAWINGS

FIGS. 12A and 12B are views showing the sectional construction of a luminescent device.

DETAILED DESCRIPTION OF THE INVENTION

Embodiments of the invention will be described below. In addition, at least one of an anode and a cathode in an organic luminescent element may be transparent sufficiently to take out luminescence, while the embodiment will be described with respect to an element structure, in which a transparent anode is formed on a substrate and luminescence is taken out from the anode. Actually, a structure, in which luminescence is taken out from a cathode and a structure, in which light is taken out from a side opposite to the substrate, are applicable.

Figure 5:
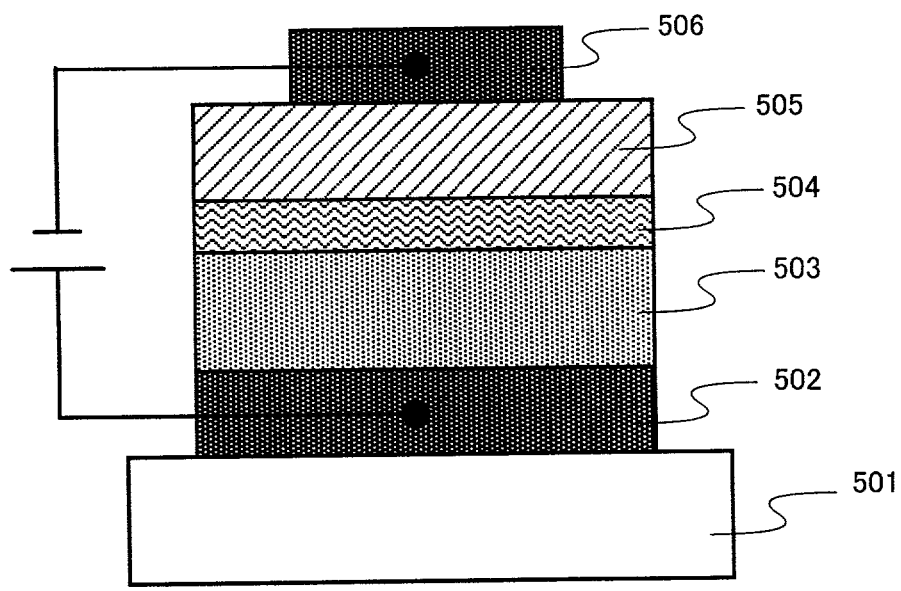
FIG. 5 is a view showing the structure of an organic luminescent element.

First, an explanation will be given to an embodiment of an organic luminescent element formed with a hole transporting mixed layer with reference to FIG. 5. In FIG. 5, there is shown a structure, in which a hole transporting mixed layer 503, a luminescent layer 504, an electron transporting layer 505, and a cathode 506 are laminated on a substrate 501 having an anode 502. In addition, it is possible that the luminescent layer 504 is not inserted, but the hole transporting mixed layer 503 or the electron transporting layer 505 takes charge of luminescence. The hole transporting mixed layer 503 is formed by a mixture of both of a hole injecting material and a hole transporting material.

Figure 1A:
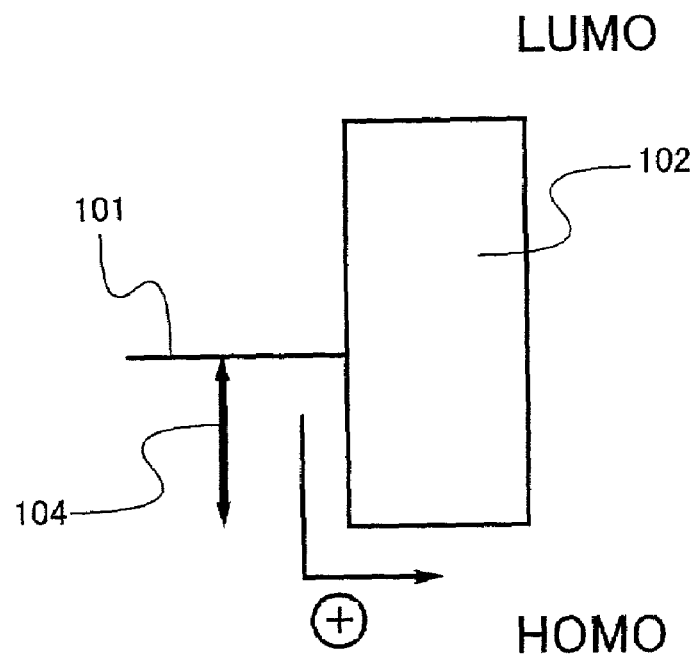
FIGS. 1A and 1B are views showing the role of a hole injecting layer.
Figure 1B:
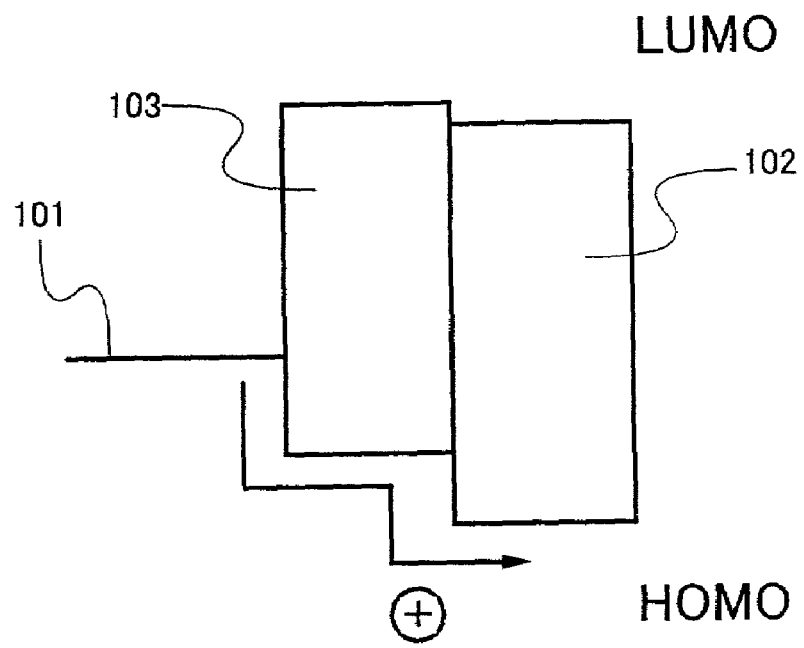
Figure 2:
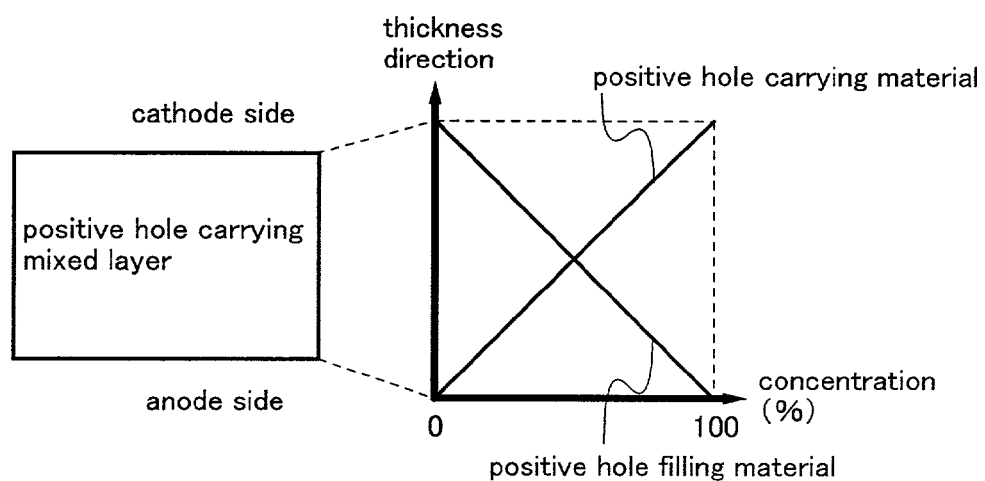
FIG. 2 is a view showing concentration gradients.

In addition, the hole transporting mixed layer 503 is formed, as shown in FIG. 2, with a concentration gradient, which consists of the hole injecting material and the hole transporting material. In this case, it is preferable that the hole injecting material have a steep concentration gradient (rapidly damping to anode side) when a highly insulating material such as aluminum oxide is used as the hole injecting material.

Figure 6:
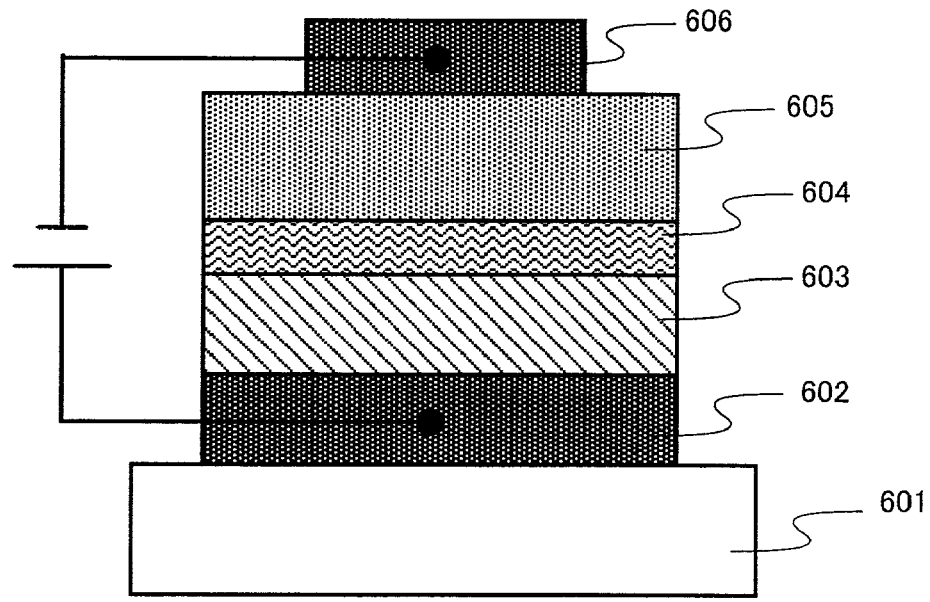
FIG. 6 is a view showing the structure of an organic luminescent element.

Subsequently, an explanation will be given to an embodiment of an organic luminescent element formed with an electron transporting mixed layer, with reference to FIG. 6. In FIG. 6, there is shown a structure, in which a hole transporting layer 603, a luminescent layer 604, an electron transporting mixed layer 605, and a cathode 606 are laminated on a substrate 601 having an anode 602. In addition, it is possible that the luminescent layer 604 is not inserted, but the electron transporting mixed layer 605 or the hole transporting layer 603 takes charge of luminescence. The electron transporting mixed layer 605 is formed by a mixture of both of an electron injecting material and an electron transporting material.

Figure 3:
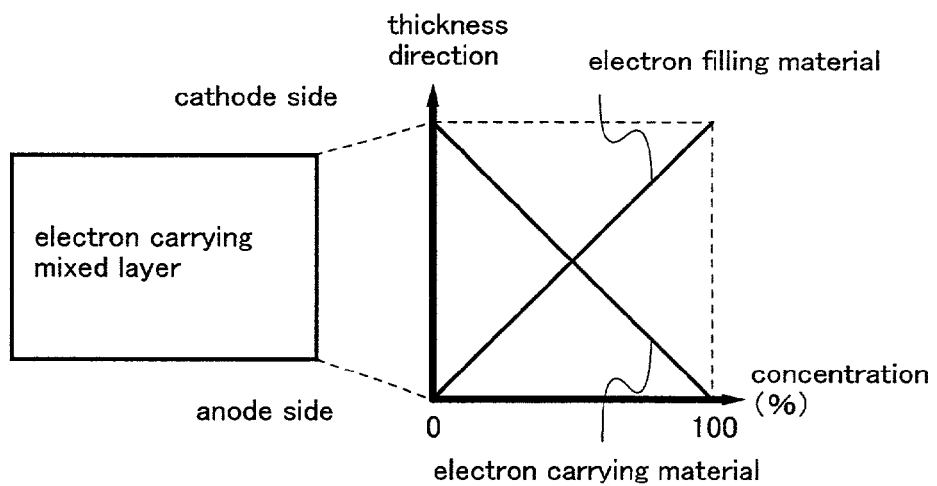
FIG. 3 is a view showing concentration gradients.

In addition, the electron transporting mixed layer 605 may be formed, as shown in FIG. 3, with a concentration gradient, which consists of the electron injecting material and the electron transporting material. In this case, it is preferable that the electron injecting material have a steep concentration gradient (rapidly damping to anode side) when a highly insulating material such as lithium fluoride is used as the electron injecting material.

Figure 7:
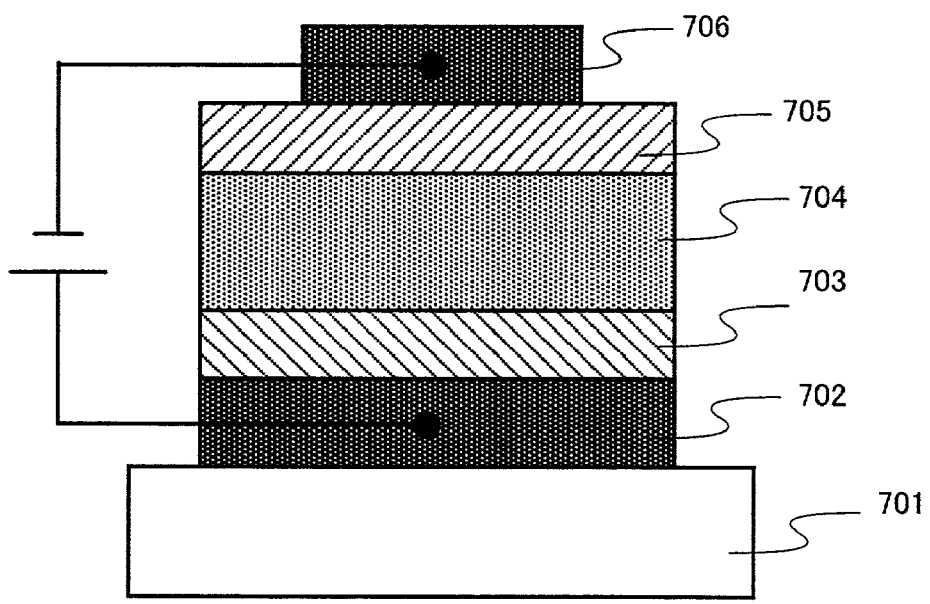
FIG. 7 is a view showing the structure of an organic luminescent element.

Subsequently, an explanation will be given to an embodiment of an organic luminescent element formed with a bipolar-natured mixed layer, with reference to FIG. 7. In FIG. 7, there is shown a structure, in which a hole injecting layer 703, a bipolar-natured mixed layer 704, an electron injecting layer 705, and a cathode 706 are laminated on a substrate 701 having an anode 702. The bipolar-natured mixed layer 704 is formed by a mixture of both of a hole transporting material and an electron transporting material.

Figure 4:
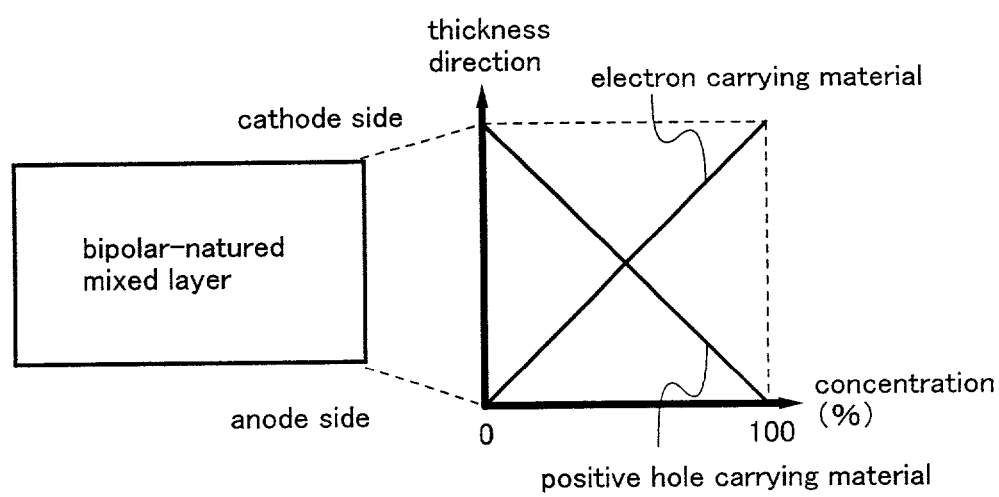
FIG. 4 is a view showing concentration gradients.

In addition, the bipolar-natured mixed layer 704 may be formed, as shown in FIG. 4, with a concentration gradient, which consists of the hole transporting material and the electron transporting material.

Figure 24:
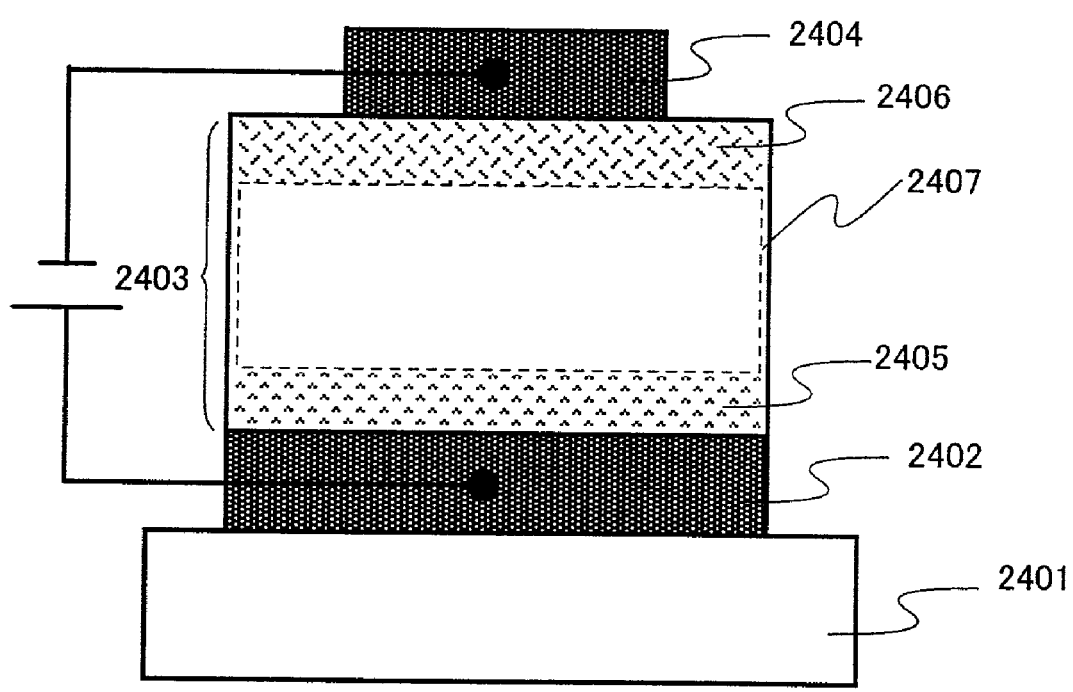
FIG. 24 is a view showing the structure of an organic luminescent element.
Figure 25:
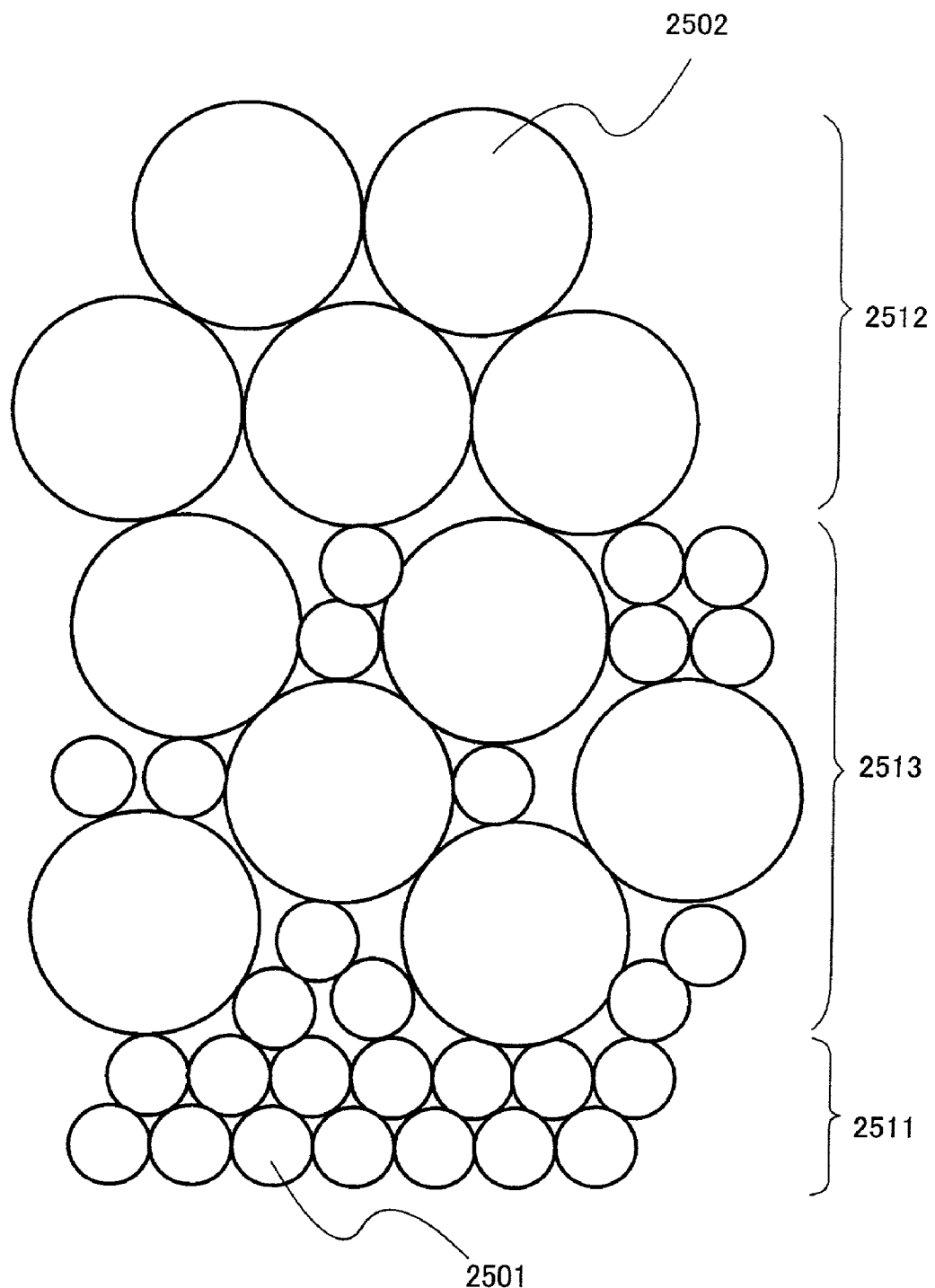
FIG. 25 is a view showing the state of an organic compound layer.

Also, as shown in FIG. 24, a mixed region 2407, a hole transporting region 2405 and an electron transporting region 2406 may be successively joined by using a constituent material of the hole transporting region 2405 for a hole transporting material contained in the mixed region 2407, and using a constituent material of the electron transporting region 2406 for an electron transporting material contained in the mixed region 2407. In this case, there is an advantage that two kinds of compounds (a hole transporting material and an electron transporting material) can serve as three layers in the prior art, which comprise the hole transporting region, luminescent region, and the electron transporting region. In addition, although not shown in FIG. 24, a hole injecting layer may be inserted between an anode 2402 and the hole transporting region 2405, and an electron injecting layer may be inserted between a cathode 2404 and the electron transporting region 2406.

Such element structure is embodied to prevent formation of an impurity layer. In this case, the process of manufacturing an organic luminescent element is important. Here, an example suitable for a method of manufacturing such element structure will be described.

Figure 31A:
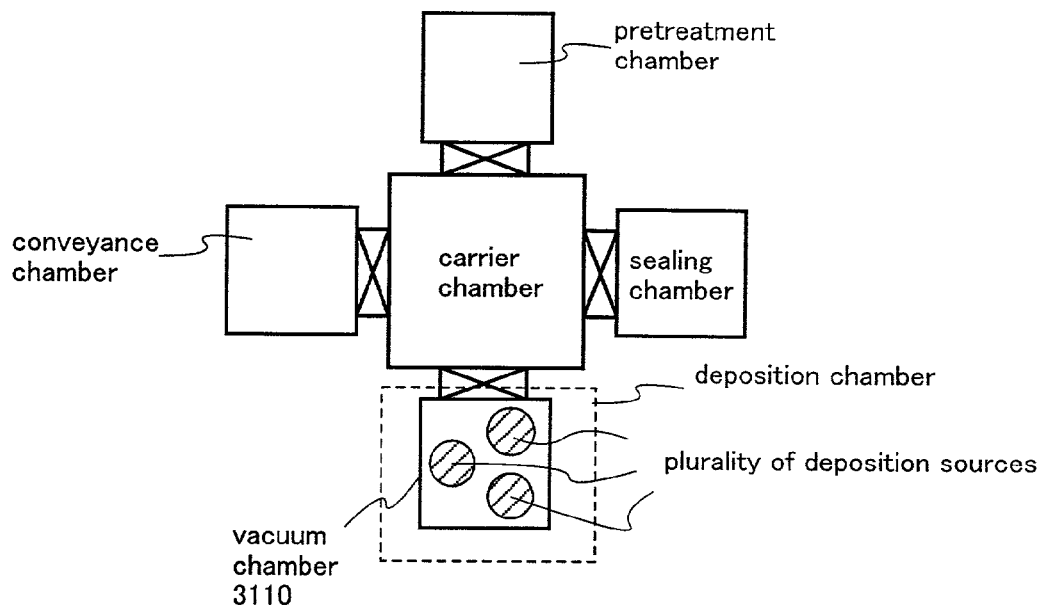
FIGS. 31A and 31B are views showing a deposition apparatus.
Figure 31B:
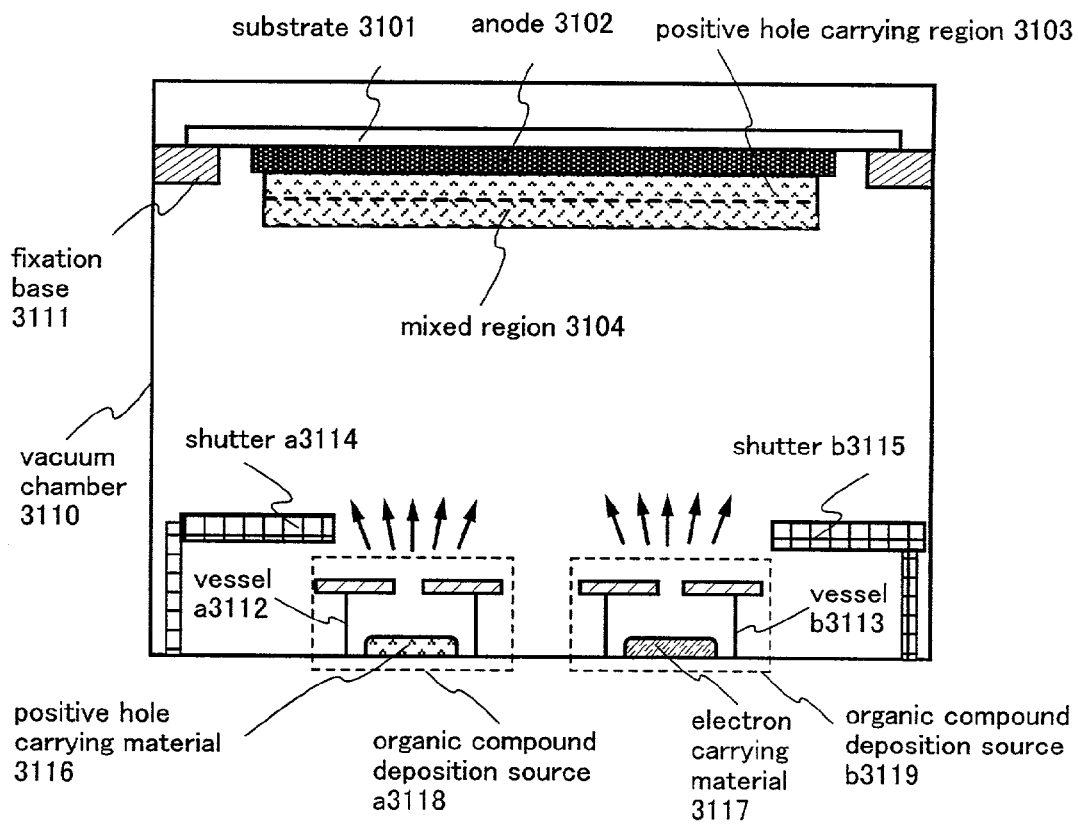

FIGS. 31A and 31B are conceptional views showing a deposition apparatus. FIG. 31A is a top plan view showing the apparatus. The deposition apparatus is of a single chamber type, in which a single vacuum chamber 3110 is installed as a deposition chamber, and a plurality of deposition sources are provided in the vacuum vessel. And separately received in the plurality of deposition sources are various materials of different functions such as constituent materials of a hole injecting material, hole transporting material, electron transporting material, electron injecting material, blocking material, luminescent material, cathode.

In such deposition apparatus with the deposition chamber, a substrate having an anode (ITO or the like) is first conveyed in a conveyance chamber, and is subjected to oxidation in a pretreatment chamber in the case where the anode is an oxide such as ITO (in addition, although not shown in FIG. 31A, it is possible to install an ultraviolet irradiation chamber for cleaning of anode surfaces). Further, all the materials forming an organic luminescent element are subjected to deposition in the vacuum chamber 3110. However, a cathode may be formed in the vacuum chamber 3110 or a separate deposition chamber may be provided for formation of a cathode. In short, it is sufficient that deposition be carried out in the single vacuum chamber 3110 until a cathode is formed. Finally, the organic luminescent element is obtained after being subjected to sealing in a sealing chamber and taken out from the conveyance chamber through a carrier chamber.

An explanation will be given to the procedure of manufacturing an organic luminescent element of the present invention with the use of a deposition apparatus of such single chamber type with reference to FIG. 31B (a cross sectional view of the vacuum chamber 3110). For the simplicity of illustration, FIG. 31B shows the procedure of forming an organic compound layer, which consists of a hole transporting material 3116 and an electron transporting material 3117, with the use of a vacuum chamber 3110 having two deposition sources (an organic compound deposition source a3118 and an organic compound deposition source b3119).

First, a substrate 3101 having an anode 3102 is carried into the vacuum chamber 3110 and is fixed to a fixation base 3111 (the substrate is normally rotated during deposition). Subsequently, after the vacuum chamber 3110 is depressurized ($10^{-4}$ Pa or lower is preferable), a vessel a3112 is heated to evaporate the hole transporting material 3116 and a shutter a3114 is opened for starting of deposition after a predetermined deposition rate (unit: [nm/s]) is reached. At this time, a vessel b3113 is also heated while a shutter b3115 is closed.

Thereafter, with the shutter a3114 opened, the shutter b3115 is opened to allow an electron transporting material 3117 to be subjected to codeposition (a state shown in FIG. 31B) and to form a mixed region 3104 behind a hole transporting region 3103. This operation eliminates mixing of an impurity layer between the hole transporting region 3103 and the mixed region 3104.

Further, in order to form an electron transporting region, with the shutter b3115 opened, the shutter a3114 is closed to terminate heating of the vessel a3112. This operation eliminates formation of an impurity layer between the mixed region 3104 and the electron transporting region.

Figure 26A:
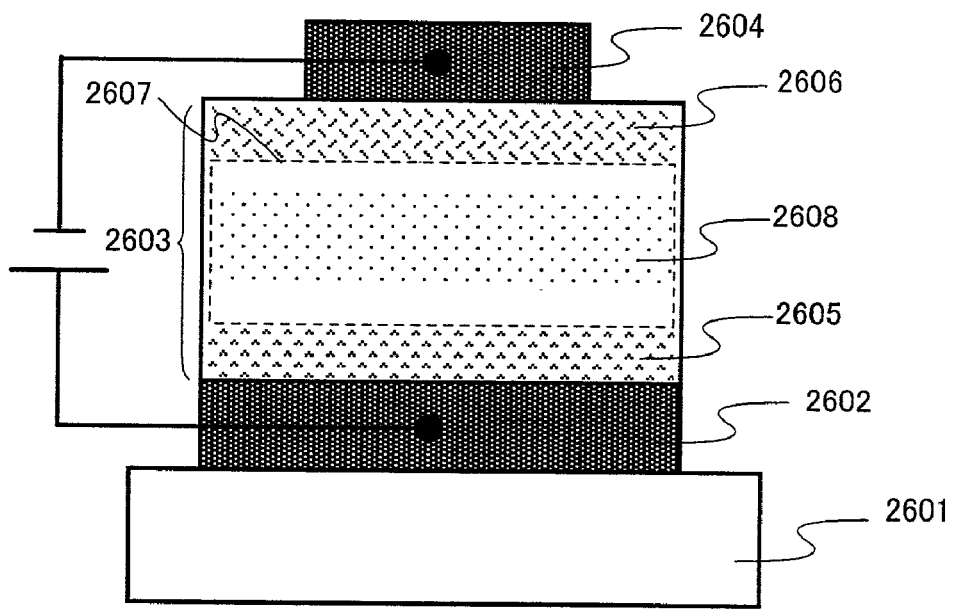
FIGS. 26A and 26B are views showing the structure of an organic luminescent element.

Further, there is a way to dope a luminescent material in a mixed region 2607 shown in FIG. 26A to make the same luminescent. In this case, it is required that a luminescent material being a dopant have a lower excitation energy than those of a hole transporting material and an electron transporting material contained in the mixed region 2607.

In the case where a luminescent material is to be doped, the process of manufacturing an organic luminescent element is important in order to prevent formation of impurities. The manufacturing procedure will be described below.

Figure 32A:
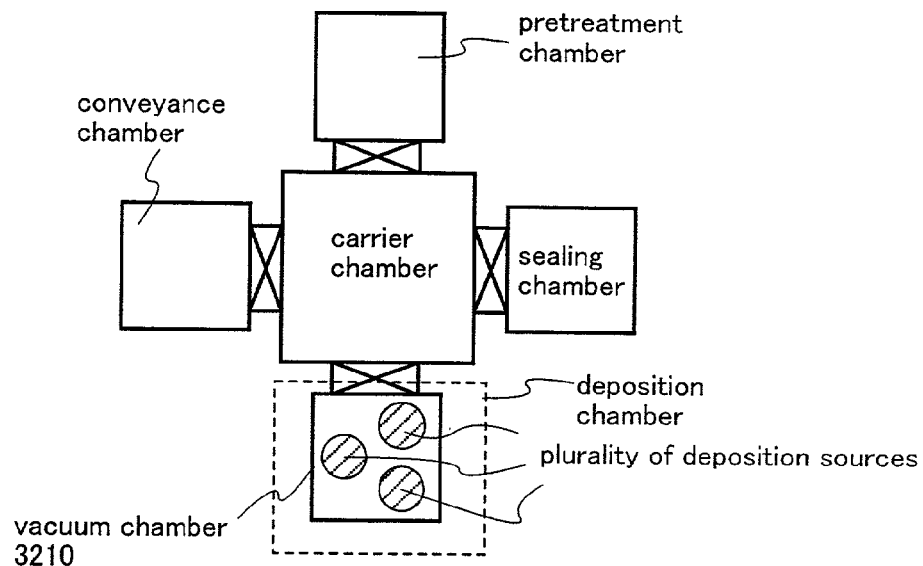
FIGS. 32A and 32B are views showing a deposition apparatus.

FIG. 32A is a top plan view showing a deposition apparatus of single chamber type, in which a vacuum chamber 3210 is installed as the deposition chamber and a plurality of deposition sources are provided in the vacuum chamber. And separately received in the plurality of deposition sources are various materials of different functions such as constituent materials including a hole injecting material, hole transporting material, electron transporting material, electron injecting material, blocking material, luminescent material, a cathode.

In the deposition apparatus having such deposition chamber, a substrate having an anode (ITO or the like) is first carried into the conveyance chamber, and is subjected to oxidation in the pretreatment chamber in the case of the anode being an oxide such as ITO (in addition, although not shown in FIG. 32A, it is possible to provide an ultraviolet irradiation chamber in order to clean the anode surfaces). Further, all the materials forming an organic luminescent element are subjected to deposition in the vacuum chamber 3210. However, a cathode may be formed in the vacuum chamber 3210 or a separate deposition chamber may be provided for formation of a cathode. In short, it is sufficient that deposition be carried out in the single vacuum chamber 3210 until a cathode is formed. Finally, the organic luminescent element is obtained after being subjected to sealing in a sealing chamber and taken out from a conveyance chamber through a carrier chamber.

Figure 32B:
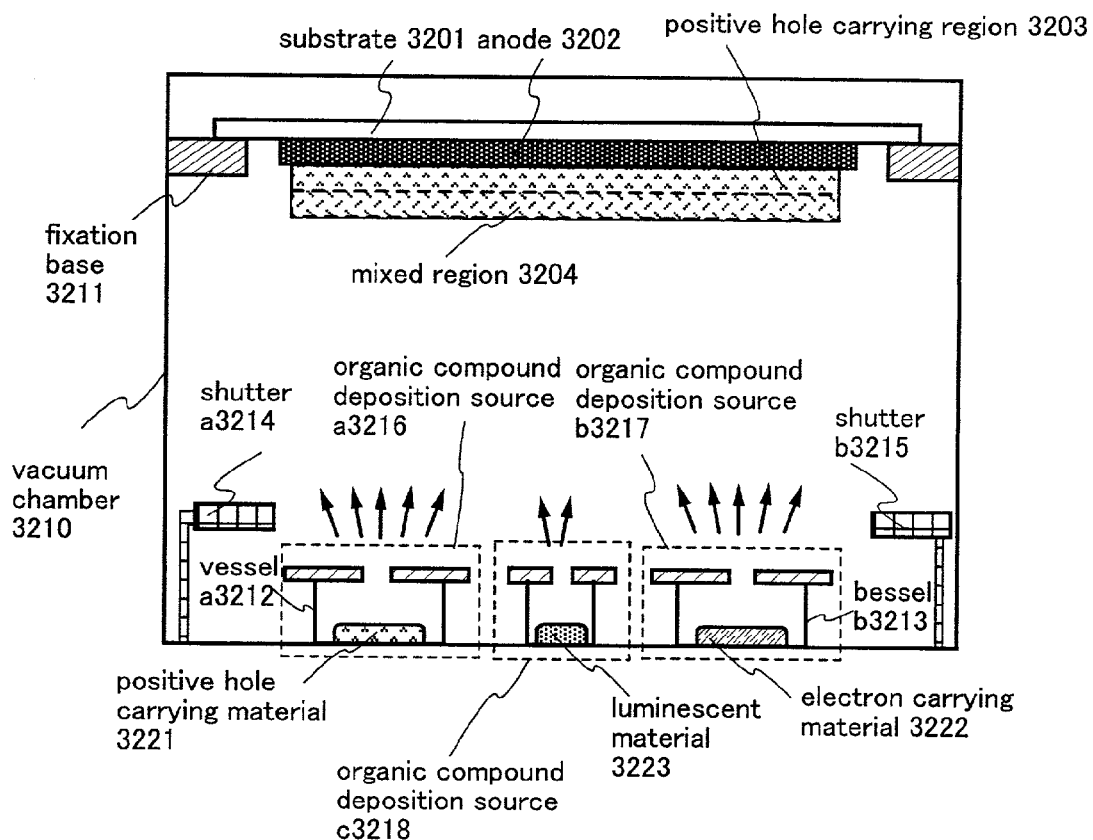

An explanation will be given to the procedure of manufacturing an organic luminescent element of the present invention with the use of a deposition apparatus of such single chamber type with reference to FIG. 32B (a cross sectional view of the vacuum chamber 3210). FIG. 32B shows, as a simplest example, the procedure of forming an organic compound layer, which consists of a hole transporting material 3221, an electron transporting material 3222 and a luminescent material 3223, with the use of a vacuum chamber 3210 having three deposition sources (an organic compound deposition source a3216, an organic compound deposition source b3217, and an organic compound deposition source c3218).

First, a substrate 3201 having an anode 3202 is carried into the vacuum chamber 3210 and is fixed to a fixation base 3211 (the substrate is normally rotated during deposition). Subsequently, after the vacuum chamber 3210 is depressurized ($10^{-4}$ Pa or lower is preferable), a vessel a3212 is heated to evaporate the hole transporting material 3221 and a shutter a3214 is opened for starting of deposition after a predetermined deposition rate (unit: [nm/s]) is reached. At this time, a vessel b3213 is also heated while a shutter b3215 is closed.

Thereafter, with the shutter a3214 opened, the shutter b3215 is opened to allow an electron transporting material 3222 to be subjected to codeposition to form a mixed region 3204 behind a hole transporting region 3203. This operation eliminates mixing of an impurity layer between the hole transporting region 3203 and the mixed region 3204. Here, a very small amount of luminescent material 3223 is added in the course of formation of the mixed region 3204 (a state shown in FIG. 32B).

Further, in order to form an electron transporting region, with the shutter b3215 opened, the shutter a3214 is closed to terminate heating of the vessel a3212. This operation eliminates formation of an impurity layer between the mixed region 3204 and the electron transporting region.

Application of this procedure makes it possible to manufacture all organic luminescent elements described previously with respect to measures for solving the problems. For example, in the case of adding a blocking material to the mixed region 3204, it is sufficient to install a deposition source for deposition of the blocking material as shown in FIG. 32B and evaporate the same in the course of formation of the mixed region.

Also, in the case of forming hole injecting regions or electron injecting regions, it is sufficient to install in the same vacuum vessel 3210 deposition sources for respective filling materials. For example, in FIG. 32B, in the case of provision of a hole injecting region between the anode 3202 and the hole transporting region 3203 by a deposition, formation of an impurity layer can be avoided by evaporating the hole transporting material 3221 without an interval from a point of time a hole injecting material is deposited on the anode 3202.

In addition, since a concentration gradient can be formed in the above-mentioned mixed region, reference is made to an exemplary way to form a concentration gradient. Here, the case is described where deposition can be made with vacuum deposition due to resistance heating. With respect to the way to form a concentration gradient, in the case where correlation is established between the evaporating temperature of a material and deposition rate (ordinarily, unit is nm/s), it is possible to control a deposition rate with temperature control. However, organic materials used particularly in the form of particles are normally poor in thermal conduction to be liable to generate unevenness in control with temperature. Accordingly, it is preferable to prepare two kinds of materials for formation of concentration gradient, in separate deposition sources and to make deposition rate control making use of a shutter (the film thickness is monitored by a crystal oscillator). Such configuration is shown in FIG. 11.

Figure 11:
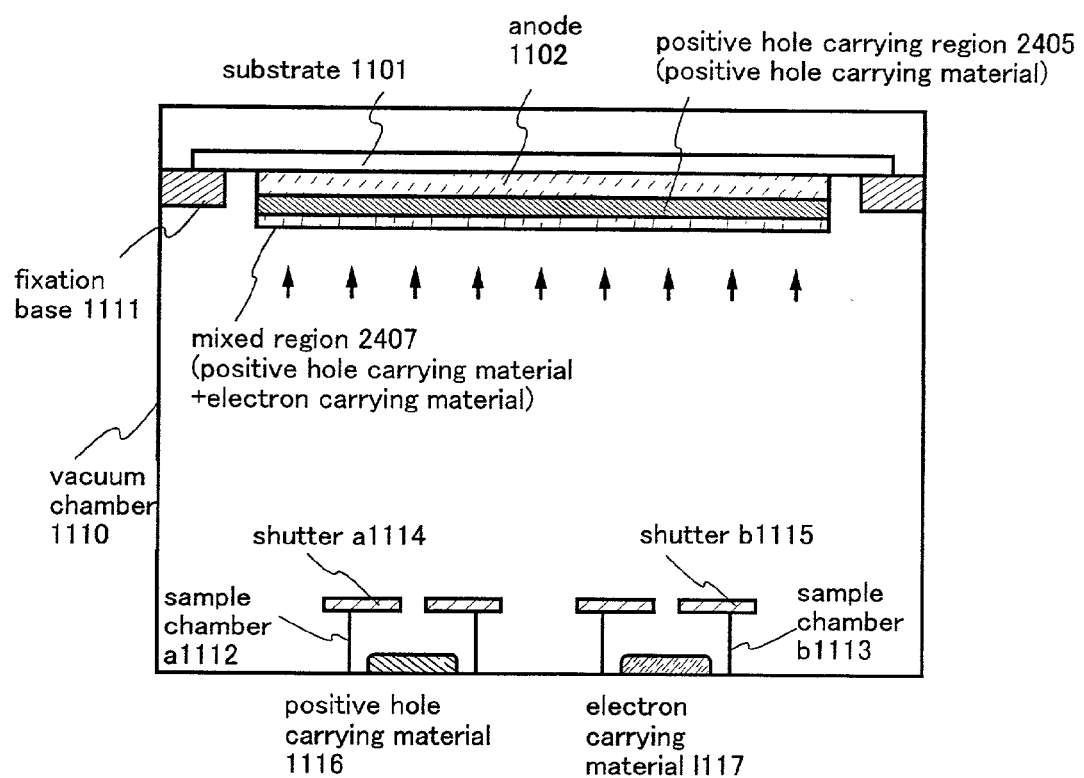
FIG. 11 is a view showing a deposition apparatus.

In FIG. 11, an explanation will be given to a way to form a concentration gradient by way of the element structure shown in FIG. 24. Accordingly, the reference numerals used in FIG. 24 are referred to in FIG. 11. First, a substrate 1101 having an anode 1102 is carried into a film formation chamber 1110 and is fixed to a fixation base 1111 (the substrate is normally rotated during deposition).

Subsequently, a sample chamber a1112 receiving a hole transporting material 1116 is heated and a shutter a1114 is opened to cause deposition of a hole transporting region 2405 composed of the hole transporting material 1116. At this time, a sample chamber b1113 receiving an electron transporting material 1117 is also simultaneously heated while a shutter b1115 is closed.

After the hole transporting region 2405 reaches a predetermined film thickness, the shutter a1114 is gradually closed and at the same time the shutter b1115 is gradually opened. The opening and closing speed at this time forms a concentration gradient for a mixed region 2407. The opening and closing speed may be set so that when the shutter a1114 is fully closed, the mixed region 2407 reaches a predetermined film thickness and the electron transporting material 1117 reaches a predetermined deposition rate (a rate at the time of deposition of an electron transporting region 2406). Thereafter, the electron transporting region 2406 is formed while the shutter b1115 remains opened, and so an element formed with a concentration gradient is made possible in the element structure shown in FIG. 24.

In addition, this way is all applicable in the case of forming a concentration gradient in other element structures than that shown in FIG. 24. Also, in the case where a luminescent material is added to a bipolar-natured mixed layer or a mixed region, it is sufficient to increase one more deposition source in FIG. 11 and to open the shutter for the dopant deposition source only during the time period of doping.

However, measures for forming a concentration gradient are not limited to the above way.

Hereupon, the several embodiments described above can be utilized in combination. For example, a hole transporting mixed layer, electron transporting mixed layer, and a bipolar-natured mixed layer are applied in combination. An example therefor is shown in FIG. 8.

Figure 8:
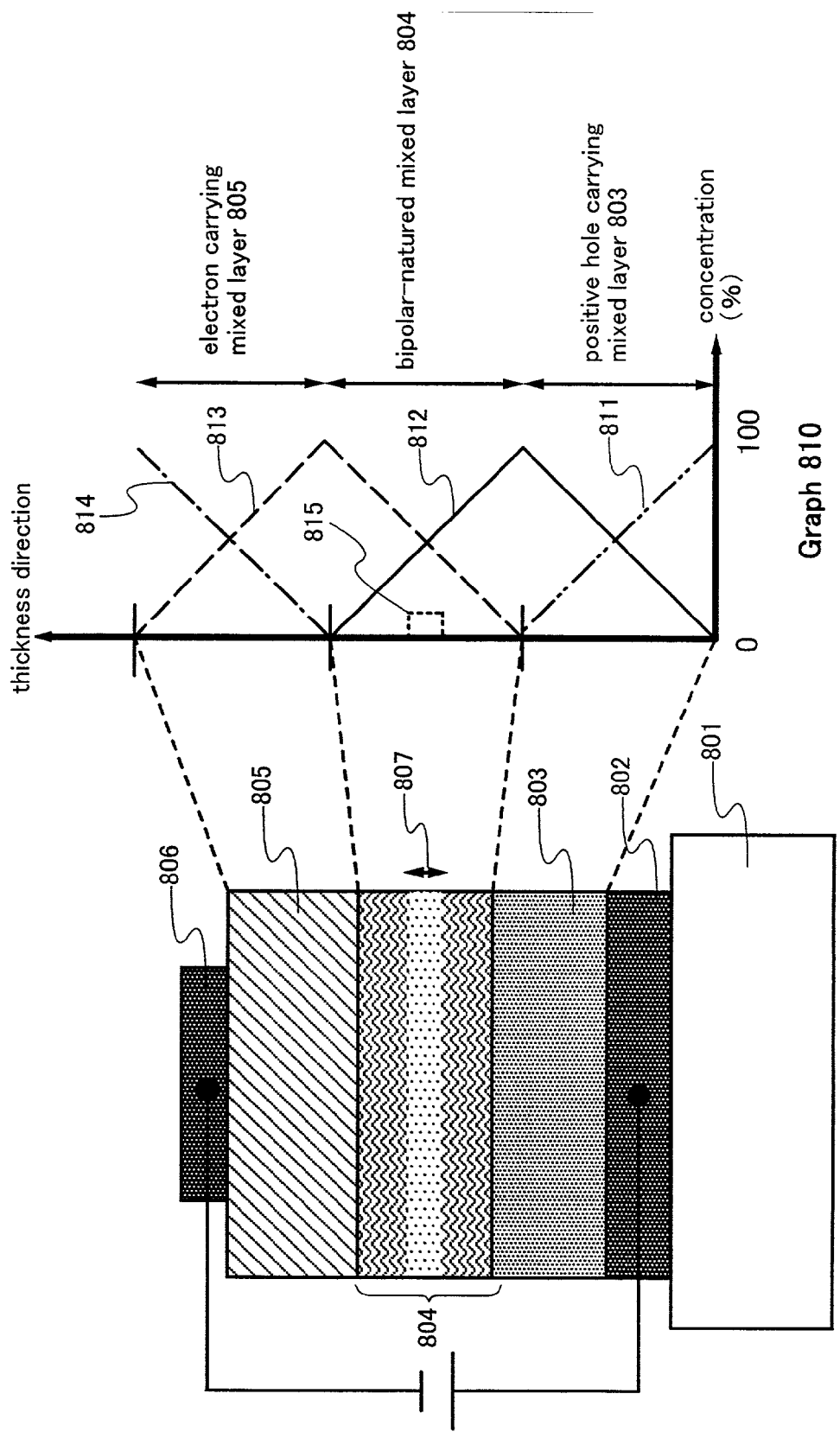
FIG. 8 is a view showing the structure of an organic luminescent element.

In an element structure shown in FIG. 8, laminated on a substrate 801 having an anode 802 are a hole transporting mixed layer 803 composed of a hole injecting material 811 and a hole transporting material 812, a bipolar-natured mixed layer 804 composed of a hole transporting material 812 and an electron transporting material 813, an electron transporting mixed layer 805 composed of an electron transporting material 813 and an electron injecting material 814, and a cathode 806.

Figure 19A:
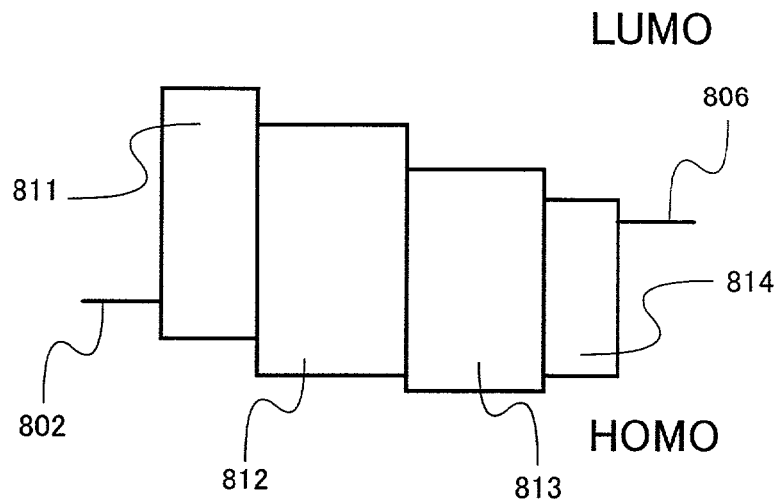
FIGS. 19A and 19B are views showing energy band diagrams.
Figure 19B:
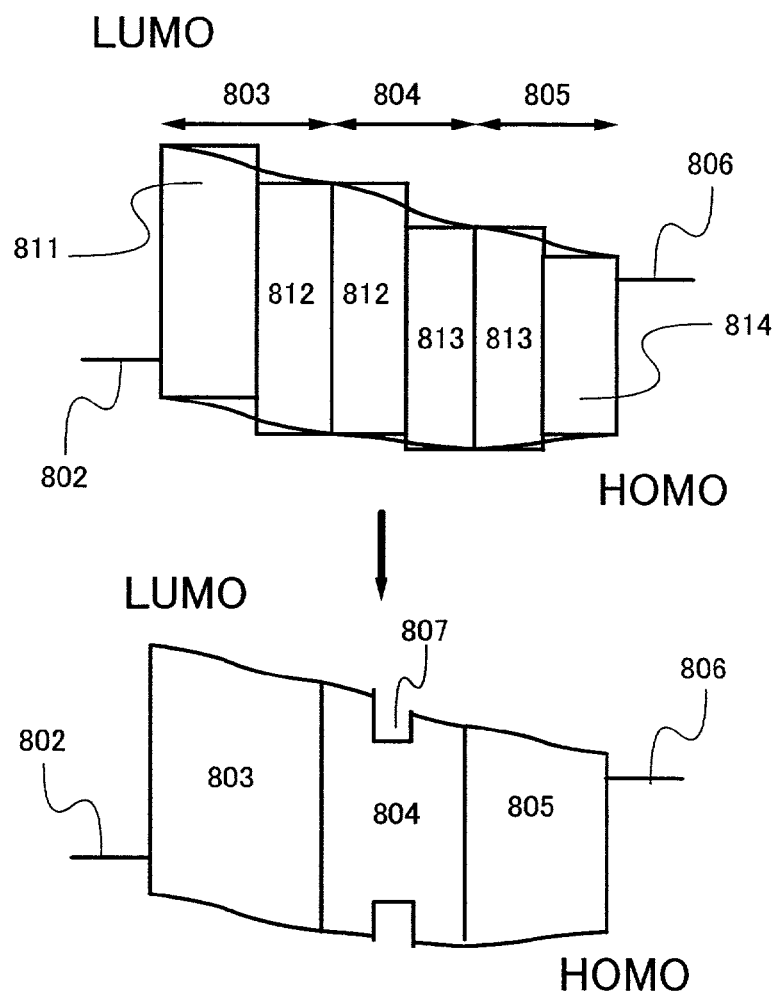

In addition, with the present embodiment, a luminescent region 807, in which a small amount of luminescent material 815 is doped, is provided in the bipolar-natured mixed layer 804. Also, concentration gradients shown in a graph 810 were formed in respective layers. In addition, FIG. 19B is a schematic view showing band diagrams expected in the case where such concentration gradients are formed.

With the element structure, a three layered structure (FIG. 19B) contains four layered structure (FIG. 19A) composed of a hole injecting layer, hole transporting layer, electron transporting layer, and an electron injecting layer in the prior art. Besides, as shown in FIG. 19B, only gentle energy barriers are present in the respective mixed layers, and the respective mixed layers are successively connected by the hole transporting material 812 and the electron transporting material 813, which is advantageous in movements of a carrier.

Subsequently, an explanation will be given to an embodiment in the case where an element, in which respective mixed layers are combined in the above manner, is applied to a triplet light emitting diode. Normally, the fundamental structure of a triplet light emitting diode is one shown in FIG. 9 as represented in Literature 8. That is, the structure is composed of a substrate 901, anode 902, hole transporting layer 903, luminescent layer 904 formed by doping a triplet light emitting material in a host material, blocking layer 905, electron transporting layer 906, and a cathode 907. The blocking layer 905 is made from a blocking material, and blocks holes to enhance the recombination efficiency of a carrier in the luminescent layer 904 and to serve to prevent molecule excitons generated in the luminescent layer 904 from scattering. Also, the layer is also a material for carrying of electron.

Figure 9:
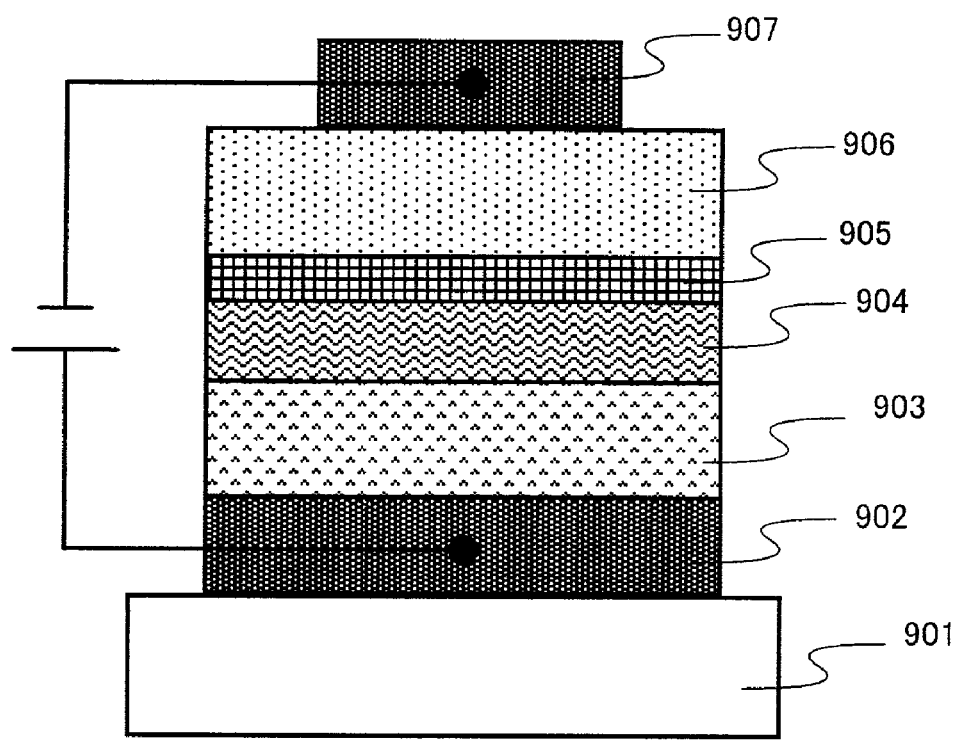
FIG. 9 is a view showing the structure of an organic luminescent element.

In the element structure shown in FIG. 9, the luminous efficiency can be further enhanced by providing a hole injecting layer and an electron injecting layer. However, a layer or layers are added to the five-layered structure shown in FIG. 9, resulting an increase in the number of interfaces. Hereupon, the invention is applied.

That is, measures are provided, in which the hole transporting layer 903 in FIG. 9 is made a hole transporting mixed layer composed of a hole injecting material and a hole transporting material, the luminescent layer 904 is made a bipolar-natured mixed layer composed of a hole transporting material and a host material of the luminescent layer, and the electron transporting layer 906 is made an electron transporting mixed layer composed of an electron transporting material and an electron injecting material. The triplet light emitting material may be doped in a portion where the host material of the luminescent layer is present. Also, it is effective as shown in FIGS. 2 to 4 to form concentration gradients in the respective mixed layers.

In addition, while the blocking layer 905 is used in the form of a single layer in FIG. 9, it may be mixed with the host material of the luminescent layer in practicing the invention (that is, the blocking mixed layer may be formed). However, from the point of view of preventing dispersion of molecule excitons it is preferable to form a concentration gradient so that the blocking material is high in concentration on a side of a cathode.

Figure 10:
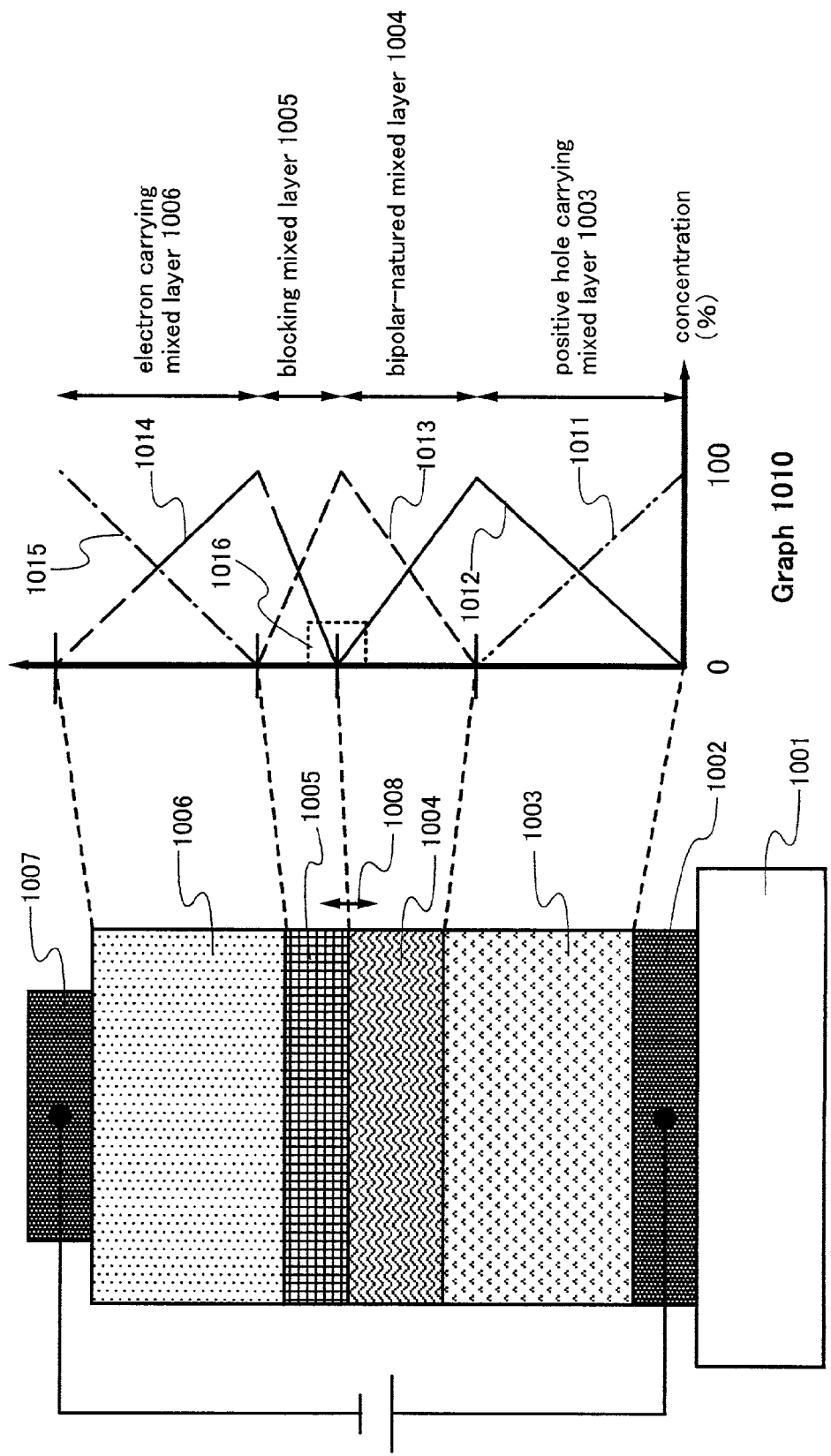
FIG. 10 is a view showing the structure of an organic luminescent element.

Taking account of the above, FIG. 10 shows an example of the embodiment, in which an element with respective mixed layers combined is applied to a triplet light emitting diode. More particularly, laminated on a substrate 1001 having an anode 1002 are a hole transporting mixed layer 1003 composed of a hole injecting material 1011 and a hole transporting material 1012, a bipolar-natured mixed layer 1004 composed of a hole transporting material 1012 and a host material 1013, a blocking mixed layer 1005 composed of the host material 1013 and a blocking material 1014, an electron transporting mixed layer 1006 composed of the blocking material 1014 (serving also as the electron transporting material in this case) and an electron injecting material 1015, and a cathode 1007. Formed in the respective layers are concentration gradients shown in Graph 1010.

Figure 20A:
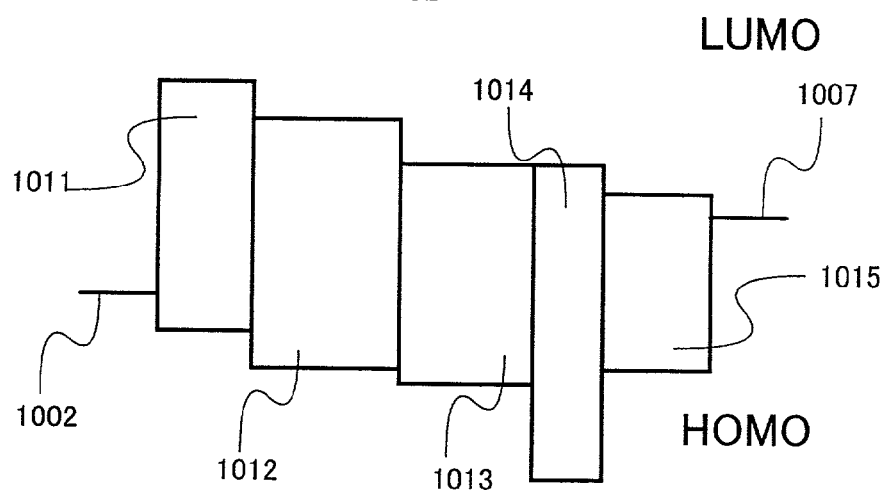
FIGS. 20A and 20B are views showing energy band diagrams.
Figure 20B:
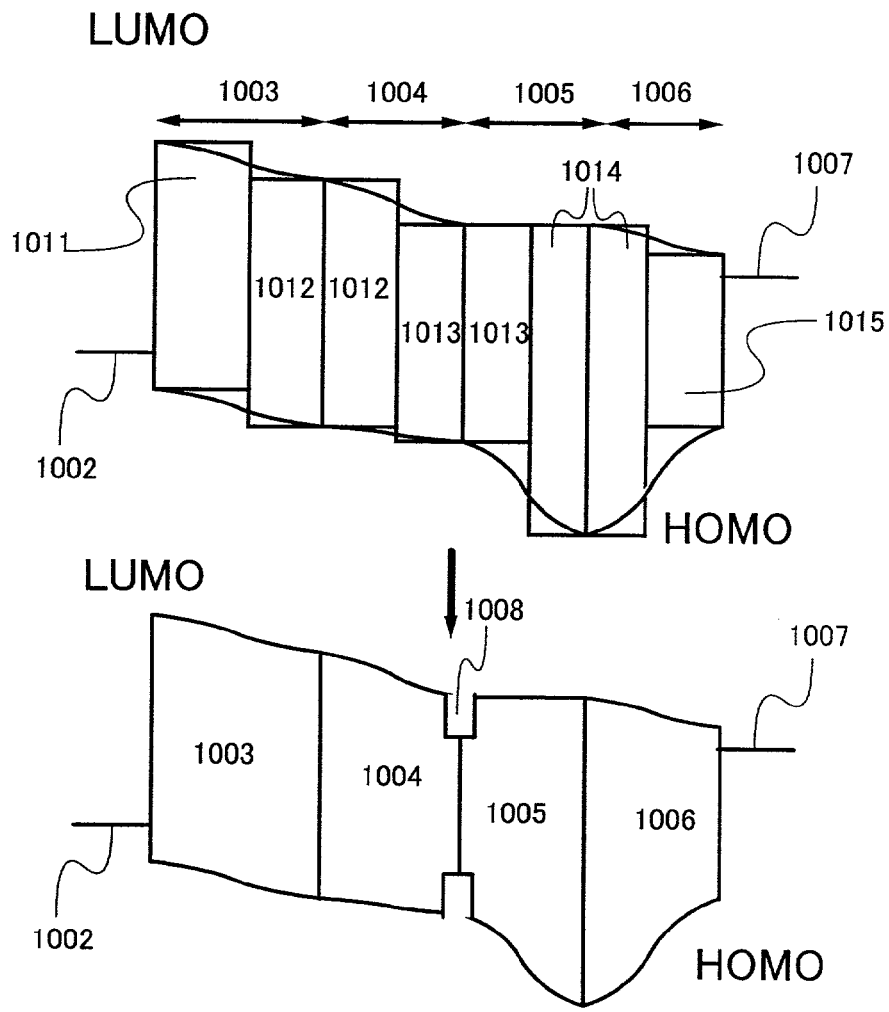
Figure 21:
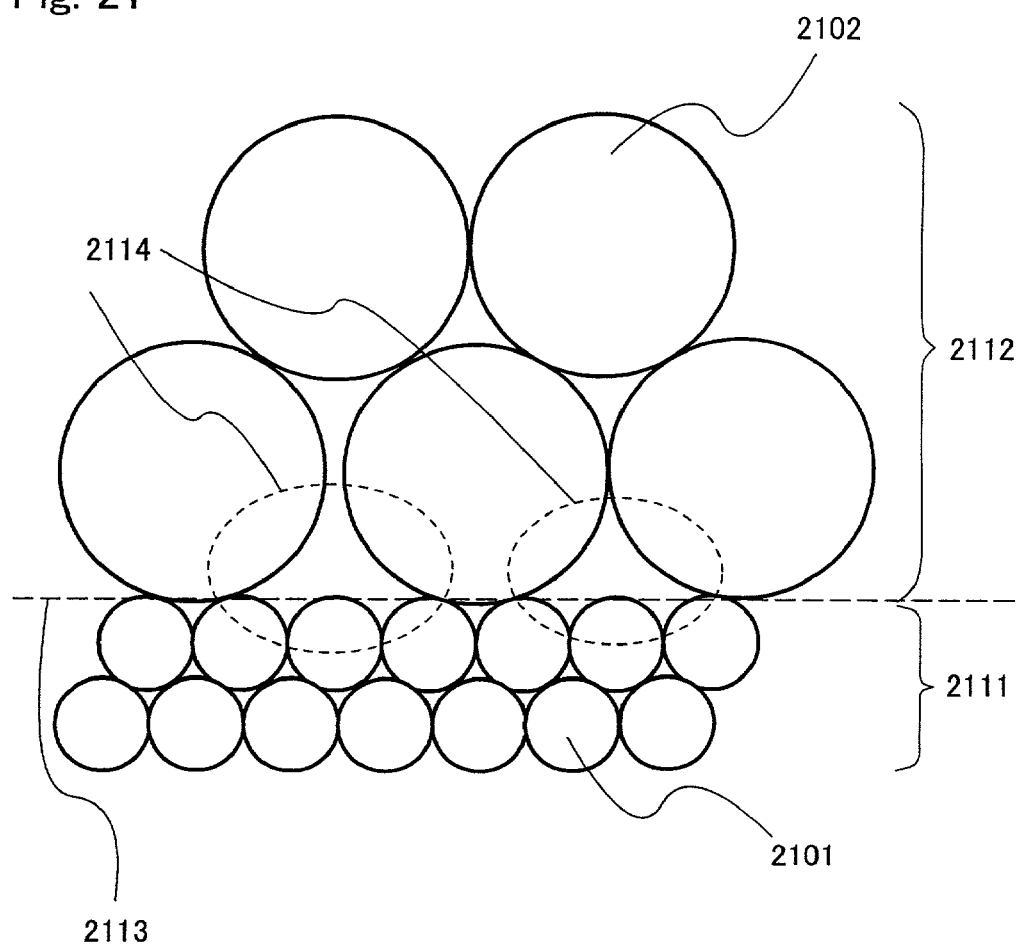
FIG. 21 is a view showing the state of an organic compound layer.
Figure 22:
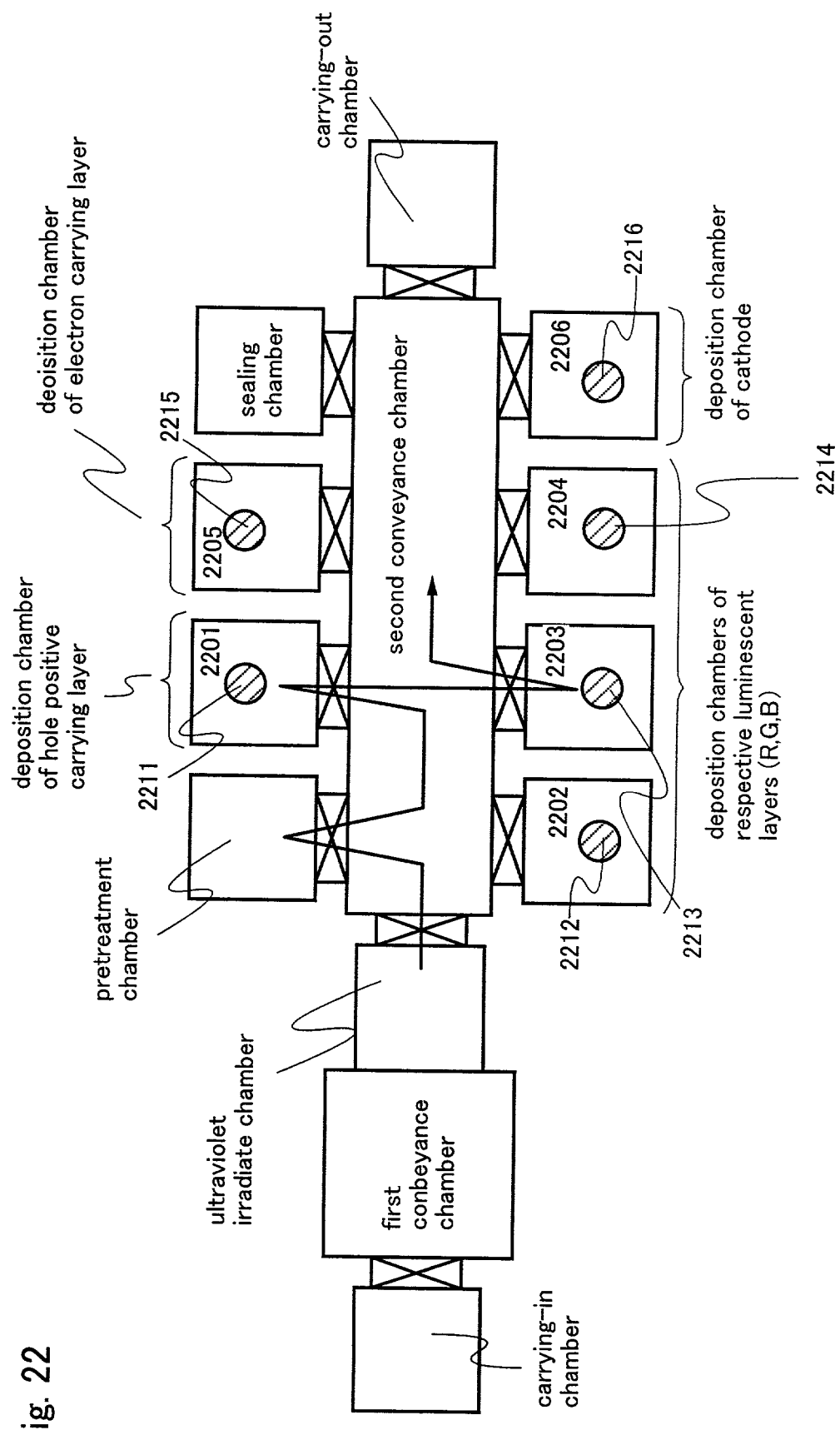
FIG. 22 is a view showing a deposition apparatus.
Figure 23:
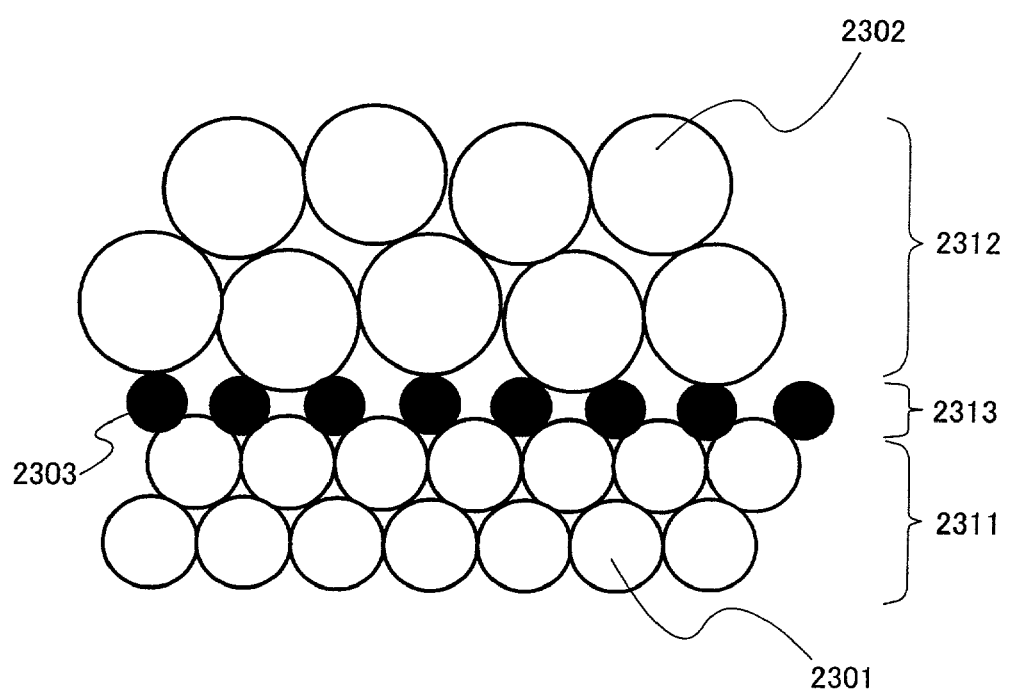
FIG. 23 is a view showing the formation of an impurity layer.

In addition, since the embodiment comprises a triplet light emitting diode, there is provided a luminescent region 1008, in which a small amount of triplet light emitting material 1016 is doped. The luminescent region 1008 is preferably disposed in a region where the host material 1013 is high in concentration as shown in FIG. 10. Also, FIG. 20B is a schematic view showing a band diagram expected in the case where concentration gradients are formed as shown in Graph 1010.

With the element structure, a four-layered structure (FIG. 20B) contains five-layered structure (FIG. 20A) composed of a hole injecting layer, hole transporting layer, luminescent layer, a blocking layer (serving also as the electron transporting layer), and an electron injecting layer in the prior art. Besides, as shown in FIG. 20B, only gentle energy barriers are present in the respective mixed layers, and the respective mixed layers are successively connected by the hole transporting material 1012, host material 1013 and the blocking material 1014 (serving also as the electron transporting material), which is advantageous in movements of a carrier.

Finally, enumerated below are materials suitable as constituent materials such as the hole injecting material, hole transporting material, electron transporting material, electron injecting material, blocking material, luminescent material, and the cathode. However, materials used for an organic luminescent element of the present invention are not limited to the above ones.

As the hole injecting material, porphyrin-based compounds among organic compounds are effective, and include phthalocyanine (abbreviation; H2Pc), copper phthalocyanine (abbreviation; CuPc) and so on. Also, there are materials which are obtained by applying chemical doping to electroconductive high molecular compounds, and include polyethylene dioxythiophene (abbreviation; PEDOT) doped with polystyrene sulfonate (abbreviation; PSS), polyaniline (abbreviation; PAni), polyvinyl carbazole (abbreviation; PVK) and so on. Also, high molecular compounds being insulation bodies are effective in flattening of an anode, and polyimide (abbreviation; PI) is frequently used. Further, inorganic compounds are used, and include super-thin films of aluminium oxide (alumina) as well as thin metal films of gold, platinum and the like.

Most widely used as the hole transporting material are aromatic amine-based compounds (that is, one having a benzene ring-nitrogen coupling). Widely used materials include, in addition to TPD described previously, its derivatives, that is, 4, 4'-bis [N-(1-naphthyl)—N-phenyl-amino]-biphenyl (abbreviation; α-NPD), and star-burst type aromatic amine compounds such as 4, 4', 4"-tris (N, N-diphenyl-amino)-triphenylamine (abbreviation; TDATA), 4, 4', 4"-tris [N-(3-methylphenyl)—N-phenyl-amino]-triphenylamine (abbreviation; MTDATA) and the like.

Metal complexes are frequently used as the electron transporting material, and include, in addition to $Alq_3$ described previously, metal complexes of quinoline skeleton or benzoquinoline skeleton, such as tris (4-methyl-8-quinolinolato) aluminium (abbreviation; $Al(mq_3)$), bis (10-hydroxybenzo [h]-quinolinato) beryllium (abbreviation; $Be(Bq)_3$), and mixed ligand complexes such as bis (2-methyl-8-quinolinolato)-(4-phenylphenolate)-aluminium (abbreviation; BAlq) and the like. Also, among the metal complexes are ones having a thiazole-based ligand and an oxazole-based ligand, such as bis [2-(2-hydroxyphenyl)-benzoxazolato] zinc (abbreviation; $Zn(BOX)_2$), bis [2-(2-hydroxyphenyl)-benzothiazolato] zinc (abbreviation; $Zn(BTZ)_2$) and the like. Further, there are, in addition to metal complexes, oxadiazole derivatives such as 2-(4-biphenylyl)-5-(4-tert-butylphenyl)-1,3,4-oxadiazole (abbreviation; PBD), 1,3-bis[5-(p—tert-butylphenyl)-1,3,4-oxadiazole-2-il] benzene (abbreviation; OXD-7) and the like, triazole derivatives such as 5-(4-biphenylyl)-3-(4-tert-butylphenyl)-4-phenyl-1,2,4-triazole (abbreviation; TAZ), 5-(4-biphenylyl)-3-(4-tert-butylphenyl)-4-(4-ethylphenyl)-1,2,4-triazole (abbreviation; p-EtTAZ) and the like, and phenanthroline derivatives such as bathophenanthroline (abbreviation; BPhen), bathocuproine (abbreviation; BCP) and the like, these derivatives having an electron transporting property.

The above-mentioned electron transporting materials can be used as the electron injecting material. In addition, superthin films of an insulation body made of alkali metal halogenides such as lithium fluoride and the like, alkali metal oxides such as lithium oxide and the like, are frequently used. Also, alkali metal complexes such as lithium acetylacetonate (abbreviation; Li(acac)), 8-quinolinolato-lithium (abbreviation; Liq) and the like are serviceable.

As the blocking material, the above-mentioned BAlq, OXD-7, TAZ, p-EtTAZ, BPhen, BCP and so on are serviceable because they are high in excitation energy level.

As the luminescent material (including ones used as dopant), various kinds of fluorescent dyes are serviceable as well as the above-mentioned metal complexes such as $Alq_3$, $Al(mq)_3$, $Be(Bq)_2$, BAlq, $Zn(BOX)_2$, $Zn(BTZ)_2$ and so on. Also, a triplet light emitting material is serviceable, and composed mainly of a complex, of which central metal is platinum or iridium. Known as a triplet light emitting material are tris (2-phenylpyridine) iridium (abbreviation; $Ir(ppy)_3$), 2, 3, 7, 8, 12, 13, 17, 18-octaethyl-21H, 23H-porphyrin-platinum (abbreviation; PtOEP) and so on.

By combining the above-mentioned materials having the respective functions, respectively, and applying the materials to an organic luminescent element of the present invention, it is possible to manufacture an organic luminescent element, which is lower in drive voltage and longer in life than prior ones.

Embodiment 1

In this embodiment, there is concretely illustrated an element, to which the hole transporting mixed layer shown in FIG. 5 is applied.

First, an indium tin oxide (referred below to as "ITO") is deposited to a film thickness of about 100 nm on a glass substrate 501 with sputtering to provide an anode 502. Subsequently, CuPc being a hole injecting material, and α-NPD being a hole transporting material, are subjected to codeposition at the deposition rate ratio 1:1 to form a hole transporting mixed layer 503, which has a film thickness of 50 nm.

Further, a layer obtained by doping rubrene of 5 wt % on $Alq_3$ is laminated by a film thickness of 10 nm to provide a luminescent layer 504. Finally, $Alq_3$ is deposited to a film thickness of 40 nm to provide an electron transporting layer 505, and Al:Li alloy (Li of 0.5 wt % in mass ratio) is deposited to a film thickness of about 150 nm to provide a cathode 506, so that it is possible to manufacture an organic luminescent element of yellow luminescence resulted from rubrene.

Embodiment 2

In this embodiment, there is concretely illustrated an element, to which the electron transporting mixed layer shown in FIG. 6 is applied.

First, ITO is deposited to a film thickness of about 100 nm on a glass substrate 601 with sputtering to provide an anode 602. Subsequently, α-NPD being a hole transporting material is deposited to a film thickness of 50 nm to thereby form a hole transporting layer 603.

Further, perylene is laminated by a film thickness of 10 nm to provide a luminescent layer 604, and then BPhen being an electron transporting material, and $Alq_3$ being an electron injecting material, are subjected to codeposition at the deposition rate ratio 1:1 to form an electron transporting mixed layer 605, which has a film thickness of 40 nm. Finally, Al:Li alloy (Li of 0.5 wt % in mass ratio) is deposited to a film thickness of about 150 nm to provide a cathode 606, so that it is possible to manufacture an organic luminescent element of blue luminescence resulted from perylene.

Embodiment 3

In this embodiment, there is concretely illustrated an organic luminescent element obtained by inserting between an anode 2402 and an organic compound layer 2403, a hole injecting region, which is composed of a hole injecting material, in the organic luminescent element shown in FIG. 24.

First, a glass substrate 2401 is prepared, on which ITO is deposited to a film thickness of about 100 nm with sputtering to form an anode 2402. The glass substrate 2401 having the anode 2402 is carried into a vacuum chamber as shown in FIGS. 31A and 31B. In the embodiment, four kinds of materials (of which three kinds are organic compounds and one kind is a metal forming a cathode) are deposited, and so four deposition sources are necessary.

First, CuPc being a hole injecting material is deposited to a film thickness of 20 nm, and without an interval from a point of time when the film thickness of 20 nm is reached and deposition of CuPc is terminated, deposition of α-NPD being a hole transporting material is started at the deposition rate 0.3 nm/sec. The reason why the deposition is started without such interval is to prevent formation of an impurity layer described above.

After a hole transporting layer 2405 composed of only α-NPD is formed to have a film thickness of 30 nm, deposition of $Alq_3$ being an electron transporting material is started at the deposition rate 0.3 nm/sec while the deposition rate of α-NPD remains fixed at 0.3 nm/sec. That is, a mixed region 2407 where the ratio of α-NPD and $Alq_3$ is 1:1 is formed by codeposition.

After the mixed region 2407 reaches a film thickness of 30 nm, deposition is terminated for α-NPD and only $Alq_3$ continues to be deposited to form an electron transporting region 2406, which will have a film thickness of 40 nm. Finally, an Al:Li alloy is deposited to a film thickness of about 150 nm as a cathode to obtain an organic luminescent element of green luminescence resulted from $Alq_3$.

Embodiment 4

Figure 29A:
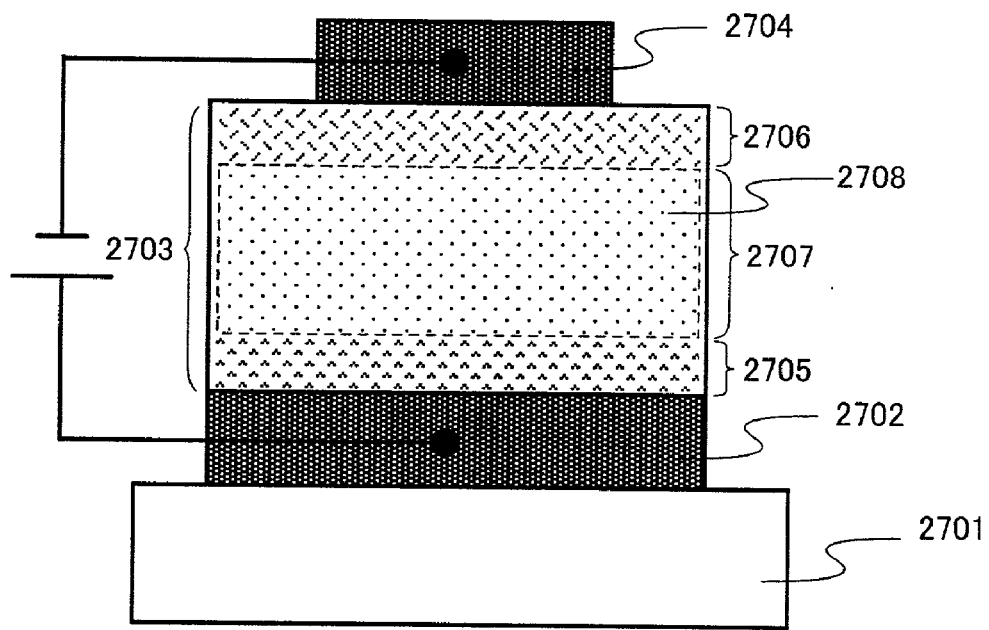
FIGS. 29A and 29B are views showing the structure of an organic luminescent element.

In this embodiment, there is concretely illustrated an organic luminescent element obtained by inserting between an anode 2702 and an organic compound layer 2703, a hole injecting region, which is composed of a hole injecting material, in an organic luminescent element shown in FIG. 29A.

First, a glass substrate 2701 is prepared, on which ITO is deposited to a film thickness of about 100 nm with sputtering to form an anode 2702. The glass substrate 2701 having the anode 2702 is carried into a vacuum chamber as shown in FIGS. 32A and 32B. In the embodiment, five kinds of materials (of which four kinds are organic compounds and one kind is a metal forming a cathode) are deposited, and so five deposition sources are necessary.

First, CuPc being a hole injecting material is deposited to a film thickness of 20 nm, and without an interval from a point of time when the film thickness of 20 nm is reached and deposition of CuPc is terminated, deposition of α-NPD being a hole transporting material is started at the deposition rate 0.3 nm/sec. The reason why the deposition is started without such interval is to prevent formation of an impurity layer described above.

After a hole transporting layer 2705 composed of only α-NPD is formed to be 30 nm in a film thickness, deposition of $Alq_3$ being an electron transporting material is started at the deposition rate 0.3 nm/sec while the deposition rate of α-NPD remains fixed at 0.3 nm/sec. That is, a mixed region 2707 where the ratio of α-NPD and $Alq_3$ is 1:1 is formed by codeposition. At the same time, a fluorescent dye 4-(dicyanomethylene)-2-methyl-6-(p-dimethylaminostyryl)-4H-pyran (abbreviation; DCM) is added as a luminescent material 2708. The deposition rate is controlled so that the ratio is made α-NPD: $Alq_3$:DCM=50:50:1.

After the mixed region 2707 reaches a film thickness of 30 nm, deposition is terminated for α-NPD and DCM, and only $Alq_3$ continues to be deposited to form an electron transporting region 2706, which has a film thickness of 40 nm. Finally, an Al:Li alloy is deposited to a film thickness of about 150 nm as a cathode to obtain an organic luminescent element of red luminescence resulted from DCM.

Embodiment 5

Figure 29B:
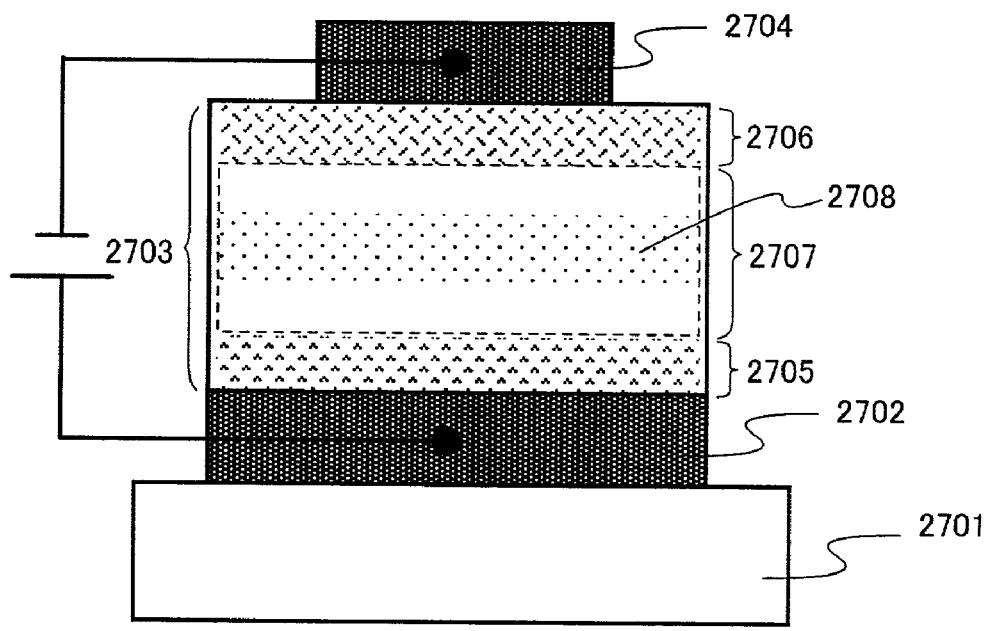

In this embodiment, there is concretely illustrated an organic luminescent element shown in FIG. 29B.

First, a glass substrate 2701 is prepared, on which ITO is deposited to a film thickness of about 100 nm with sputtering to form an anode 2702. The glass substrate 2701 having the anode 2702 is carried into a vacuum vessel as shown in FIGS. 32A and 32B. In the embodiment, four kinds of materials (of which three kinds are organic compounds and one kind is a metal forming a cathode) are deposited, and so four deposition sources are necessary.

After a hole transporting layer 2705 composed of only α-NPD being a hole transporting material is formed to have a film thickness of 40 nm, deposition of $Alq_3$ being an electron transporting material is started at the deposition rate 0.3 nm/sec while the deposition rate of α-NPD remains fixed at 0.3 nm/sec. That is, a mixed region 2707 where the ratio of α-NPD and $Alq_3$ is 1:1 is formed by codeposition.

The mixed region 2707 is formed to have a film thickness of 30 nm, and at this time an intermediate region of a 10 nm film thickness (that is, a portion 10 nm to 20 nm in the mixed region 2707 of a 30 nm film thickness) in the mixed region 2707 is doped at the ratio of 1 wt % with a fluorescent dye 4-(dicyanomethylene)-2-methyl-6-(p-dimethylaminostyryl)-4H-pyran (abbreviation; DCM) as a luminescent material 2708.

After the mixed region 2707 reaches a film thickness of 30 nm, deposition is terminated for α-NPD, and only $Alq_3$ continues to be deposited to form an electron transporting region 2706, which has a film thickness of 40 nm. Finally, an Al:Li alloy is deposited to a film thickness of about 150 nm as a cathode to obtain an organic luminescent element of red luminescence resulted from DCM.

Embodiment 6

Figure 26B:
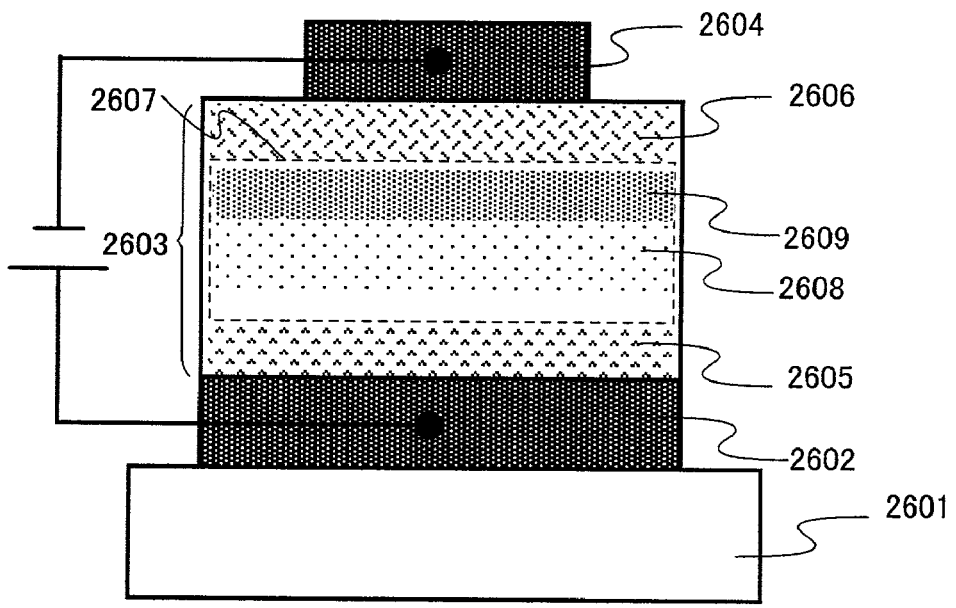
Figure 27:
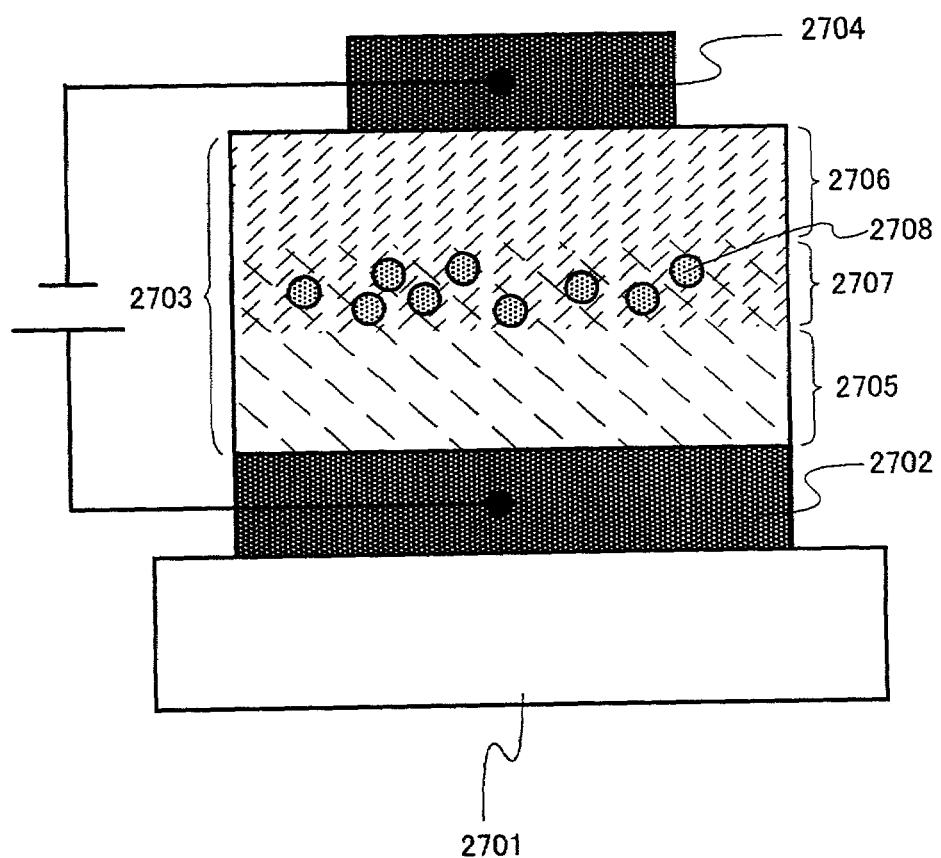
FIG. 27 is a view showing the structure of an organic luminescent element.
Figure 28:
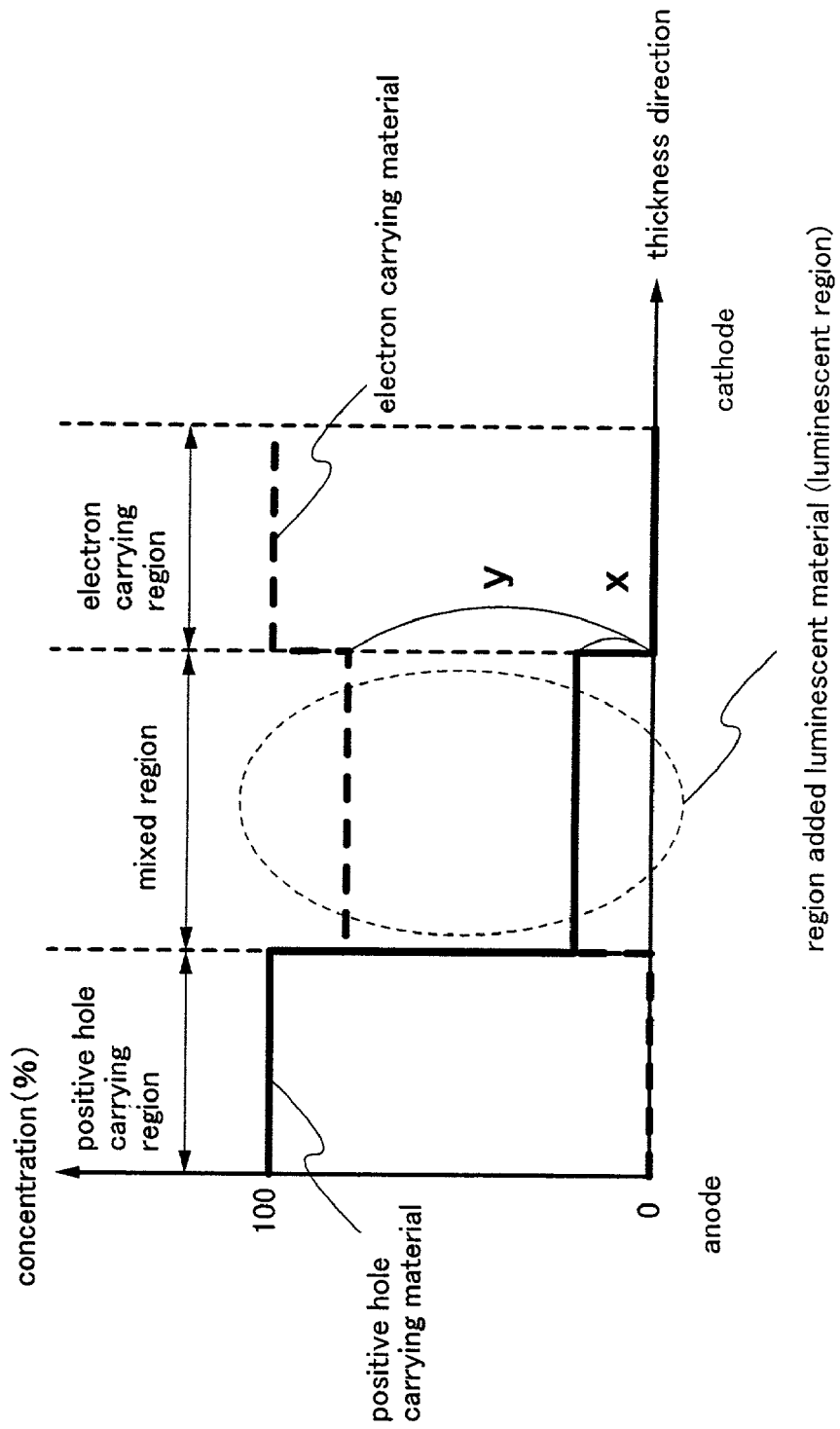
FIG. 28 is a view showing a concentration profile.

In this embodiment, there is concretely illustrated an element obtained by applying a concentration gradient to that element, to which the mixed region shown in FIG. 26B has been applied. In addition, in order to form the concentration gradient, the apparatus shown in FIG. 11 is used to manufacture the element. In this embodiment, three kinds of deposition sources are necessary for a hole transporting material, electron transporting material and a luminescent material.

First, ITO is deposited on a glass substrate 2601 to a film thickness having a 20 nm film thickness about 100 nm with sputtering to form an anode 2602. Subsequently, α-NPD being an hole transporting material is deposited to a film thickness of 40 nm to form a hole transporting region 2605.

Further, as described with respect to the embodiment, a mixed region 2607 composed of α-NPD and $Alq_3$ and having a concentration gradient is deposited to a film thickness of 20 nm by gradually opening a shutter for the deposition source of the electron transporting material ($Alq_3$ in this embodiment) at the same time when gradually closing a shutter for the deposition source of the hole transporting material (α-NPD). At this time, an intermediate region of 10 nm in the mixed region 2607 of 20 nm in thickness is doped at a ratio of 5 wt % with rubrene as a luminescent material 2608.

After the mixed region reaches 20 nm of a film thickness, an electron transporting region 2606 composed of $Alq_3$ is formed in a state, in which only the shutter for the deposition source of the electron transporting material ($Alq_3$) is opened. Finally, an Al:Li alloy (Li of 0.5 wt % in weight ratio) is deposited to a film thickness of about 150 nm as a cathode 2604 to obtain an organic luminescent element of yellow luminescence resulted from rubrene.

Embodiment 7

In this embodiment, there is concretely illustrated an organic luminescent element obtained by inserting between the anode 2602 and the organic compound layer 2603, a hole injecting region, which is composed of a hole injecting material, and inserting between a cathode 2604 and the organic compound layer 2603, an electron injecting region, which is composed of an electron injecting material, in the organic luminescent element shown in FIG. 26B.

First, a glass substrate 2601 is prepared, on which ITO is deposited to a film thickness of about 100 nm with sputtering to form an anode 2602. The glass substrate 2601 having the anode 2602 is carried into a vacuum chamber as shown in FIGS. 31A and 31B. In the embodiment, seven kinds of materials (of which six kinds are organic compounds and one kind is a metal forming a cathode) are deposited, and so seven deposition sources are necessary.

First, CuPc being a hole injecting material is deposited to a film thickness of 20 nm, and without an interval from a point of time when 20 nm is reached and deposition of CuPc is terminated, deposition of TPD being a hole transporting material is started at the deposition rate 0.2 nm/sec. The reason why the deposition is started without such interval is to prevent formation of an impurity layer described above.

After a hole transporting layer 2605 composed of only TPD is formed to be 30 nm in thickness, deposition of $BeBq_2$ being an electron transporting material is also started at the deposition rate 0.8 nm/sec while the deposition rate of TPD remains fixed at 0.2 nm/sec. That is, a mixed region 2607 where the ratio of TPD and $BeBq_2$ is 1:4 is formed by codeposition.

The mixed region 2607 is formed to have a film thickness of 30 nm, and at this time an intermediate region of 10 nm (that is, a portion of 10 nm to 20 nm in the mixed region 2607 of 30 nm) in the mixed region 2607 is doped at the ratio of 5 wt % with rubrene as a fluorescent dye as the luminescent material 2608. Also, a last region of 10 nm (that is, a portion of 20 nm to 30 nm in the mixed region of 30 nm) in the mixed region 2607 is doped with BCP as a blocking material 2609. The deposition rate of the respective materials at the time of doping with BCP is TPD:$BeBq_2$:BCP =1:4:3 [nm/s].

After the mixed region 2607 reaches 30 nm of thickness, deposition of TPD and BCP is terminated, and only $BeBq_2$ continues to be deposited to form an electron transporting region 2606, which has a film thickness of 40 nm. Without an interval from a point of time when deposition of $BeBq_2$ is terminated, deposition of Li(acac) being an electron injecting material is started to have a film thickness of about 2 nm. The reason why the deposition is started without such interval is to prevent formation of an impurity layer described above.

Finally, aluminum is deposited to a film thickness of about 150 nm as a cathode to obtain an organic luminescent element of yellow luminescence resulted from rubrene.

Embodiment 8

Figure 30A:
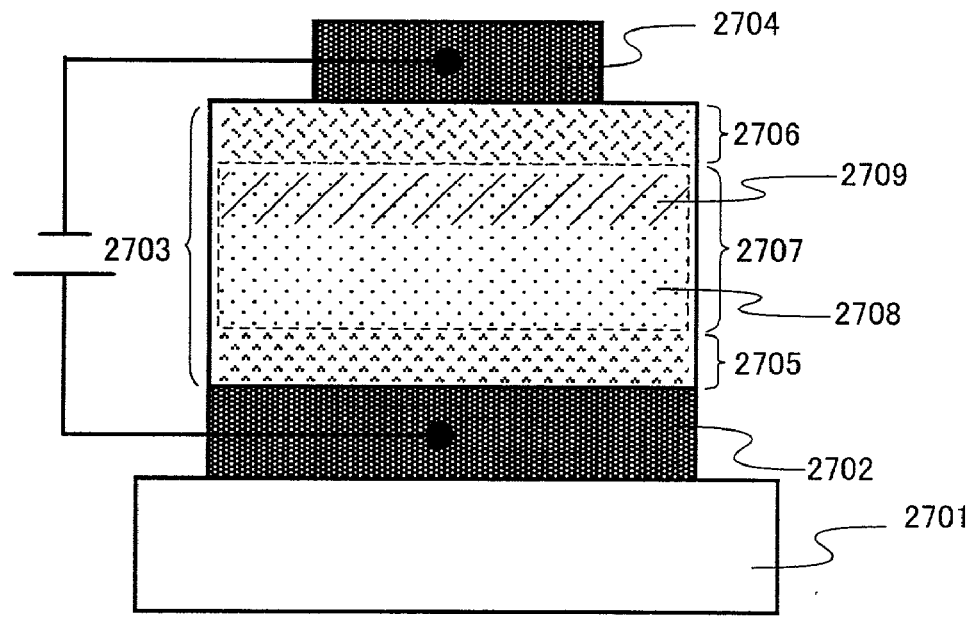
FIGS. 30A and 30B are views showing the structure of an organic luminescent element.
Figure 30B:
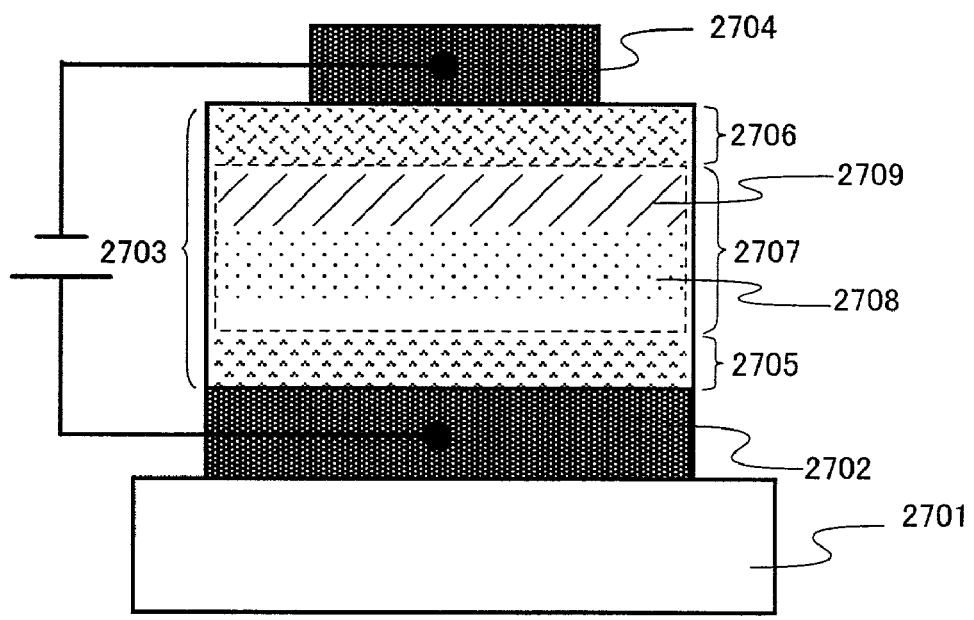

In this embodiment, there is concretely illustrated an organic luminescent element shown in FIG. 30B.

First, a glass substrate 2701 is prepared, on which ITO is deposited to about 100 nm with sputtering to form an anode 2702. The glass substrate 2701 having the anode 2702 is carried into a vacuum chamber as shown in FIGS. 32A and 32B. In the embodiment, five kinds of materials (of which four kinds are organic compounds and one kind is a metal forming a cathode) are deposited, and so five deposition sources are necessary.

After a hole transporting layer 2705 composed of only MTDATA being a hole transporting material is formed to have a film thickness of 40 nm, deposition of PBD being an electron transporting material is started at the deposition rate 0.3 nm/sec while the deposition rate of MTDATA remains fixed at 0.3 nm/sec. That is, a mixed region 2707 where the ratio of MTDATA and PBD is 1:1 is formed by codeposition.

The mixed region 2707 is formed to have a thickness of 30 nm, and at this time perylene as a fluorescent dye is added as a luminescent material 2708 to an intermediate region of 10 nm (that is, a portion of 10 nm to 20 nm in the mixed region 2707 of 30 nm) in the mixed region 2707, the deposition rate being controlled so that the ratio of such addition is MTDATA:PBD:perylene=4:16:1. Also, BCP is added as a blocking material 2709 to a last region of 10 nm (that is, a portion of 20 nm to 30 nm in the mixed region of 30 nm) in the mixed region 2707, the ratio being MTDATA:PBD:BCP=1:4:5.

After the mixed region reaches 30 nm of thickness, deposition of MTDATA and BCP is terminated, and only PBD continues to be deposited to form an electron transporting region 2706, which has a thickness of 40 nm. Finally, Al:Li alloy is deposited to about 150 nm as a cathode to obtain an organic luminescent element of blue luminescence resulted from perylene.

Embodiment 9

In this embodiment, there is concretely illustrated an element, to which a hole transporting mixed layer, a bipolar-natured mixed layer, and an electron transporting mixed layer shown in FIG. 8 have been combined and applied. In addition, in order to form concentration gradients (Graph 810 in FIG. 8) in this embodiment, the deposition sources with shutters shown in FIG. 11 are used.

First, ITO is deposited on a glass substrate 801 to about 100 nm with sputtering to form an anode 802. Subsequently, a hole transporting mixed layer 803 composed of CuPc being a hole injecting material 811 and α-NPD being a hole transporting material 812 are deposited to 40 nm. At this time, the concentration gradients as shown in Graph 810 are formed by opening and closing of shutters.

At this time, a bipolar-natured mixed layer 804 having concentration gradients is deposited to 20 nm by gradually opening a shutter for the deposition source of Alq$_3$ being the electron transporting material 813 at the same time when gradually closing a shutter for the deposition source of α-NPD. At this time, an intermediate region 807 of 10 nm in the bipolar-natured mixed layer 804 of 20 nm is doped at the ratio of 1 wt % with 4-(dicyanomethylene)-2-methyl-6-(p-dimethylaminostyryl)-4H-pyran (abbreviation; DCM) as a luminescent material 815.

After the bipolar-natured mixed layer 804 reaches 20 nm of thickness, Alq$_3$ is deposited to 35 nm in a state, in which only the shutter for Alq$_3$ is opened. By gradually opening a shutter for the deposition source of Li(acac) being an electron injecting material 814 at the same time when gradually closing a shutter for the deposition source of Alq$_3$ in a last region 5 nm, an electron transporting mixed layer 805 of 40 nm in total is formed. That is, the concentration gradient for Li(acac) is set steep (while an electron injecting material 814 is shown in Graph 810 as being constant in inclination, the last portion in this embodiment rises abruptly).

Finally, Al is deposited as a cathode 806 to about 150 nm to obtain an organic luminescent element of red luminescence resulted from DCM.

Embodiment 10

Figure 33:
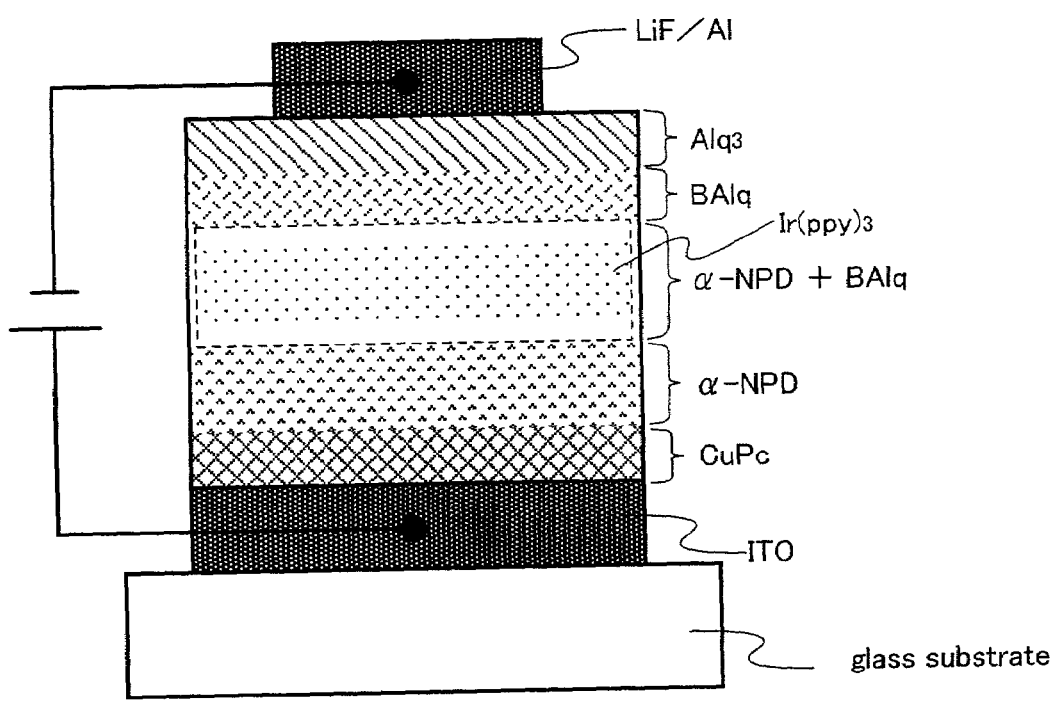
FIG. 33 is a view showing the structure of an organic luminescent element.

In this embodiment, there is concretely illustrated an example of an organic luminescent element obtained by inserting between the anode 2702 and the organic compound layer 2703, a hole injecting region, which is composed of a hole injecting material, inserting between a cathode 2704 and the organic compound layer, an electron injecting region, which is composed of an electron injecting material, and applying a triplet light emitting material as the luminescent material in the organic luminescent element shown in FIG. 29B. Such element structure is shown in FIG. 33.

First, a glass substrate is prepared, on which ITO is deposited to about 100 nm with sputtering to form ITO (anode). The glass substrate having ITO is carried into a vacuum chamber as shown in FIGS. 32A and 32B. In the embodiment, seven kinds of materials (of which five kinds are organic compounds and two kinds are an inorganic material forming a cathode) are deposited, and so seven deposition sources are necessary.

First, CuPc being a hole injecting material is deposited to 20 nm, and without an interval from a point of time when 20 nm is reached and deposition of CuPc is terminated, deposition of α-NPD being a hole transporting material is started at the deposition rate 0.3 nm/sec. The reason why the deposition is started without such interval is to prevent formation of an impurity layer described above.

After a hole transporting layer composed of only α-NPD is formed to be 30 nm in thickness, deposition of BAlq being an electron transporting material is also started at the deposition rate 0.3 nm/sec while the deposition rate of α-NPD remains fixed at 0.3 nm/sec. That is, a mixed region (α-NPD +BAlq) where the ratio of α-NPD and BAlq is 1:1 is formed by codeposition.

The mixed region is formed to have a thickness of 20 nm, and at this time Ir(ppy)$_3$ being a triplet light emitting material is added as a luminescent material to an intermediate region of 10 nm (that is, a portion of 5 nm to 15 nm in the mixed region of 20 nm) in the mixed region. The ratio of such addition is α-NPD:BAlq:Ir(ppy)$_3$=50:50:7.

After the mixed region reaches 20 nm of thickness, deposition of α-NPD and Ir(ppy)$_3$ is terminated, and only BAlq continues to be deposited to form an electron transporting region, which will has a thickness of 20 nm. Without an interval from a point of time when deposition of BAlq is terminated, deposition of Alq$_3$ being an electron injecting material is started to about 30 nm. The reason why the deposition is started without such interval is to prevent formation of an impurity layer described above.

Finally, LiF is deposited to about 1 nm and Al is deposited to about 150 nm to form a cathode and to obtain a triplet light emitting material of green luminescence resulted from Ir(ppy)$_3$.

Embodiment 11

In this embodiment, there is concretely illustrated an element obtained by applying the present invention to a triplet light emitting diode shown in FIG. 9. The element structure is shown in FIG. 10. In addition, in order to form concentration gradients (Graph 1010 in FIG. 10) in this embodiment, the deposition sources with shutters shown in FIG. 11 are used.

First, ITO is deposited on a glass substrate 1001 to about 100 nm with sputtering to form an anode 1002. Subsequently, a hole transporting mixed layer 1003 composed of CuPc being a hole injecting material 1011 and α-NPD being a hole transporting material 1012 are deposited to 40 nm. At this time, the concentration gradients as shown in Graph 1010 are formed by opening and closing of shutters.

Consecutively, a bipolar-natured mixed layer 1004 composed of α-NPD and CBP and having concentration gradients is formed to a thickness of 20 nm by gradually decreasing the deposition rate of α-NPD and increasing the deposition rate of 4-4'-N, N'-dicarbazole-biphenyl (referred below to as "CBP"), which is a host material 1013 of a triplet light emitting material. This time a blocking mixed layer 1005 composed of CBP and BCP and having concentration gradients is formed by decreasing the deposition rate of CBP and increasing the deposition rate of BCP, which is a blocking material 1014. Thus the blocking mixed layer has a film thickness of 10 nm.

Since this embodiment relates to a triplet light emitting diode, tris (2-phenylpyridine) iridium (referred below to as Ir(ppy)$_3$), which is the triplet light emitting material 1016, is doped during the formation of the bipolar-natured mixed layer 1004 and the blocking mixed layer 1005. A region where CBP being the host material is high in concentration, that is, a region near a boundary between the bipolar-natured mixed layer 1004 and the blocking mixed layer 1005 is most suitable as a doped region 1008. In this embodiment, a region of ±5 nm about the boundary, that is, a region having a width of 10 nm in total is made the doped region 1008 where doping of 6 wt % is effected.

Further, the electron transporting mixed layer 1006 is composed of BCP and $Alq_3$, which are high in electron transporting capacity. Concentration gradients are formed such that BCP decreases in concentration as it is distant from an anode, and $Alq_3$ conversely increases in concentration as it is distant from the anode. That is, in this case, BCP functions as a blocking material and an electron transporting material, and $Alq_3$ functions as the electron injecting material 1015. The electron transporting mixed layer 1006 has a film thickness' of 40 nm.

Finally, Al:Li alloy (Li being 0.5 wt % by weight) is deposited to about 150 nm as a cathode 1007 to enable forming an organic luminescent element presenting green triplet luminescence resulted from $Ir(ppy)_3$.

Embodiment 12

This embodiment describes a luminescent device that includes an organic luminescent element according to the present invention. FIG. 12A is a sectional view of an active matrix luminescent device that uses an organic luminescent element of the present invention. A thin film transistor (hereinafter referred to as TFT) is used here as an active element, but the active element may be a MOS transistor.

The TFT shown as an example is a top gate TFT (planar TFT, to be specific), but a bottom gate TFT (typically a reverse stagger TFT) may be used instead.

In FIG. 12A, 1201 denotes a substrate. The substrate used here can transmit visible light. Specifically, a glass substrate, a quartz substrate, a crystal glass substrate, or a plastic substrate (including a plastic film) can be used. The substrate 1201 refers to the substrate plus an insulating film formed on the surface of the substrate.

On the substrate 1201, a pixel portion 1211 and a driving circuit 1212 are provided. The pixel portion 1211 will be described first.

The pixel portion 1211 is a region for displaying an image. A plurality of pixels are placed on the substrate, and each pixel is provided with a TFT 1202 for controlling a current flowing in the organic luminescent element (hereinafter referred to as current controlling TFT), a pixel electrode (anode) 1203, an organic compound layer 1204, and a cathode 1205. Although only the current controlling TFT is shown in FIG. 12A, each pixel has a TFT for controlling a voltage applied to a gate of the current controlling TFT (hereinafter referred to as switching TFT).

The current controlling TFT 1202 here is preferably a p-channel TFT. Though an n-channel TFT may be used instead, a p-channel TFT as the current controlling TFT is more successful in reducing current consumption if the current controlling TFT is connected to the anode of the organic luminescent element as shown in FIG. 12A. Note that, the switching TFT may be formed by either an n-channel TFT or a p-channel TFT.

A drain of the current controlling TFT 1202 is electrically connected to the pixel electrode 1203. In this embodiment, a conductive material having a work function of 4.5 to 5.5 eV is used as the material of the pixel electrode 1203, and therefore the pixel electrode 1203 functions as the anode of the organic luminescent element. A light-transmissive material, typically, indium oxide, tin oxide, zinc oxide, or a compound of these (ITO, for example), is used for the pixel electrode 1203. On the pixel electrode 1203, the organic compound layer 1204 is formed.

On the organic compound layer 1204, the cathode 1205 is provided. The material of the cathode 1205 is desirably a conductive material having a work function of 2.5 to 3.5 eV. Typically, the cathode 1205 is formed from a conductive film containing an alkaline metal element or an alkaline-earth metal element, or from a conductive film containing aluminum, or from a laminate obtained by layering an aluminum or silver film on one of the above conductive films.

A layer composed of the pixel electrode 1203, the organic compound layer 1204, and the cathode 1205 is covered with a protective film 1206. The protective film 1206 is provided to protect the organic luminescent element from oxygen and moisture. Materials usable for the protective film 1206 include silicon nitride, silicon oxynitride, aluminum oxide, tantalum oxide, and carbon (specifically, diamond-like carbon).

Next, the driving circuit 1212 will be described. The driving circuit 1212 is a region for controlling timing of signals (gate signals and data signals) to be sent to the pixel portion 1211, and is provided with a shift register, a buffer, and a latch, as well as an analog switch (transfer gate) or level shifter. In FIG. 12A, the basic unit of these circuits is a CMOS circuit composed of an n-channel TFT 1207 and a p-channel TFT 1208.

Known circuit structures can be applied to the shift register, the buffer, the latch, and the analog switch (transfer gate) or level shifter. Although the pixel portion 1211 and the driving circuit 1212 are provided on the same substrate in FIG. 12A, IC or LSI may be electrically connected to the substrate instead of placing the driving circuit 1212 on the substrate.

The pixel electrode (anode) 1203 is electrically connected to the current controlling TFT 1202 in FIG. 12A but the cathode may be connected to the current controlling TFT instead. In this case, the pixel electrode is formed from the material of the cathode 1205 whereas the cathode is formed from the material of the pixel electrode (anode) 1203. The current controlling TFT in this case is preferably an n-channel TFT.

The luminescent device shown in FIG. 12A is manufactured by a process in which formation of the pixel electrode 1203 precedes to formation of a wiring line 1209. However, this process could roughen the surface of the pixel electrode 1203. The roughened surface of the pixel electrode 1203 may degrade characteristic of the organic luminescent element since it is a current-driven type element.

Then the pixel electrode 1203 is formed after forming the wiring line 1209 to obtain a luminescent device shown in FIG. 12B. In this case, injection of current from the pixel electrode 1203 can be improved compared to the structure of FIG. 12A.

In FIGS. 12A and 12B, a forward-tapered bank structure 1210 separates the pixels placed in the pixel portion 1211 from one another. If this bank structure is reverse-tapered, a contact between the bank structure and the pixel electrode can be avoided. An example thereof is shown in FIG. 34.

Figure 34:
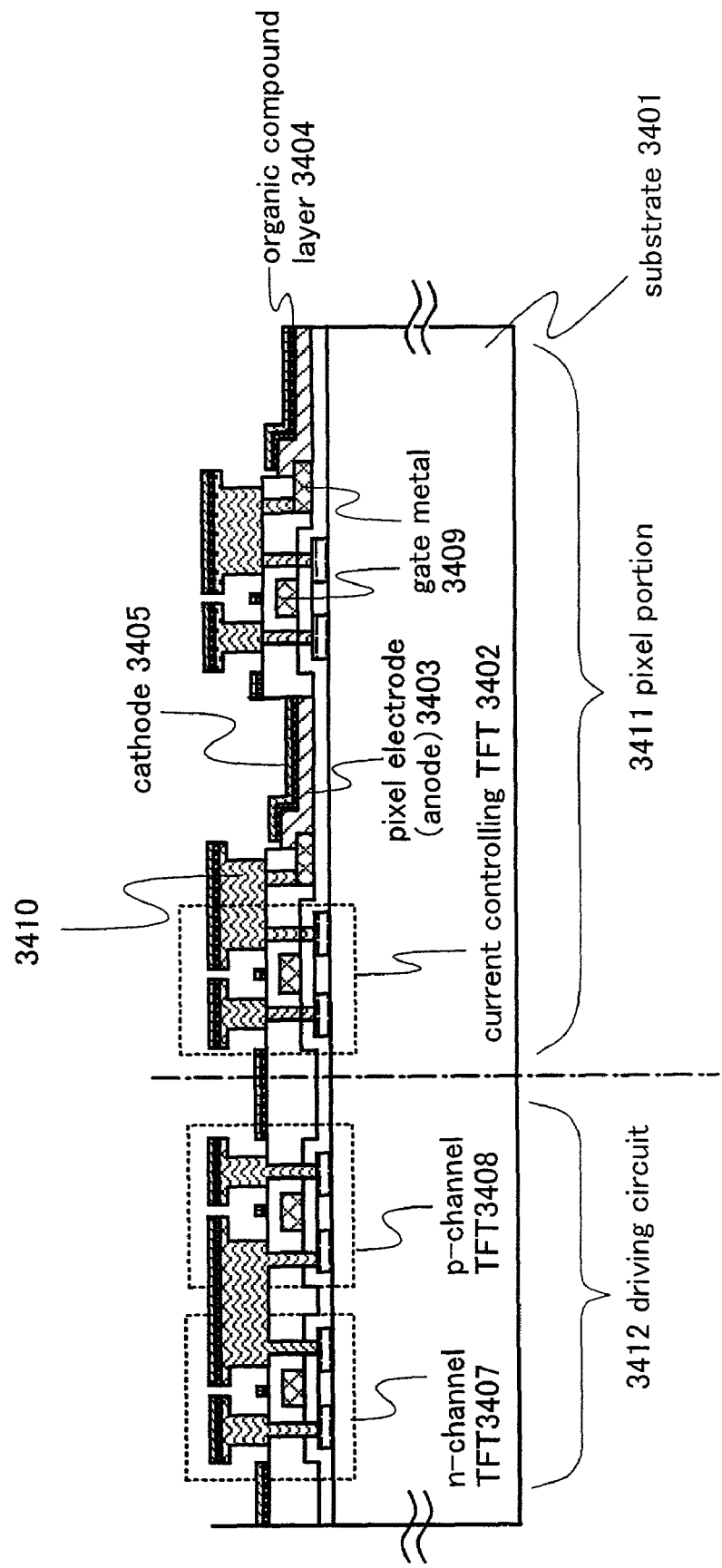
FIG. 34 is a view showing the sectional construction of a luminescent device.

In FIG. 34, a wiring line also serves as a separation portion, forming a wiring line and separation portion 3410. The shape of the wiring line and separation portion 3410 shown in FIG. 34 (namely, a structure with eaves) is obtained by layering a metal that constitutes the wiring line and a material lower in etch rate than the metal (a metal nitride, for example) and then etching the laminate. This shape can prevent short circuit between a cathode 3405 and a pixel electrode 3403 or the wiring line. Unlike a usual active matrix luminescent device, the cathode 3405 on the pixel is striped in the device of FIG. 34 (similar to a cathode in a passive matrix device).

Figure 13A:
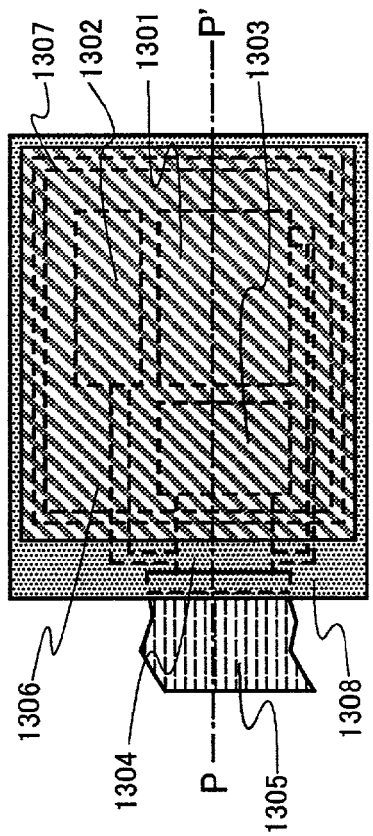
FIGS. 13A and 13B are views showing the top surface construction and sectional construction of a luminescent device.
Figure 13B:
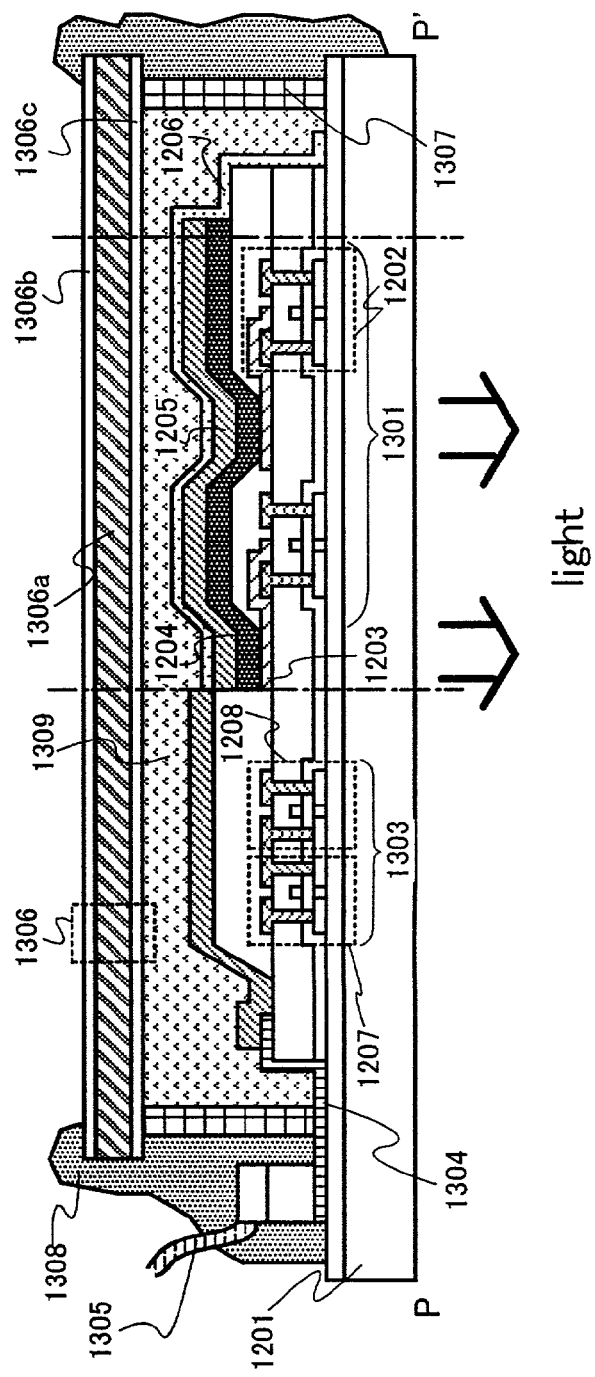

FIGS. 13(a) and 13(b) show the exterior of the active matrix luminescent device illustrated in FIG. 12B. FIG. 13A is a top view thereof and FIG. 13B is a sectional view taken along the line P-P' of FIG. 13A. The symbols in FIGS. 12 A and 12B are used in FIGS. 13A and 13B.

In FIG. 13A, 1301 denotes a pixel portion, 1302 denotes a gate signal side driving circuit, and 1303 denotes a data signal side driving circuit. Signals to be sent to the gate signal side driving circuit 1302 and the data signal side driving circuit 1303 are inputted from a TAB (tape automated bonding) tape 1305 through an input wiring line 1304. Though not shown in the drawing, the TAB tape 1305 may be replaced by a TCP (tape carrier package) that is obtained by providing a TAB tape with an IC (integrated circuit).

Denoted by 1306 is the cover member that is provided in an upper part of the luminescent element shown in FIG. 12B, and is bonded with a seal member 1307 formed of a resin. The cover member 1306 may be any material as long as it does not transmit oxygen and water. In this embodiment, as shown in FIG. 13B, the cover member 1306 is composed of a plastic member 1306a and carbon films (specifically, diamond-like carbon films) 1306b and 1306c that are formed on the front and back of the plastic member 1306a, respectively.

As shown in FIG. 13B, the seal member 1307 is covered with a sealing member 1308 made of a resin so that the organic luminescent element is completely sealed in an airtight space 1309. The airtight space 1309 is filled with inert gas (typically, nitrogen gas or noble gas), a resin, or inert liquid (for example, liquid fluorocarbon typical example of which is perfluoro alkane). It is also effective to put an absorbent or deoxidant in the space.

A polarizing plate may be provided on a display face (the face on which an image is displayed to be observed by a viewer) of the luminescent device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound layer from being reflected at the polarizing plate and traveling backward.

Any of organic luminescent elements according to the present invention can be used as the organic luminescent element included in the luminescent device of this embodiment.

Embodiment 13

Figure 35:
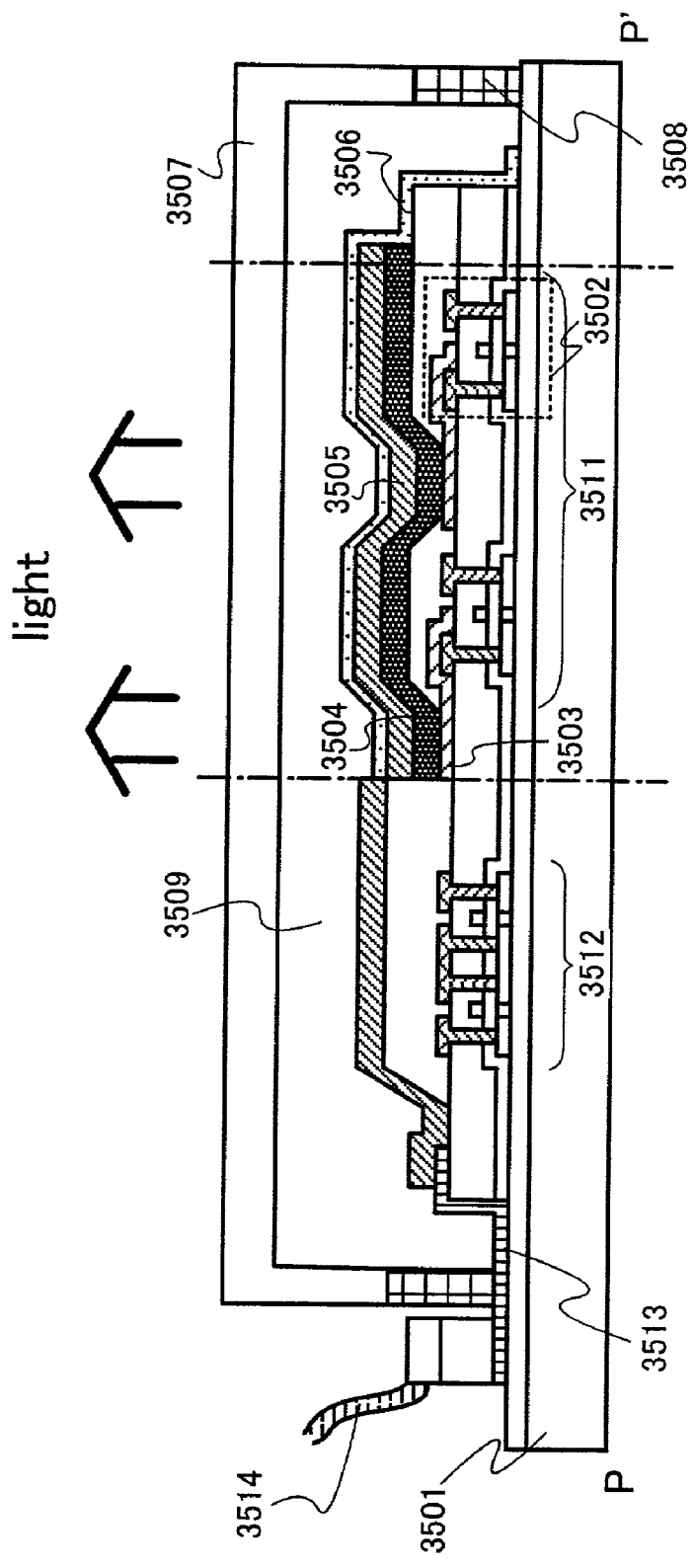
FIG. 35 is a view showing the sectional construction of a luminescent device.

This embodiment shows an active matrix luminescent device as an example of a luminescent device that includes an organic luminescent element according to the present invention. Unlike Embodiment 12, in the luminescent device of this embodiment, light is taken out from the opposite side of a substrate on which an active element is formed (hereinafter referred to as upward emission). FIG. 35 is a sectional view thereof.

A thin film transistor (hereinafter referred to as TFT) is used here as the active element, but the active element may be a MOS transistor. The TFT shown as an example is a top gate TFT (planar TFT, to be specific), but a bottom gate TFT (typically a reverse stagger TFT) may be used instead.

A substrate 3501, a current controlling TFT 3502 that is formed in a pixel portion, and a driving circuit 3512 of this embodiment have the same structure as those of Embodiment 12.

A first electrode 3503, which is connected to a drain of the current controlling TFT 3502, is used as an anode in this embodiment, and therefore is formed preferably from a conductive material having a large work function. Typical examples of the conductive material include metals such as nickel, palladium, tungsten, gold, and silver. In this embodiment, the first electrode 3503 desirably does not transmit light. More desirably, the electrode is formed from a material that is highly reflective of light.

On the first electrode 3503, an organic compound layer 3504 is formed. Provided on the organic compound layer 3504 is a second electrode 3505, which serves as a cathode in this embodiment. Accordingly, the material of the second electrode 3505 is desirably a conductive material having a work function of 2.5 to 3.5 eV. Typically, a conductive film containing an alkaline metal element or an alkaline-earth metal element, or a conductive film containing aluminum, or a laminate obtained by layering an aluminum or silver film on one of the above conductive films is used. Since an upward emission luminescent device is used in this embodiment, light-transmissive is indispensable for the material of the second electrode 3505. Therefore, when used for the second electrode, the metal is preferably formed into a very thin film about 20 nm in thickness.

A layer composed of the first electrode 3503, the organic compound layer 3504, and the second electrode 3505, are covered with a protective film 3506. The protective film 3506 is provided to protect the organic luminescent element from oxygen and moisture. In this embodiment, any material can be used for the protective film as long as it transmits light.

The first electrode (anode) 3503 is electrically connected to the current controlling TFT 3502 in FIG. 35 but the cathode may be connected to the current controlling TFT instead. In this case, the first electrode may be formed from the material of the cathode whereas the second electrode may be formed from the material of the anode. The current controlling TFT in this case is preferably an n-channel TFT.

Denoted by 3507 is a cover member and is bonded with a seal member 3508 formed of a resin. The cover member 3507 may be any material as long as it transmits light but not oxygen and water. In this embodiment, glass is used. An airtight space 3509 is filled with inert gas (typically, nitrogen gas or noble gas), a resin, or inert liquid (for example, liquid fluorocarbon typical example of which is perfluoro alkane). It is also effective to put an absorbent or deoxidant in the space.

Signals to be sent to the gate signal side driving circuit and the data signal side driving circuit are inputted from a TAB (tape automated bonding) tape 3514 through an input wiring line 3513. Though not shown in the drawing, the TAB tape 3514 may be replaced by a TCP (tape carrier package) that is obtained by providing a TAB tape with an IC (integrated circuit).

A polarizing plate may be provided on a display face (the face on which an image is displayed to be observed by a viewer) of the luminescent device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound layer from being reflected at the polarizing plate and traveling backward.

Any of organic luminescent elements according to the present invention can be used as the organic luminescent element included in the luminescent device of this embodiment.

Embodiment 14

Figure 14A:
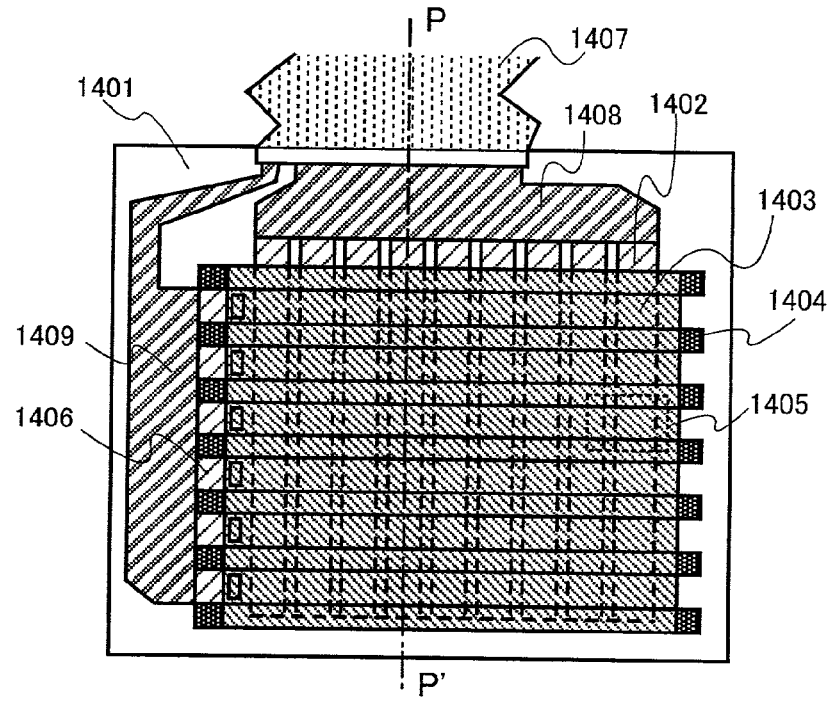
FIGS. 14A to 14C are views showing the top surface construction and sectional construction of a luminescent device.
Figure 14B:
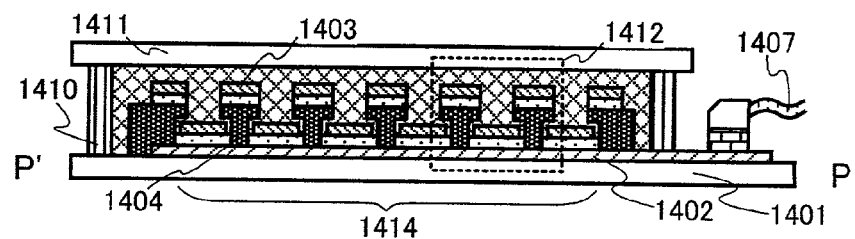

This embodiment shows a passive matrix luminescent device as an example of a luminescent device that includes an organic luminescent element disclosed in the present invention. FIG. 14A is a top view thereof and FIG. 14B is a sectional view taken along the line P-P' of FIG. 14A.

In FIG. 14A, denoted by 1401 is a substrate, which is formed of a plastic material here. The plastic material, which can be used, is a plate or film of polyimide, polyamide, an acrylic resin, an epoxy resin, PES (polyethylene sulfile), PC (polycarbonate), PET (polyethylene terephthalate), or PEN (polyethylene naphthalate).

1402 denotes scanning lines (anodes) formed from a conductive oxide film. In this embodiment, the conductive oxide film is obtained by doping zinc oxide with gallium oxide. 1403 denotes data lines (cathodes) formed from a metal film, a bismuth film, in this embodiment. 1404 denotes banks formed of an acrylic resin. The banks function as partition walls that separate the data lines 1403 from one another. A plurality of the scanning lines 1402 and a plurality of the data lines 1403 respectively form stripe patterns and the patterns cross each other at right angles. Though not shown in FIG. 14A, an organic compound layer is sandwiched between the scanning lines 1402 and the data lines 1403 and intersection portions 1405 serve as pixels.

The scanning lines 1402 and the data lines 1403 are connected to an external driving circuit through a TAB tape 1407. 1408 denotes a group of wiring lines comprised of a mass of the scanning lines 1402. 1409 denotes a group of wiring lines comprised of a mass of connection wiring lines 1406 that are connected to the data lines 1403. Though not shown, the TAB tape 1407 may be replaced by TCP that is obtained by providing a TAB tape with an IC.

In FIG. 14B, 1410 denotes a seal member and 1411 denotes a cover member that is bonded to a plastic member 1401 with the seal member 1410. A photo-curable resin can be used for the seal member 1410. A preferable material of the seal member is one which allows little gas leakage and which absorbs little moisture. The cover member is preferably made from the same material as the substrate 1401, and glass (including quartz glass) or plastic can be used. Here, a plastic material is used for the cover member.

Figure 14C:
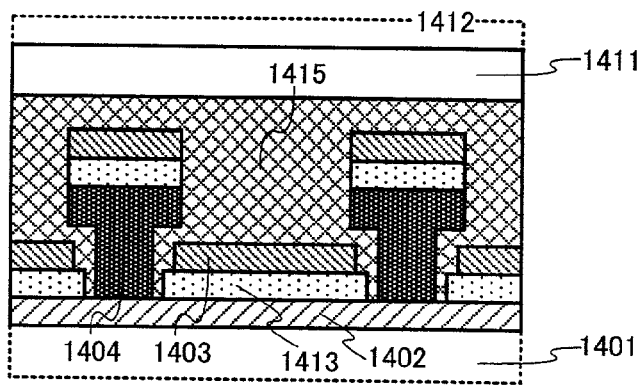

FIG. 14C is an enlarged view of the structure of a pixel region. 1413 denotes an organic compound layer. Lower layers of the banks 1404 are narrower than upper layers and the banks can physically separate the data lines 1403 from one another. A pixel portion 1414 surrounded by the seal member 1410 is shut off of the outside air by a sealing member 1415 formed of a resin to prevent a degradation of the organic compound layer.

In the luminescent device structured as above in accordance with the present invention, the pixel portion 1414 is composed of the scanning lines 1402, the data lines 1403, the banks 1404, and the organic compound layer 1413. Therefore the luminescent device can be manufactured by a very simple process.

A polarizing plate may be provided on a display face (the face on which an image is displayed to be observed by a viewer) of the luminescent device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound layer from being reflected at the polarizing plate and traveling backward.

Any of organic luminescent elements according to the present invention can be used as the organic luminescent element included in the luminescent device of this embodiment.

Embodiment 15

This embodiments shows an example of attaching a printed wiring board to the luminescent device shown in Embodiment 14 to make the device into a module.

Figure 15A:
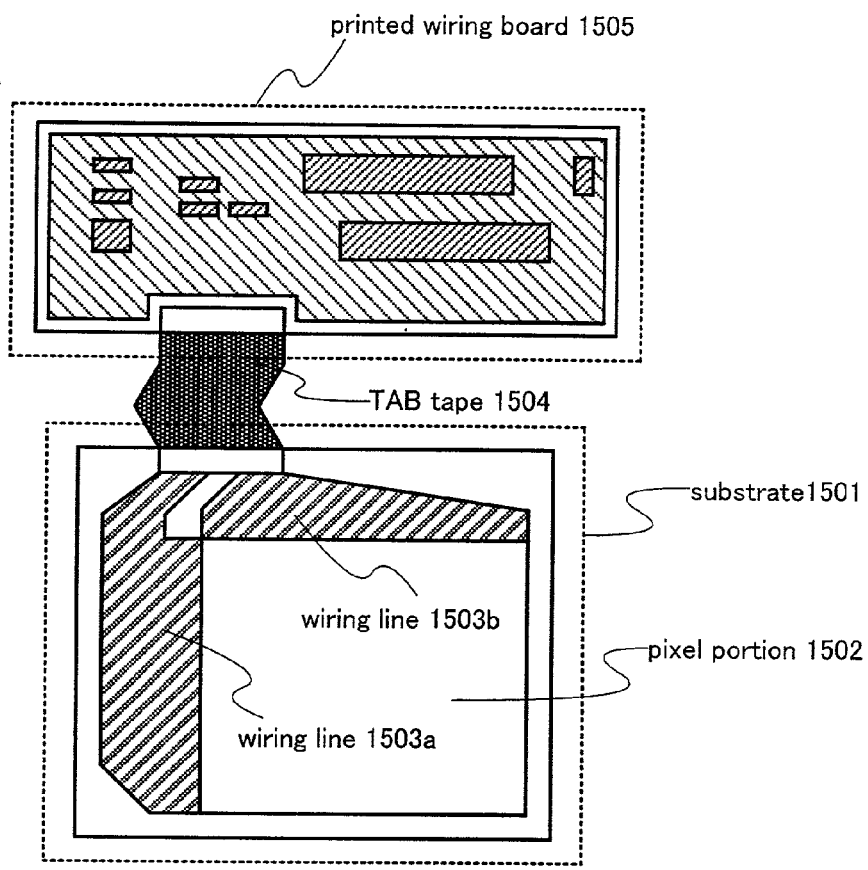
FIGS. 15A and 15B are views showing the configuration of a luminescent device.

In a module shown in FIG. 15A, a TAB tape 1504 is attached to a substrate 1501 (here including a pixel portion 1502 and wiring lines 1503a and 1503b), and a printed wiring board 1505 is attached to the substrate through the TAB tape 1504.

Figure 15B:
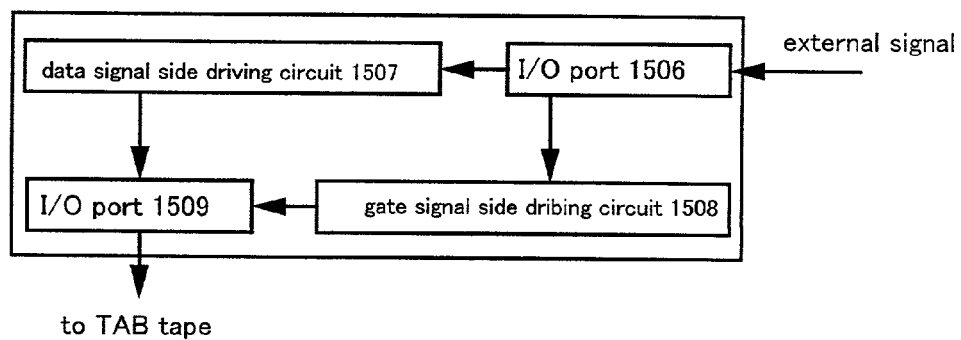

A functional block diagram of the printed wiring board 1505 is shown in FIG. 15B. An IC functioning as at least I/O ports (input or output portions) 1506 and 1509, a data signal side driving circuit 1507, and a gate signal side driving circuit 1508 are provided within the printed wiring board 1505.

In this specification, a module structured by attaching a TAB tape to a substrate with a pixel portion formed on its surface and by attaching a printed wiring board that functions as a driving circuit to the substrate through the TAB tape as above is specially named a module with external driving circuit.

Any of organic luminescent elements disclosed in the present invention can be used as the organic luminescent element included in the luminescent device of this embodiment.

Embodiment 16

This embodiment shows an example of attaching a printed wiring board to the luminescent device shown in Embodiment 12, 13, or 14 to make the device into a module.

Figure 16A:
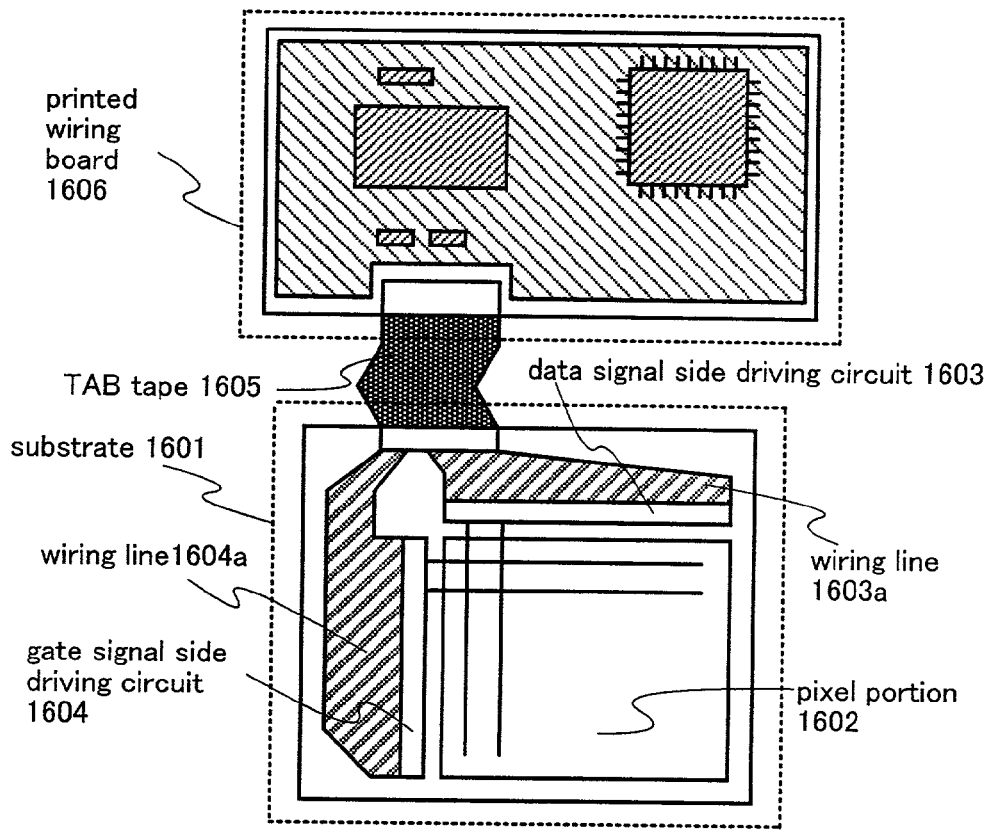
FIGS. 16A and 16B are views showing the configuration of a luminescent device.

In a module shown in FIG. 16A, a TAB tape 1605 is attached to a substrate 1601 (here including a pixel portion 1602, a data signal side driving circuit 1603, a gate signal side driving circuit 1604, and wiring lines 1603a and 1604a), and a printed wiring board 1606 is attached to the substrate through the TAB tape 1605. A functional block diagram of the printed wiring board 1606 is shown in FIG. 16B.

Figure 16B:
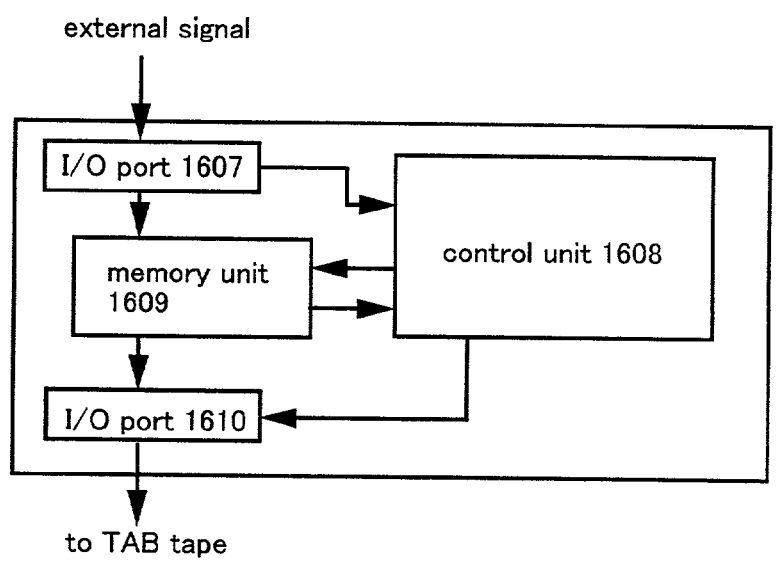

As shown in FIG. 16B, an IC functioning as at least I/O ports 1607 and 1610 and a control unit 1608 is provided within the printed wiring board 1606. A memory unit 1609 is provided here but it is not always necessary. The control unit 1608 is a portion having functions for controlling the driving circuits and correction of image data.

In this specification, a module structured by attaching a printed wiring board that has functions as a controller to a substrate on which an organic luminescent element is formed as above is specially named a module with external controller.

Any of organic luminescent elements disclosed in the present invention can be used as the organic luminescent element included in the luminescent device of this embodiment.

Embodiment 17

This embodiment shows an example of luminescent device in which a triplet luminescent diode shown in Embodiments 10 and 11 is driven in accordance with digital time gray scale display. The luminescent device of this embodiment can provide uniform images in digital time gray scale display by using a luminescence from the state of triplet excitation and therefore is very useful.

Figure 36A:
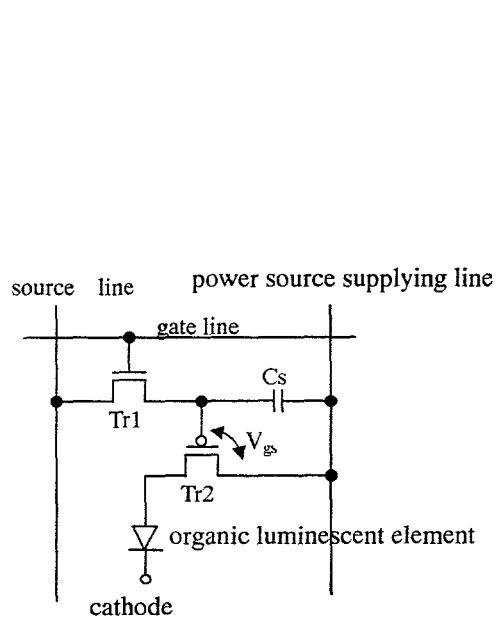
FIGS. 36A to 36C are views showing the configuration of a luminescent device.

FIG. 36A shows the circuit structure of a pixel that uses an organic luminescent element. Tr represents a transistor and Cs represents a storage capacitor. In this circuit, when a gate line is selected, a current flows into Tr1 from a source line and a voltage corresponding to the signal is accumulated in Cs. Then a current controlled by the gate-source voltage ($V_{gs}$) of Tr2 flows into Tr2 and the organic luminescent element.

After Tr1 is selected, Tr1 is turned off to hold the voltage ($V_{gs}$) of Cs. Accordingly, a current continues to flow in an amount dependent of $V_{gs}$.

Figure 36C:
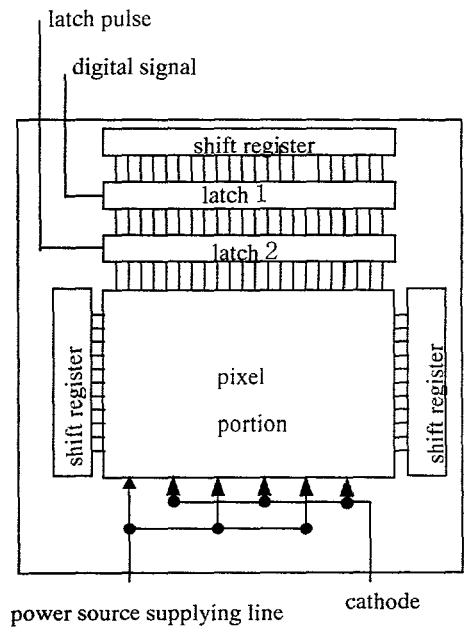
Figure 36B:
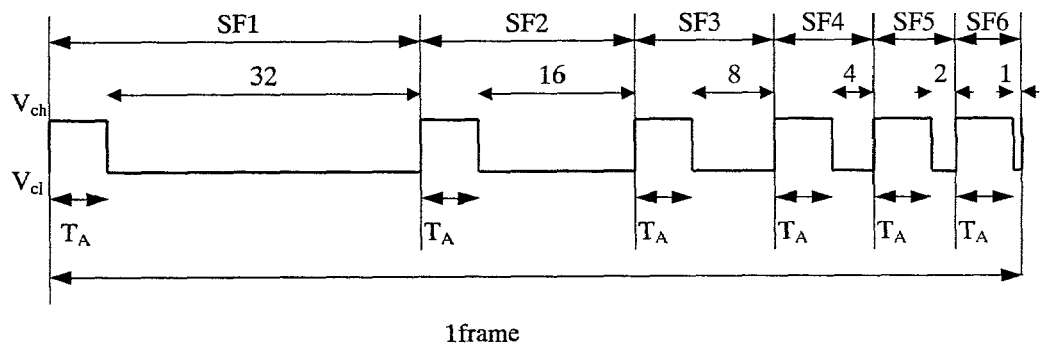

FIG. 36B shows a chart for driving this circuit in accordance with digital time gray scale display. In digital time gray scale display, one frame is divided into plural sub-frames. FIG. 36B shows 6 bit gray scale in which one frame is divided into six sub-frames. In this case, the ratio of light emission periods of the sub-frames is 32 16:8:4:2:1.

FIG. 36C schematically shows driving circuits of TFT substrate in this embodiment. A gate driver and a source driver are provided on the same substrate. In this embodiment, the pixel circuit and the drivers are designed to be digitally driven. Accordingly, fluctuation in TFT characteristic does not affect the device and the device can display uniform images.

Embodiment 18

The luminescent devices of the present invention, which have been described in, the embodiments above have advantages of low power consumption and long lifetime. Accordingly, electric appliances that include those luminescent devices as their display units can operate consuming less power than conventional ones and are durable. The advantages are very useful especially for electric appliances that use batteries as power sources, such as portable equipment, because low power consumption leads directly to conveniences (batteries last longer).

The luminescent device is self-luminous to eliminate the need for back light as the one in liquid crystal displays, and has an organic compound layer whose thickness is less than 1 μm. Therefore the luminescent device can be made thin and light-weight. Electric appliances that include the luminescent device as their display units are accordingly thinner and lighter than conventional ones. This too leads directly to conveniences (lightness and compactness in carrying them around) and is very useful particularly for portable equipment and like other electric appliances. Moreover, being thin (unvoluminous) is doubtlessly useful for all of the electric appliances in terms of transportation (a large number of appliances can be transported) and installation (space-saving in a room).

Being self-luminous, the luminescent device is characterized by having better visibility in bright places than liquid crystal display devices and wide viewing angle. Therefore electric appliances that include the luminescent device as their display units are very advantageous also in terms of easiness in viewing display.

To summarize, electric appliances that use a luminescent device of the present invention have, in addition to merits of conventional organic luminescent elements, namely, thinness/lightness and high visibility, new features of low power consumption and long lifetime, and therefore are very useful.

This embodiment shows examples of the electric appliances that include as display units the luminescent device of the present invention. Specific examples thereof are shown in FIGS. 17A to 17F and 18A to 18B. Any metal complexes disclosed in the present invention can be used for the organic luminescent element included in the electric appliance of this embodiment. The luminescent device included in the electric appliance of this embodiment can have any of the configurations illustrated in FIGS. 12 to 16 and 34 to 36.

Figure 17A:
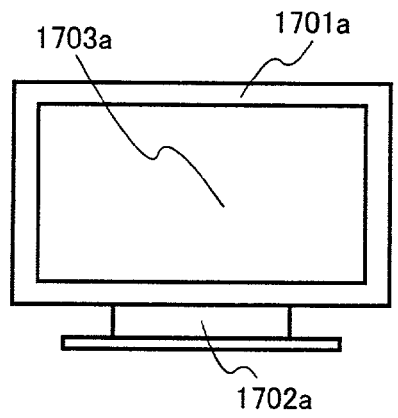
FIGS. 17A to 17F are views showing concrete examples of electric appliances.

FIG. 17A shows a display device using an organic luminescent element. The display device is composed of a case 1701*a*, a support base 1702*a*, and a display unit 1703*a*. By using a luminescent device of the present invention as the display unit 1703*a*, the display device can be thin, light-weight, and durable. Accordingly, transportation is simplified, space is saved in installation, and lifetime is long.

Figure 17B:
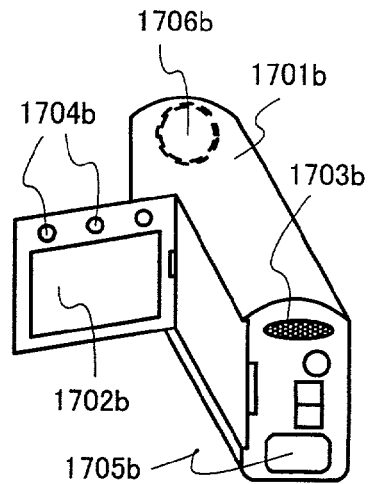

FIG. 17B shows a video camera, which is composed of a main body 1701*b*, a display unit 1702*b*, an audio input unit 1703*b*, operation switches 1704*b*, a battery 1705*b*, and an image receiving unit 1706*b*. By using a luminescent device of the present invention as the display unit 1702*b*, the video camera can be light-weight and consumes less power. Accordingly, battery consumption is reduced and carrying the video camera is less inconvenient.

Figure 17C:
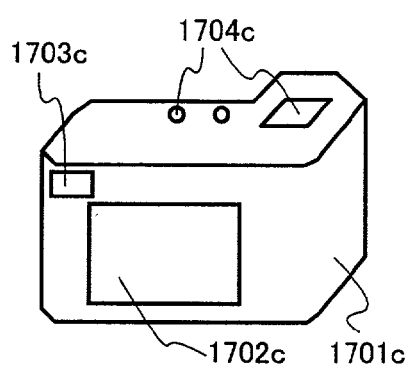

FIG. 17C shows a digital camera, which is composed of a main body 1701*c*, a display unit 1702*c*, an eye piece unit 1703*c*, and operation switches 1704*c*. By using a luminescent device of the present invention as the display unit 1702*c*, the digital camera can be light-weight and consumes less power. Accordingly, battery consumption is reduced and carrying the digital camera is less inconvenient.

Figure 17D:
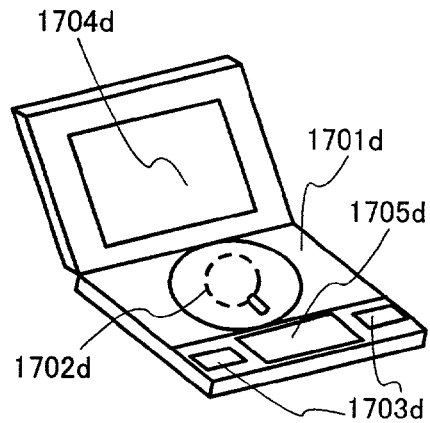

FIG. 17D shows an image reproducing device equipped with a recording medium. The device is composed of a main body 1701*d*, a recording medium (such as CD, LD, or DVD) 1702*d*, operation switches 1703*d*, a display unit (A) 1704*d*, and a display unit (B) 1705*d*. The display unit (A) 1704*d* mainly displays image information whereas the display unit (B) 1705*d* mainly displays text information. By using a luminescent device of the present invention as the display unit (A) 1704*d* and the display unit (B) 1705*d*, the image reproducing device can consume less power and can be light-weight and durable. The image reproducing device equipped with a recording medium also includes CD players and game machines.

Figure 17E:
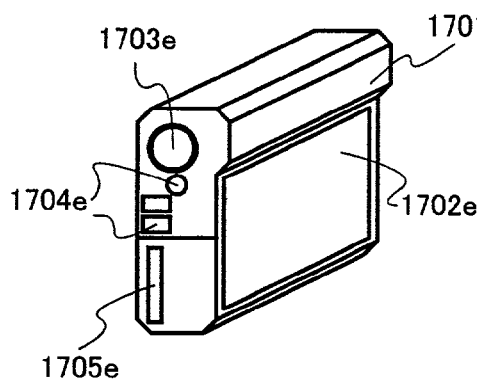

FIG. 17E shows a (mobile) portable computer, which is composed of a main body 1701*e*, a display unit 1702*e*, an image receiving unit 1703*e*, operation switches 1704*e*, and a memory slot 1705*e*. By using a luminescent device of the present invention as the display unit 1702*e*, the portable computer can be thin and light-weight, and consumes less power. Accordingly, battery consumption is reduced and carrying the computer is less inconvenient. The portable computer can store information in a flash memory or a recording medium obtained by integrating non-volatile memories and can reproduce the stored information.

Figure 17F:
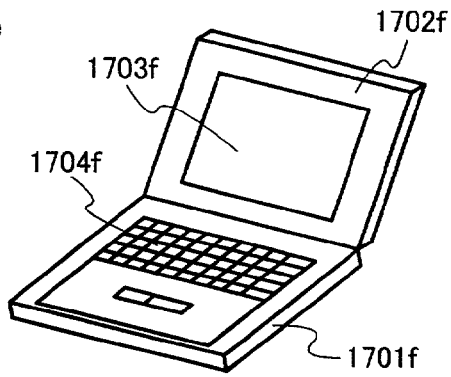

FIG. 17F shows a personal computer, which is composed of a main body 1701*f*, a case 1702*f*, a display unit 1703*f*, and a keyboard 1704*f*. By using a luminescent device of the present invention as the display unit 1703*f*, the personal computer can be thin and light-weight, and consumes less power. The luminescent device is a great merit in terms of battery consumption and lightness especially for a notebook personal computer that are carried around.

The opportunity is now increased that these electric appliances display frequency information sent through electronic communication lines such as the Internet and radio communications such as radio wave, especially, animation information. Since organic luminescent elements have very fast response speed, the luminescent device is suitable for animation display.

Figure 18A:
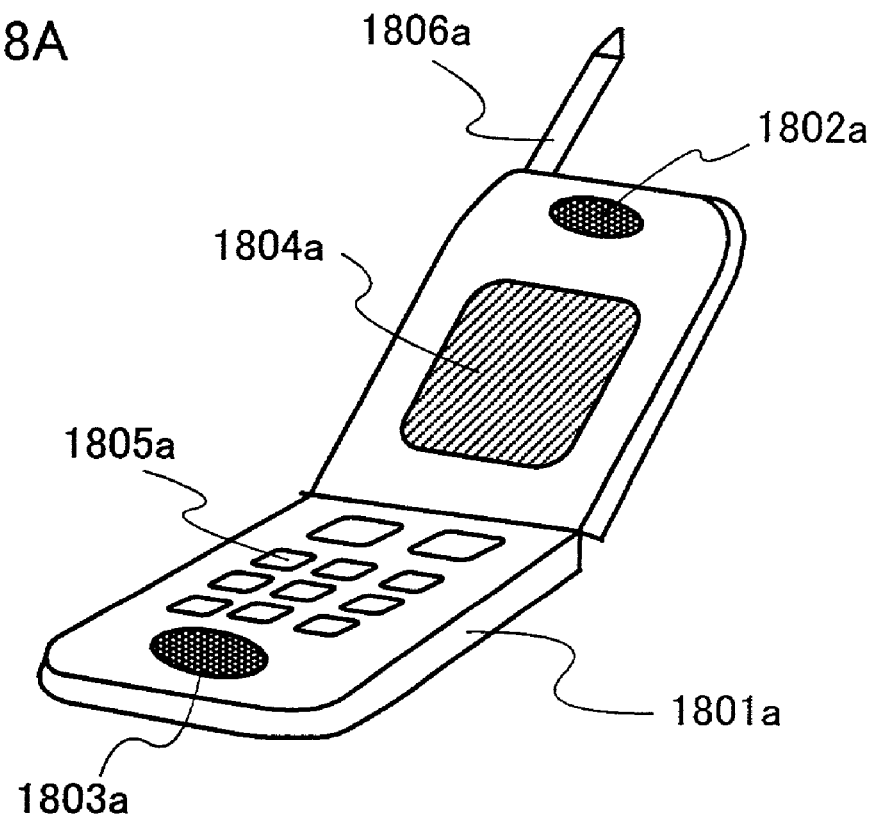
FIGS. 18A and 18B are views showing concrete examples of electric appliances.

FIG. 18A shows a cellular phone, which is composed of a main body 1801a, an audio output unit 1802a, an audio input unit 1803a, a display unit 1804a, operation switches 1805a, and an antenna 1806a. By using a luminescent device of the present invention as the display unit 1804a, the cellular phone can be thin and light-weight, and consume less power. Accordingly, battery consumption is reduced, carrying the cellular phone is easy, and the main body can be compact.

Figure 18B:
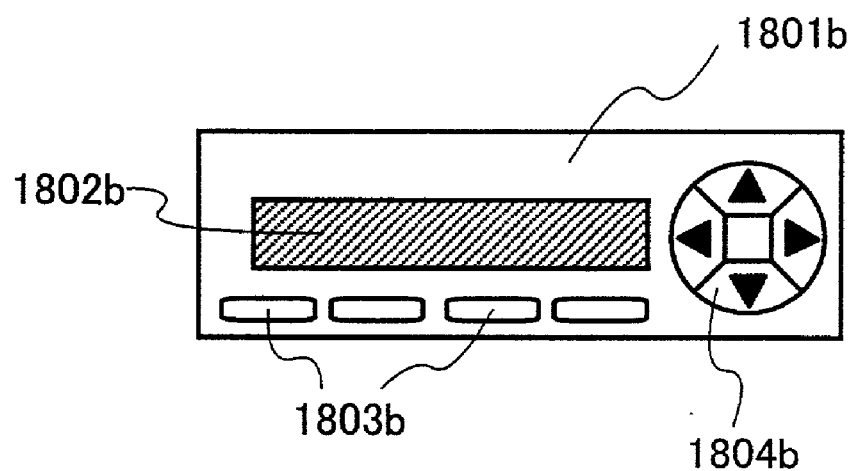

FIG. 18B shows an audio (specifically, car audio), which is composed of a main body 1801b, a display unit 1802b, and operation switches 1803b and 1804b. By using a luminescent device of the present invention as the display unit 1802b, the audio can be light-weight and consume less power. Although car audio is taken as an example in this embodiment, the audio may be home audio.

It is effective to give the electric appliances shown in FIGS. 17A to 17F and 18A to 18B a function of modulating the luminance of emitted light in accordance with the brightness of the surroundings where the electric appliances are used by providing the electric appliances with photo sensors as measures to detect the brightness of the surroundings. A user can recognize image or text information without difficulties if the contrast ratio of the luminance of emitted light to the brightness of the surroundings is 100 to 150. With this function, the luminance of an image can be raised for better viewing when the surroundings are bright whereas the luminance of an image can be lowered to reduce power consumption when the surroundings are dark.

Various electric appliances that employ as light sources the luminescent device of the present invention can be also thin and light-weight and can operate consuming less power, which makes them very useful appliances. Light sources of liquid crystal display devices, such as back light or front light, or light sources of lighting fixtures are included in the luminescent device of the present invention as a light source. Accordingly, the luminescent device can be thin, light-weight, and consume less power.

When liquid crystal displays are used as the display units of the electric appliances shown in FIGS. 17A to 17F and 18A to 18B according to this embodiment, the electric appliances can be thin and light-weight and consume less power if those liquid crystal displays use as back light or front light the luminescent device of the present invention.

Embodiment 19

In this embodiment, an example of an active matrix type constant-current driving circuit is described, which is driving by flowing the constant current in the organic luminescent element of the present invention. The circuit structure thereof is shown in FIG. 37.

Figure 37:
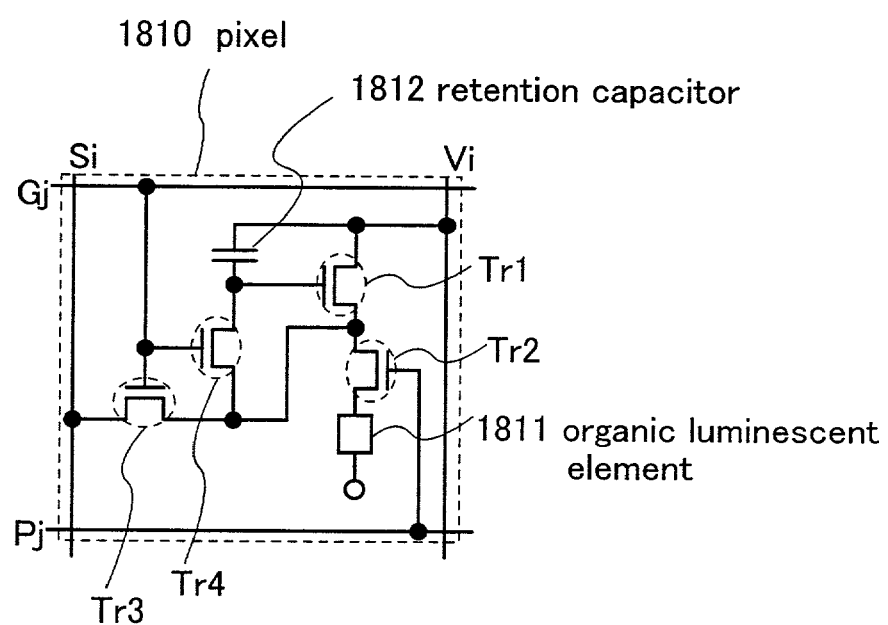
FIG. 37 is a view showing the circuit structure.

A pixel 1810 shown in FIG. 37 has a signal line Si, a first scanning line Gj, a second scanning line Pj and a power source line Vi. In addition, the pixel 1810 has transistor (referred below to as "Tr") 1, Tr2, Tr3, Tr4, an organic luminescent element 1811 of a mixed junction type and a retention capacitor 1812.

Both gates of Tr3 and Tr4 are connected with the first scanning line Gj. As for the source and the drain of Tr3, the one is connected with the signal line Si, the other is connected with the source of Tr2. Further, the source and the drain of Tr4, the one is connected with the source of Tr2, the other is connected to the gate of Tr1. Thus, the either of the source and the drain of Tr3 and the either of the source or the drain of Tr4 are connected with each other.

The source of Tr1 is connected with the power source line Vi and the drain of Tr1 is connected with the source of Tr2. The gate of Tr2 is connected to the second scanning line Pj. And, the drain of the Tr2 is connected with a pixel electrode in the organic luminescent element 1811. The organic luminescent element 1811 has the pixel electrode, a counter electrode and an organic luminescent layer provided between the pixel electrode and the counter electrode. The counter electrode of the organic luminescent element 1811 is applied constant voltage by a power source provided at the external of a light emitting panel.

Tr3 and Tr4 can adopt both n-channel type TFT and p-channel type TFT. However, the polarities of Tr3 and Tr4 are the same. Further, Tr1 can adopt both n-channel type TFT and p-channel type TFT. Tr2 can adopt both n-channel type TFT and p-channel type TFT. With respect to the polarity, in the case of the pixel electrode and the counter electrode in the organic luminescent element, the one is an anode and the other is a cathode. In the case that the Tr2 is an p-channel type TFT, it is preferable to use the anode as a pixel electrode, and the cathode as a counter electrode. Reversely, in the case that the Tr2 is an n-channel type TFT, it is preferable to use the cathode as a pixel electrode, and the anode as a counter electrode.

The retention capacitor 1812 is formed between the gate and the source of Tr1. The retention capacitor 1812 is provided to maintain more certainly the voltage ($V_{GS}$) between the gate and the source of Tr1. However, it is not necessary always provided.

In the pixel shown in FIG. 37, the current supplied to the signal line Si is controlled at the current source in the signal line driving circuit.

By applying the above-mentioned circuit structure, the constant-current driving can be realized, by which the brightness can be kept by flowing a constant current in the organic luminescent element. The organic luminescent element having a mixed region of the present invention has a longer lifetime than that of prior organic luminescent element. The organic luminescent element is effective because very longer lifetime can be realized by implementing above-mentioned constant-current driving.

The invention is practiced to enable providing a luminescent device which is small in power consumption and excellent in life. Further, an electric appliance, which is bright and small in power consumption and serviceable over a long term, can be obtained by using such luminescent device for a light source or a display section.

What is claimed is:

1. A luminescent device comprising:
an organic luminescent element comprising:
an anode;
a cathode; and
a hole transporting region provided between the anode and the cathode, the hole transporting region comprising a first layer, a second layer, and a mixed layer provided between the first layer and the second layer;
wherein the first layer includes a hole injecting material, the mixed layer includes the hole injecting material and a hole transporting material, and the second layer includes the hole transporting material,
wherein the hole injecting material is smaller in ionization potential than the hole transporting material,
wherein the hole transporting material is larger in hole mobility than the hole injecting material, and wherein there is a concentration gradient such that a concentration of the hole transporting material is increased in a direction toward the cathode from the anode and a concentration of the hole injecting material is decreased in a direction toward the cathode from the anode.

2. A luminescent device according to claim 1, wherein the hole injecting material comprises a phthalocyanine compound.

3. A luminescent device according to claim 1, wherein the hole transporting material comprises an aromatic amine-based compound.

4. A luminescent device according to claim 1, wherein the organic luminescent element has a luminescence from a triplet excited state.

5. A luminescent device according to claim 1, wherein the luminescent device is an electric appliance selected from the group consisting of a display device, a video camera, a digital camera, an image reproducing device, a mobile portable computer, a personal computer, a cellular phone, and an audio device.

6. A luminescent device comprising:
an organic luminescent element comprising:
an anode;
a cathode; and
an electron transporting region provided between the anode and the cathode, the electron transporting region comprising a first layer, a second layer, and a mixed layer provided between the first layer and the second layer;
wherein the first layer includes an electron injecting material, the mixed layer includes an electron transporting material and the electron injecting material, and the second layer includes the electron transporting material,
wherein the electron injecting material is larger in electron affinity than the electron transporting material,
wherein the electron transporting material is larger in electron mobility than the electron injecting material, and
wherein there is a concentration gradient such that a concentration of the electron injecting material is increased in a direction toward the cathode from the anode and a concentration of the electron transporting material is decreased in a direction toward the cathode from the anode.

7. A luminescent device according to claim 6, wherein the electron injecting material is selected from the group consisting of alkali metal halogenide, a metal complex having a quinoline skeleton, a metal complex having a benzoquinoline skeleton, an oxadiazole derivative, or a triazole derivative.

8. A luminescent device according to claim 6, wherein the electron transporting material is selected from the group consisting of a metal complex having a quinoline skeleton, a metal complex having a benzoquinoline skeleton, an oxadiazole derivative, a triazole derivative, or a phenanthroline derivative.

9. A luminescent device according to claim 6, wherein the organic luminescent element has a luminescence from a triplet excited state.

10. A luminescent device according to claim 6, wherein the luminescent device is an electric appliance selected from the group consisting of a display device, a video camera, a digital camera, an image reproducing device, a mobile portable computer, a personal computer, a cellular phone, and an audio device.

11. A luminescent device comprising:
an organic luminescent element comprising:
an anode;
a cathode;
a luminescent layer provided between the anode and the cathode; and
a blocking layer adjacent to the luminescent layer, being provided between the anode and the cathode;
wherein the blocking layer comprises a blocking material and a material contained in the luminescent layer,
wherein the blocking material and the material contained in the luminescent layer have electron transport property,
wherein an energy difference between a highest occupied molecular orbit and a lowest unoccupied molecular orbit in the blocking material is larger than an energy difference between a highest occupied molecular orbit and a lowest unoccupied molecular orbit in a material contained in the luminescent layer, and
wherein there is a concentration gradient that a concentration of the material contained in the luminescent layer is decreased in a direction toward the cathode from the anode and a concentration of the blocking material is increased in a direction toward the cathode from the anode.

12. A luminescent device according to claim 11, wherein the blocking material is selected from the group consisting of an oxadiazole derivative, a triazole derivative, or a phenanthroline derivative.

13. A luminescent device according to claim 11, wherein the organic luminescent element presents luminance caused from a triplet excited state.

14. A luminescent device according to claim 11, wherein the luminescent device is an electric appliance selected from the group consisting of a display device, a video camera, a digital camera, an image reproducing device, a mobile portable computer, a personal computer, a cellular phone, and an audio device.

15. A luminescent device comprising:
an organic luminescent element comprising:
an anode;
a cathode;
a first mixed region contiguous to the anode, comprising a hole injecting material and a hole transporting material;
a second mixed region contiguous to the first region, comprising the hole transporting material and a host material;
a third mixed region contiguous to the second mixed region, comprising the host material and a blocking material; and
a fourth mixed region provided between the third mixed region and the cathode, comprising an electron injecting material and an electron transporting material,
wherein there is at least one concentration gradient in the first region such that a concentration of the hole injecting material is decreased in a direction toward the second region from the anode and a concentration of the hole transporting material is increased in a direction toward the second region from the anode, in the second region such that a concentration of the hole transporting material is decreased in a direction toward the third region from the first region and a concentration of the host material is increased in a direction toward the third region from the first region, and in the third region such that a concentration of the host material is decreased in a direction toward the fourth region from the second region and a concentration of the blocking material is increased in a direction toward the fourth region from the second region.

16. A luminescent device comprising:
an organic luminescent element comprising:
  an anode;
  a cathode;
  a first mixed region adjacent to the anode, comprising a hole injecting material and a hole transporting material;
  a second mixed region adjacent to the cathode, comprising an electron injecting material and an electron transporting material; and
  a third mixed region provided between the first mixed region and the second mixed region, comprising the hole transporting material and the electron transporting material,
  wherein there is a concentration gradient in the first mixed region that a concentration of the hole transporting material is decreased in a direction toward the third region from the anode and a concentration of the hole injecting material is increased in a direction toward the third region from the anode, in the second region that a concentration of the electron transporting material is increased in a direction toward the third region from the cathode and a concentration of the electron injecting material is decreased in a direction toward the third region from the cathode, and in the third region that a concentration of the electron transporting material is decreased in a direction toward the first region from the second region and a concentration of the hole transporting material is increased in a direction toward the first region from the second region.

17. A luminescent device according to claim 16, wherein a luminescent material is doped in a portion of the third region.

18. A luminescent device according to claim 17, wherein the luminescent material is a triplet luminescent diode.

19. A luminescent device according to claim 16, wherein the luminescent device is an electric appliance selected from the group consisting of a display device, a video camera, a digital camera, an image reproducing device, a mobile portable computer, a personal computer, a cellular phone, and an audio device.

20. A luminescent device comprising:
an organic luminescent element comprising:
  an anode;
  a cathode;
  a first mixed region contiguous to the anode, comprising a hole injecting material and a hole transporting material;
  a second mixed region contiguous to the first region, comprising the hole transporting material and a host material;
  a third mixed region contiguous to the second mixed region, comprising the host material and a blocking material; and
  a fourth mixed region provided between the third mixed region and the cathode, comprising the blocking material and an electron injecting material;
  wherein there is at least one concentration gradient in the first region that a concentration of the hole injecting material is decreased in a direction toward the second region from the anode and a concentration of the hole transporting material is increased in a direction toward the second region from the anode, in the second region that a concentration of the hole transporting material is decreased in a direction toward the third region from the first region and a concentration of the host material is increased in a direction toward the third region from the first region, and in the third region that a concentration of that host material is decreased in a direction toward the fourth region from the second region and a concentration of the blocking material is increased in a direction toward the fourth region from the second region.

21. A luminescent device according to claim 20, wherein there is a concentration gradient in the fourth region that a concentration of the blocking material is decreased toward the cathode from the third region and a concentration of the electron injecting material is increased toward the cathode from the third region.

22. A luminescent device according to claim 20, wherein a luminescent material is doped in a portion of both second region and third region.

23. A luminescent device according to claim 22, wherein the luminescent material is a triplet luminescent diode.

24. A luminescent device according to claim 20, wherein the blocking material is an electron transporting material.

25. A luminescent device comprising:
  an anode over a substrate;
  a first layer comprising a hole injecting material and a hole transporting material over the anode;
  a second layer comprising a host material over the first layer;
  a third layer comprising a blocking material over the second layer;
  a fourth layer comprising an electron injecting material over the third layer; and
  a cathode over the fourth layer,
  wherein a luminescent material is doped in the second layer and the third layer.

26. A luminescent device according to claim 25, wherein the first layer is a hole transporting mixed layer.

27. A luminescent device according to claim 25, wherein the second layer is a bipolar-natured mixed layer.

28. A luminescent device according to claim 25, wherein the third layer is a blocking mixed layer.

29. A luminescent device according to claim 25, wherein the fourth layer is an electron transporting mixed layer.

30. A luminescent device according to claim 25, wherein the blocking material serves as an electron transporting material.

31. A luminescent device according to claim 25, wherein the luminescent material is a triplet light emitting material.

32. A luminescent device according to claim 25, wherein the triplet light emitting material has a central metal selected from the group consisting of platinum and iridium.

33. A luminescent device according to claim 25, wherein the luminescent material is a material selected from the group consisting of a metal complex and a fluorescent dye.

34. An electronic appliance having the luminescent device according to claim 25.

35. An electronic appliance according to claim 25, wherein the electronic appliance is selected from the group consisting of a car audio, a display device, a video camera, a digital camera, an image reproducing device, a mobile portable computer, a personal computer, and a cellular phone.

36. A luminescent device according to claim 25, wherein the luminescent device is a passive matrix luminescent device.

37. A luminescent device according to claim 25, wherein at least one of the anode and the cathode is electrically connected to an active element such as a thin film transistor and a MOS transistor.

38. A luminescent device according to claim 25, wherein the luminescent device is an organic luminescent device.

* * * * *